(12) United States Patent
Lin et al.

(10) Patent No.: US 8,022,552 B2
(45) Date of Patent: Sep. 20, 2011

(54) INTEGRATED CIRCUIT AND METHOD FOR FABRICATING THE SAME

(75) Inventors: Mou-Shiung Lin, Hsin-Chu (TW); Jin-Yuan Lee, Hsin-Chu (TW)

(73) Assignee: Megica Corporation, Hsinchu (TW)

( * ) Notice: Subject to any disclaimer, the term of this patent is extended or adjusted under 35 U.S.C. 154(b) by 650 days.

(21) Appl. No.: 11/766,805

(22) Filed: Jun. 22, 2007

(65) Prior Publication Data

US 2008/0006945 A1 Jan. 10, 2008

Related U.S. Application Data

(60) Provisional application No. 60/805,981, filed on Jun. 27, 2006.

(51) Int. Cl.
 *H01L 23/48* (2006.01)
 *H01L 23/52* (2006.01)

(52) U.S. Cl. .......................... 257/773; 257/758; 257/762

(58) Field of Classification Search .......... 257/758–760, 257/762, 773, E23.161
See application file for complete search history.

(56) References Cited

U.S. PATENT DOCUMENTS

| | | |
|---|---|---|
| 4,685,998 A | 8/1987 | Quinn et al. |
| 4,789,647 A | 12/1988 | Peters |
| 5,083,187 A | 1/1992 | Lamson et al. |
| 5,226,232 A | 7/1993 | Boyd |
| 5,384,488 A | 1/1995 | Golshan et al. |
| 5,417,800 A | 5/1995 | Takeshita |
| 5,430,329 A | 7/1995 | Harada et al. |
| 5,468,984 A | 11/1995 | Efland et al. |
| 5,532,512 A | 7/1996 | Fillion et al. |
| 5,659,201 A | 8/1997 | Wollesen |
| 5,665,989 A | 9/1997 | Dangelo |
| 5,691,248 A | 11/1997 | Cronin et al. |
| 5,792,594 A | 8/1998 | Brown et al. |
| 5,834,844 A | 11/1998 | Akagawa et al. |
| 5,854,513 A | 12/1998 | Kim |
| 5,883,435 A | 3/1999 | Geffken et al. |
| 5,892,273 A | 4/1999 | Iwasaki et al. |
| 5,952,726 A | 9/1999 | Liang |

(Continued)

FOREIGN PATENT DOCUMENTS

TW 453416 9/2001

(Continued)

OTHER PUBLICATIONS

Mistry, K. et al. "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting (2007) pp. 247-250.

(Continued)

*Primary Examiner* — Hung Vu
(74) *Attorney, Agent, or Firm* — McDermott Will & Emery, LLP

(57) ABSTRACT

A method for fabricating an integrated circuit (IC) chip includes forming a metal trace having a thickness of between 5μm and 27 μm over a semiconductor substrate, and forming a passivation layer on the metal trace, wherein the passivation layer includes a layer of silicon nitride on the metal trace and a layer of silicon oxide on the layer of silicon nitride, or includes a layer of silicon oxynitride on the metal trace and a layer of silicon oxide on the layer of silicon oxynitride.

29 Claims, 31 Drawing Sheets

U.S. PATENT DOCUMENTS

| | | | |
|---|---|---|---|
| 5,994,766 | A | 11/1999 | Shenoy et al. |
| 6,011,314 | A | 1/2000 | Leibovitz et al. |
| 6,022,792 | A | 2/2000 | Ishii et al. |
| 6,077,726 | A | 6/2000 | Mistry et al. |
| 6,144,100 | A | 11/2000 | Shen et al. |
| 6,184,143 | B1 | 2/2001 | Ohashi et al. |
| 6,187,680 | B1 | 2/2001 | Costrini et al. |
| 6,235,648 | B1 | 5/2001 | Mizuhara et al. |
| 6,288,447 | B1 | 9/2001 | Amishiro et al. |
| 6,303,423 | B1 | 10/2001 | Lin |
| 6,359,328 | B1 | 3/2002 | Dubin |
| 6,362,087 | B1 | 3/2002 | Wang et al. |
| 6,383,916 | B1 | 5/2002 | Lin |
| 6,429,120 | B1 | 8/2002 | Ahn et al. |
| 6,451,681 | B1 | 9/2002 | Greer |
| 6,472,745 | B1 | 10/2002 | Iizuka |
| 6,479,900 | B1 | 11/2002 | Shinogi et al. |
| 6,495,442 | B1 | 12/2002 | Lin et al. |
| 6,605,528 | B1 | 8/2003 | Lin et al. |
| 6,614,091 | B1 | 9/2003 | Downey et al. |
| 6,639,299 | B2 | 10/2003 | Aoki |
| 6,646,347 | B2 | 11/2003 | Mercado et al. |
| 6,649,509 | B1 | 11/2003 | Lin et al. |
| 6,653,563 | B2 | 11/2003 | Bohr |
| 6,680,544 | B2 | 1/2004 | Lu et al. |
| 6,683,380 | B2 | 1/2004 | Efland et al. |
| 6,707,124 | B2 | 3/2004 | Wachtler et al. |
| 6,713,875 | B2 | 3/2004 | Farrar |
| 6,756,295 | B2 | 6/2004 | Lin et al. |
| 6,762,115 | B2 | 7/2004 | Lin et al. |
| 6,780,748 | B2 | 8/2004 | Yamaguchi et al. |
| 6,802,945 | B2 | 10/2004 | Liu et al. |
| 6,861,740 | B2 | 3/2005 | Hsu |
| 6,943,440 | B2 | 9/2005 | Kim et al. |
| 6,963,136 | B2 | 11/2005 | Shinozaki et al. |
| 7,115,985 | B2 * | 10/2006 | Antol et al. ............. 257/700 |
| 7,230,340 | B2 | 6/2007 | Lin |
| 7,239,028 | B2 | 7/2007 | Anzai |
| 7,271,489 | B2 | 9/2007 | Lin et al. |
| 7,372,161 | B2 | 5/2008 | Lin et al. |
| 7,381,642 | B2 | 6/2008 | Lin et al. |
| 7,416,971 | B2 | 8/2008 | Lin et al. |
| 7,420,276 | B2 | 9/2008 | Lin et al. |
| 7,423,346 | B2 | 9/2008 | Lin et al. |
| 7,465,654 | B2 | 12/2008 | Chou et al. |
| 7,470,997 | B2 | 12/2008 | Lin et al. |
| 7,473,999 | B2 | 1/2009 | Lin et al. |
| 7,719,116 | B2 * | 5/2010 | Wakabayashi et al. ....... 257/773 |
| 7,723,849 | B2 * | 5/2010 | Ohmori et al. ............. 257/758 |
| 2001/0045651 | A1 | 11/2001 | Saito et al. |
| 2001/0051426 | A1 | 12/2001 | Pozder et al. |
| 2002/0127846 | A1 | 9/2002 | Burrell et al. |
| 2002/0158334 | A1 | 10/2002 | Vu et al. |
| 2003/0030146 | A1 | 2/2003 | Tamaru et al. |
| 2003/0134496 | A1 | 7/2003 | Lee et al. |
| 2003/0218246 | A1 | 11/2003 | Abe et al. |
| 2004/0023450 | A1 | 2/2004 | Katagiri et al. |
| 2004/0169255 | A1 | 9/2004 | Kiyotoshi |
| 2005/0037609 | A1 | 2/2005 | Nakatani |
| 2006/0012041 | A1 | 1/2006 | Chou et al. |
| 2006/0060961 | A1 | 3/2006 | Lin et al. |
| 2006/0267198 | A1 | 11/2006 | Lin et al. |
| 2007/0275503 | A1 | 11/2007 | Lin et al. |
| 2008/0042280 | A1 | 2/2008 | Lin et al. |

FOREIGN PATENT DOCUMENTS

| | | |
|---|---|---|
| TW | 552631 | 9/2003 |
| TW | 592007 | 6/2004 |
| TW | 227542 | 2/2005 |
| TW | 284385 | 7/2007 |

OTHER PUBLICATIONS

Edelstein, D.C., "Advantages of Copper Interconnects," Proceedings of the 12th International IEEE VLSI Multilevel Interconnection Conference (1995) pp. 301-307.

Theng, C. et al. "An Automated Tool Deployment for ESD (Electro-Static-Discharge) Correct-by-Construction Strategy in 90 nm Process," IEEE International Conference on Semiconductor Electronics (2004) pp. 61-67.

Gao, X. et al. "An improved electrostatic discharge protection structure for reducing triggering voltage and parasitic capacitance," Solid-State Electronics, 27 (2003), pp. 1105-1110.

Yeoh, A. et al. "Copper Die Bumps (First Level Interconnect) and Low-K Dielectrics in 65nm High Volume Manufacturing," Electronic Components and Technology Conference (2006) pp. 1611-1615.

Hu, C-K. et al. "Copper-Polyimide Wiring Technology for VLSI Circuits,". Materials Research Society Symposium Proceedings VLSI V (1990) pp. 369-373.

Roesch, W. et al. "Cycling copper flip chip interconnects," Microelectronics Reliability, 44 (2004) pp. 1047-1054.

Lee, Y-H. et al. "Effect of ESD Layout on the Assembly Yield and Reliability," International Electron Devices Meeting (2006) pp. 1-4.

Yeoh, T-S. "ESD Effects On Power Supply Clamps," Proceedings of the 6th International Sympoisum on Physical & Failure Analysis of Integrated Circuits (1997) pp. 121-124.

Edelstein, D. et al. "Full Copper Wiring in a Sub-0.25 pm CMOS ULSI Technology," Technical Digest IEEE International Electron Devices Meeting (1997) pp. 773-776.

Venkatesan, S. et al. "A High Performance 1.8V, 0.20 pm CMOS Technology with Copper Metallization," Technical Digest IEEE International Electron Devices Meeting (1997) pp. 769-772.

Jenei, S. et al. "High Q Inductor Add-on Module in Thick Cu/SiLK™ single.damascene," Proceedings from the IEEE International Interconnect Technology Conference (2001) pp. 107-109.

Groves, R. et al. "High Q Inductors in a SiGe BiCMOS Process Utilizing a Thick Metal Process Add-on Module," Proceedings of the Bipolar/BiCMOS Circuits and Technology Meeting (1999) pp. 149-152.

Sakran, N. et al. "The Implementation of the 65nm Dual-Core 64b Merom Processor," IEEE International Solid-State Circuits Conference, Session 5, Microprocessors, 5.6 (2007) pp. 106-107, p. 590.

Kumar, R. et al. "A Family of 45nm IA Processors," IEEE International Solid-State Circuits Conference, Session 3, Microprocessor Technologies, 3.2 (2009) pp. 58-59.

Bohr, M. "The New Era of Scaling in an SoC World," International Solid-State Circuits Conference (2009) Presentation Slides 1-66.

Bohr, M. "The New Era of Scaling in an SoC World," International Solid-State Circuits Conference (2009) pp. 23-28.

Ingerly, D. et al. "Low-K Interconnect Stack with Thick Metal 9 Redistribution Layer and Cu Die Bump for 45nm High Volume Manufacturing," International Interconnect Technology Conference (2008) pp. 216-218.

Kurd, N. et al. "Next Generation Intel® Micro-architecture (Nehalem) Clocking Architecture," Symposium on VLSI Circuits Digest of Technical Papers (2008) pp. 62-63.

Maloney, T. et al. "Novel Clamp Circuits for IC Power Supply Protection," IEEE Transactions on Components, Packaging, and Manufacturing Technology, Part C, vol. 19, No. 3 (Jul. 1996) pp. 150-161.

Geffken, R. M. "An Overview of Polyimide Use in Integrated Circuits and Packaging," Proceedings of the Third International Symposium on Ultra Large Scale Integration Science and Technology (1991) pp. 667-677.

Luther, B. et al. "Planar Copper-Polyimide Back End of the Line Interconnections for ULSI Devices," Proceedings of the 10th International IEEE VLSI Multilevel Interconnection Conference (1993) pp. 15-21.

Master, R. et al. "Ceramic Mini-Ball Grid Array Package for High Speed Device," Proceedings from the 45th Electronic Components and Technology Conference (1995) pp. 46-50.

Maloney, T. et al. "Stacked PMOS Clamps for High Voltage Power Supply Protection," Electrical Overstress/Electrostatic Discharge Symposium Proceedings (1999) pp. 70-77.

Lin, M.S. et al. "A New System-on-a-Chip (SOC) Technology—High Q Post Passivation Inductors," Proceedings from the 53rd Electronic Components and Technology Conference (May 30, 2003) pp. 1503-1509.

Megic Corp. "MEGIC way to system solutions through bumping and redistribution," (Brochure) (Feb. 6, 2004) pp. 1-3.

Lin, M.S. "Post Passivation Technology™—MEGIC ® Way to System Solutions," Presentation given at TSMC Technology Symposium, Japan (Oct. 1, 2003) pp. 1-32.

Lin, M.S. et al. "A New IC Interconnection Scheme and Design Architecture for High Performance ICs at Very Low Fabrication Cost—Post Passivation Interconnection," Proceedings of the IEEE Custom Integrated Circuits Conference (Sep. 24, 2003) pp. 533-536.

Foreign Office Action and Search Report for Taiwan Patent Application No. 096122418 issued Dec. 10, 2010 with English Summary Translation.

* cited by examiner

INTEGRATED CIRCUIT AND METHOD FOR FABRICATING THE SAME

This application claims priority to U.S. provisional application No. 60/805,981, filed on Jun. 27, 2006, which is herein incorporated by reference in its entirety.

BACKGROUND OF THE INVENTION

1. Field of the Invention

The invention relates to an integrated circuit (IC) chip with good electric properties, and, more specifically, to an integrated circuit (IC) chip with coarse metal interconnections under a passivation layer for good electric properties.

2. Brief Description of the Related Art

When the dimensions of Integrated Circuits are scaled down, the cost per die is decreased while some aspects of performance are improved. The metal connections which connect the Integrated Circuit to other circuit or system components become of relative more importance and have, with the further miniaturization of the IC, an increasingly negative impact on circuit performance. The parasitic capacitance and resistance of the metal interconnections increase, which degrades the chip performance significantly. Of most concern in this respect is the voltage drop along the power and ground buses and the RC delay of the critical signal paths. Attempts to reduce the resistance by using wider metal lines result in higher capacitance of these circuits.

Since the 1960's, sputtered aluminum has become a main stream IC interconnection metal material. The aluminum film is sputtered covering the whole wafer, and then the metal is patterned using photolithography methods and dry and/or wet etching. It is technically difficult and economically expensive to create thicker than 2 µm aluminum metal lines due to the cost and stress concerns of blanket sputtering. About 1995, damascene copper metal became an alternative for IC metal interconnection. In damascene copper, the insulator is patterned and copper metal lines are formed within the insulator openings by blanket electroplating copper and chemical mechanical polishing (CMP) to remove the unwanted copper. Electroplating the whole wafer with thick metal creates large stress and carries a very high material (metal) cost. Furthermore, the thickness of damascene copper is usually defined by the insulator thickness, typically chemical vapor deposited (CVD) oxides, which does not offer the desired thickness due to stress and cost concerns. Again it is also technically difficult and economically expensive to create thicker than 2 µm copper lines.

U.S. Pat. Nos. 6,495,442 to M. S. Lin et al and 6,383,916 to M. S. Lin, add, in a post passivation processing sequence, a thick layer of dielectric over a layer of passivation and layers of wide and thick metal lines on top of the thick layer of dielectric.

SUMMARY OF THE INVENTION

It is the primary objective of the invention to provide a new interconnection scheme especially useful for high speed, low power consumption, low voltage, and/or high current IC chips.

Another objective of the invention is to provide a selective electroplating method for forming a thick metal with a thickness of between 5 and 25 micrometers between a semiconductor substrate and a passivetion layer.

It is yet another objective of the invention to provide a new interconnection scheme comprising both coarse and fine line interconnection schemes in an IC chip.

A further objective of the invention is to provide a method for fabricating a passivation layer on a coarse metal trace, wherein the coarse metal trace is formed by an embossing process and is over a semiconductor substrate.

A still further objective of the invention is to provide a method for fabricating a coarse metal trace between a semiconductor substrate and a passivation layer by an embossing process.

In accordance with the objectives of the invention, a method of forming coarse and fine line metal trace schemes in an IC chip is achieved. A semiconductor substrate is provided. A fine line metal trace structure, circuit structure, comprising one or more metal layers and multiple metal plugs is provided over the semiconductor substrate. A coarse metal trace is formed over the fine line metal trace structure by an embossing process. A passivation layer is formed on the coarse metal trace.

Also in accordance with the objectives of the invention, a metal trace scheme comprising both fine line metal trace structure and coarse metal trace is achieved. A semiconductor substrate is provided. A fine line metal trace structure, circuit structure, comprising one or more metal layers and multiple metal plugs is over the semiconductor substrate. A coarse metal trace is over the fine line metal trace structure, and the coarse metal trace is further covered by a passivation layer.

To enable the objectives, technical contents, characteristics and accomplishments of the present invention, the embodiments of the present invention are to be described in detail in cooperation with the attached drawings below.

DETAILED DESCRIPTION OF THE INVENTION

Figure 1:
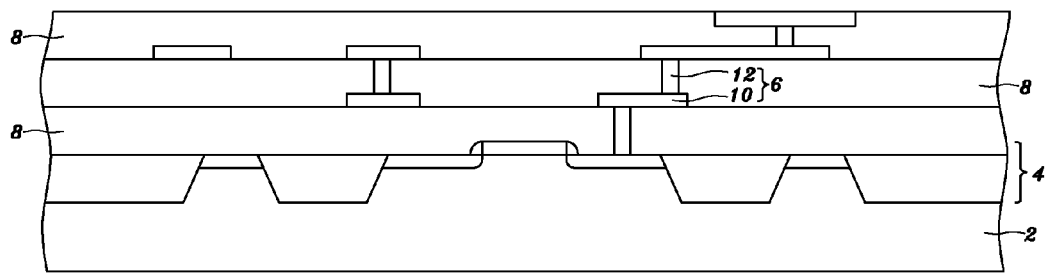
FIG. 1 is a sectional view schematically showing a semiconductor wafer according to the present invention.

Referring to FIG. 1, a semiconductor substrate or semiconductor wafer 2 may be a silicon substrate or silicon wafer, a GaAs substrate or GaAs wafer, or a SiGe substrate or SiGe wafer. Multiple semiconductor devices 4 are formed in or over the semiconductor substrate 2. The semiconductor device 4 may be a passive device, such as resistor, capacitor, inductor or filter, or an active device, such as p-channel MOS device, n-channel MOS device, CMOS (Complementary Metal Oxide Semiconductor), BJT (Bipolar Junction Transistor) or BiCMOS (Bipolar CMOS) device.

A circuit structure 6, fine line metal trace structure, is formed over the semiconductor substrate 2. The circuit structure 6 comprises multiple patterned metal layers 10 having a thickness of less than 3 μm and multiple metal plugs 12. For example, the patterned metal layers 10 and the metal plugs 12 are principally made of copper. Alternatively, the patterned metal layer 10 is principally made of aluminum or aluminum-alloy, and the metal plug 12 is principally made of tungsten. One of the patterned metal layers 10 may be formed by a damascene process including sputtering an adhesion/barrier layer, such tantalum or tantalum nitride, on an insulating layer, composed of Low-K oxide and oxynitride, and in an opening in the insulating layer, then sputtering a first copper layer on the adhesion/barrier layer, then electroplating a second copper layer on the first copper layer, then removing the first and second copper layers and the adhesion/barrier layer outside the opening in the insulating layer using a chemical mechanical polishing (CMP) process. Alternatively, one of the patterned metal layer 10 may be formed by a process including sputtering an aluminum-alloy layer, containing more than 90 wt % aluminum and less than 10 wt % copper, on an insulating layer, such as oxide, then patterning the aluminum-alloy layer using photolithography and etching processes.

Multiple dielectric layers 8 having a thickness of less than 3 micrometers are located over the semiconductor substrate 2 and interposed respectively between the neighboring patterned metal layers 10, and the neighboring patterned metal layers 10 are interconnected through the metal plugs 12 inside the dielectric layer 8. The dielectric layer 8 is commonly formed by a chemical vapor deposition (CVD) process. The material of the dielectric layer 8 may include silicon oxide, silicon oxynitride, TEOS (Tetraethoxysilane), a compound containing silicon, carbon, oxygen and hydrogen (such as $Si_wC_xO_yH_z$), silicon nitride (such as $Si_3N_4$), FSG (Fluorinated Silicate Glass), Black Diamond, SiLK, a porous silicon oxide, a porous compound containing nitrogen, oxygen and silicon, SOG (Spin-On Glass), a polyarylene ether, PBO (Polybenzoxazole), or a material having a low dielectric constant (K) of between 1.5 and 3, for example.

Figure 2A:
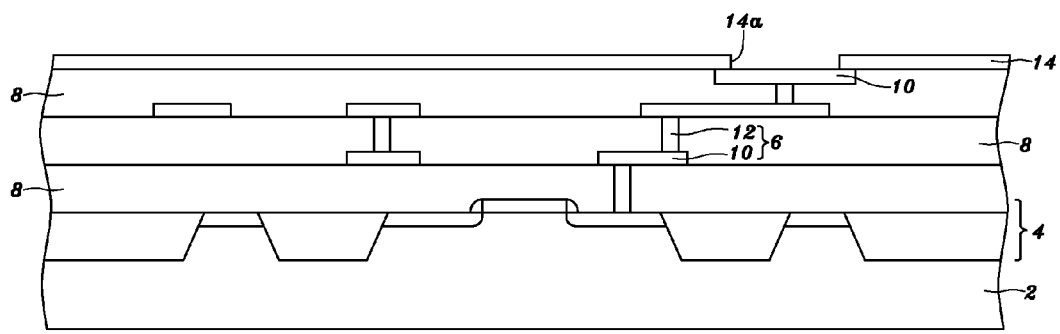
FIGS. 2A through 2J are sectional views schematically showing a process for forming a coarse metal trace over a fine line metal trace structure according to the present invention.

Referring to FIG. 2A, a silicon-containing dielectric layer 14 having a thickness of between 0.1 μm and 0.5 μm can be formed over the circuit structure 6 and over the dielectric layer 8 by a plasma enhanced chemical vapor deposition (PECVD), and at least one opening 14a can be formed in the silicon-containing dielectric layer 14, exposing the metal layer 10 of the circuit structure 6. The silicon-containing dielectric layer 14 may be a layer of silicon nitride or a layer of silicon oxynitride.

For example, the silicon-containing dielectric layer 14 may be a layer of silicon nitride having a thickness of between 0.1 and 0.5 μm, and the opening 14a in the silicon-containing dielectric layer 14 exposes the metal layer 10 principally made of copper. Alternatively, the silicon-containing dielectric layer 14 may be a layer of silicon oxynitride having a thickness of between 0.1 and 0.5 μm, and the opening 14a in the silicon-containing dielectric layer 14 exposes the metal layer 10 principally made of copper. Alternatively, the silicon-containing dielectric layer 14 may be a layer of silicon nitride having a thickness of between 0.1 and 0.5 μm, and the opening 14a in the silicon-containing dielectric layer 14 exposes the metal layer 10 principally made of aluminum. Alternatively, the silicon-containing dielectric layer 14 may be a layer of silicon oxynitride having a thickness of between 0.1 and 0.5 μm, and the opening 14a in the silicon-containing dielectric layer 14 exposes the metal layer 10 principally made of aluminum.

Figure 2B:
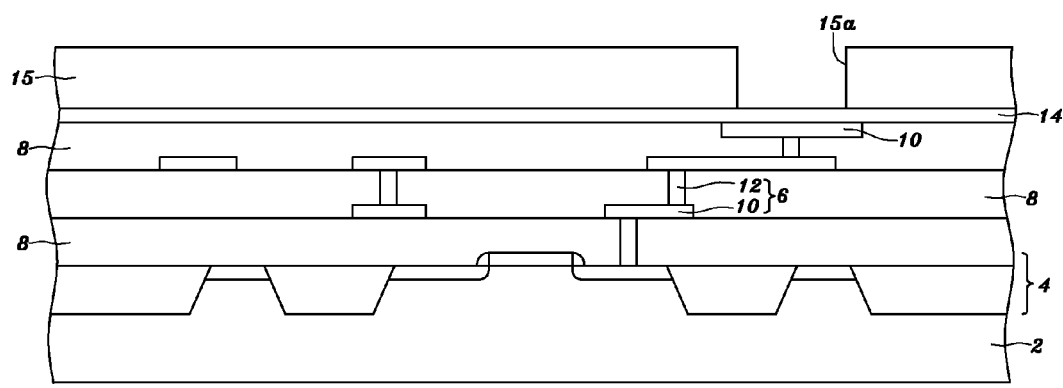

A method for forming the opening 14a in the silicon-containing dielectric layer 14 is described as below. Referring to FIG. 2B, a photoresist layer 15 is formed on the silicon-containing dielectric layer 14 by a spin coating process or a lamination process. Next, the photoresist layer 15 is patterned with the processes of exposure, development, etc., to form at least one opening 15a in the photoresist layer 15 exposing the silicon-containing dielectric layer 14. A 1× stepper or a 1× contact aligner may be used to expose the photoresist layer 15 during the process of exposure.

Figure 2C:
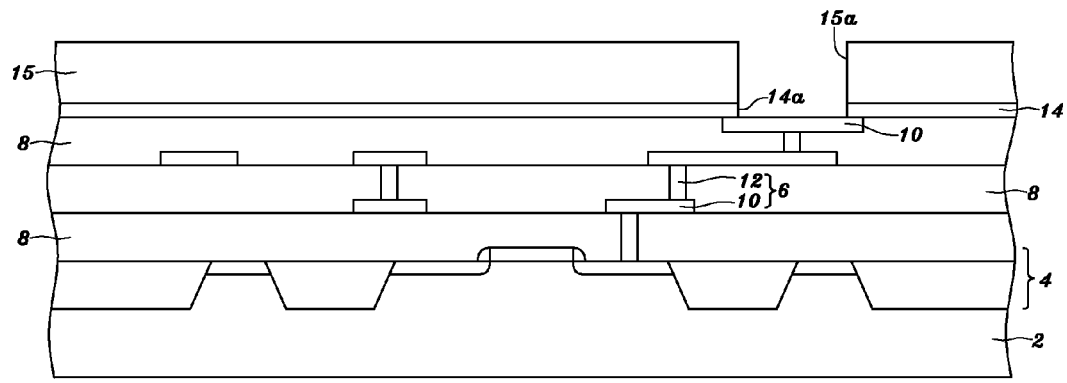

Referring to FIG. 2C, the silicon-containing dielectric layer 14 exposed by the opening 15a in the photoresist layer 15 is removed with an etching method, and preferably with a dry etching method, such as reactive ion etching (RIE) process. Thereby, an opening 14a can be formed in the silicon-containing dielectric layer 14, exposing the metal layer 10 of the circuit structure 6. Next, most of the photoresist layer 15 can be removed using an organic solution with amide shown in FIG. 2A. However, some residuals from the photoresist layer 15 or contaminants could remain on the silicon-containing dielectric layer 14 and on the metal layer 10 exposed by the opening 14a. Thereafter, the residuals or contaminants can be removed from the metal layer 10 exposed by opening 14a and from the silicon-containing dielectric layer 14 with a plasma, such as an $O_2$ plasma or a plasma containing fluorine of below 200 PPM and oxygen. Alternatively, the photoresist layer 15 can be removed using an $O_2$ plasma or using a plasma containing fluorine of below 200 PPM and oxygen, without using an organic solution.

After the step shown in FIG. 2A is completed, an oxidized portion from the metal layer 10 exposed by the opening 14a can be removed by Ar sputtering etching or ion milling the oxidized portion.

Figure 2D:
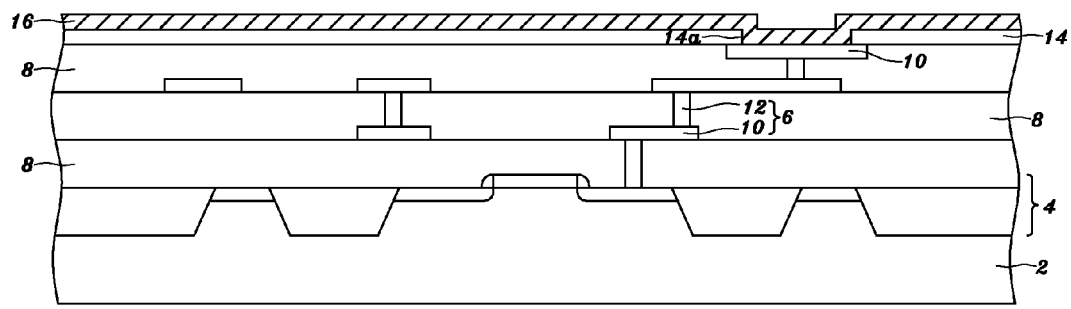

Next, referring to FIG. 2D, an adhesion/diffusion barrier layer 16 having a thickness of between 0.03 μm and 0.5 μm is formed on the silicon-containing dielectric layer 14 and on the metal layer 10 exposed by the opening 14a. The material of the adhesion/diffusion barrier layer 16 may include titanium, a titanium-tungsten alloy, titanium nitride, chromium, cobalt, refractory metal, a refractory metal-alloy, or a composite of the abovementioned materials. The refractory metal is defined as a metal with high melting point and chemical stability, such as tantalum, molybdenum or tungsten. The adhesion/diffusion barrier layer 16 may be formed by a sputtering method.

For example, the adhesion/diffusion barrier layer 16 may be formed by sputtering a titanium layer with a thickness of between 0.03 and 0.5 μm on the layer of silicon nitride and on the metal layer 10, principally made of copper, exposed by the opening 14a. Alternatively, the adhesion/diffusion barrier layer 16 may be formed by sputtering a titanium layer with a thickness of between 0.03 and 0.5 µm on the layer of silicon oxynitride and on the metal layer 10, principally made of copper, exposed by the opening 14a. Alternatively, the adhesion/diffusion barrier layer 16 may be formed by sputtering a titanium layer with a thickness of between 0.03 and 0.5 µm on the layer of silicon nitride and on the metal layer 10, principally made of aluminum, exposed by the opening 14a. Alternatively, the adhesion/diffusion barrier layer 16 may be formed by sputtering a titanium layer with a thickness of between 0.03 and 0.5 µm on the layer of silicon oxynitride and on the metal layer 10, principally made of aluminum, exposed by the opening 14a. Alternatively, the adhesion/diffusion barrier layer 16 may be formed by sputtering a titanium-tungsten-alloy layer with a thickness of between 0.03 and 0.5 µm on the layer of silicon nitride and on the metal layer 10, principally made of copper, exposed by the opening 14a. Alternatively, the adhesion/diffusion barrier layer 16 may be formed by sputtering a titanium-tungsten-alloy layer with a thickness of between 0.03 and 0.5 µm on the layer of silicon oxynitride and on the metal layer 10, principally made of copper, exposed by the opening 14a. Alternatively, the adhesion/diffusion barrier layer 16 may be formed by sputtering a titanium-tungsten-alloy layer with a thickness of between 0.03 and 0.5 µm on the layer of silicon nitride and on the metal layer 10, principally made of aluminum, exposed by the opening 14a. Alternatively, the adhesion/diffusion barrier layer 16 may be formed by sputtering a titanium-tungsten-alloy layer with a thickness of between 0.03 and 0.5 µm on the layer of silicon oxynitride and on the metal layer 10, principally made of aluminum, exposed by the opening 14a.

Figure 2E:
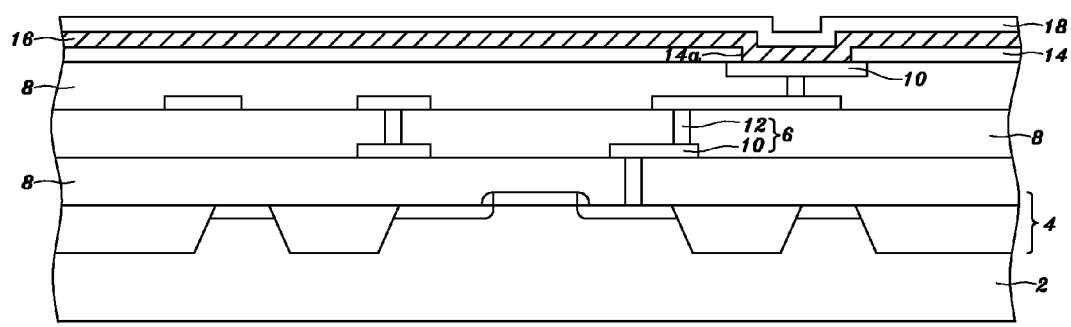

Referring to FIG. 2E, a seed layer 18 having a thickness of 0.05 µm and 1gm is formed on the adhesion/diffusion barrier layer 16. The seed layer 18 may be formed by a sputtering method, a vapor deposition method, an electroless plating method or a PVD (Physical Vapor Deposition) method. The seed layer 18 is beneficial to electroplating a metal layer thereon. Thus, the material of the seed layer 18 varies with the material of the electroplated metal layer formed on the seed layer 18. When a gold layer is to be electroplated on the seed layer 18, gold (Au) is a preferable material to the seed layer 18. When a copper layer is to be electroplated on the seed layer 18, copper (Cu) is a preferable material to the seed layer 18.

For example, when the adhesion/diffusion barrier layer 16 is formed by sputtering a titanium layer with a thickness of between 0.03 and 0.5 µm, the seed layer 18 can be formed by sputtering a gold layer with a thickness of between 0.05 and 1 µm on the titanium layer. When the adhesion/diffusion barrier layer 16 is formed by sputtering a titanium layer with a thickness of between 0.03 and 0.5 µm, the seed layer 18 can be formed by sputtering a copper layer with a thickness of between 0.05 and 1 µm on the titanium layer. When the adhesion/diffusion barrier layer 16 is formed by sputtering a titanium-tungsten-alloy layer with a thickness of between 0.03 and 0.5 µm, the seed layer 18 can be formed by sputtering a gold layer with a thickness of between 0.05 and 1 µm on the titanium-tungsten-alloy layer. When the adhesion/diffusion barrier layer 16 is formed by sputtering a titanium-tungsten-alloy layer with a thickness of between 0.03 and 0.5 µm, the seed layer 18 can be formed by sputtering a copper layer with a thickness of between 0.05 and 1 µm on the titanium-tungsten-alloy layer.

Figure 2F:
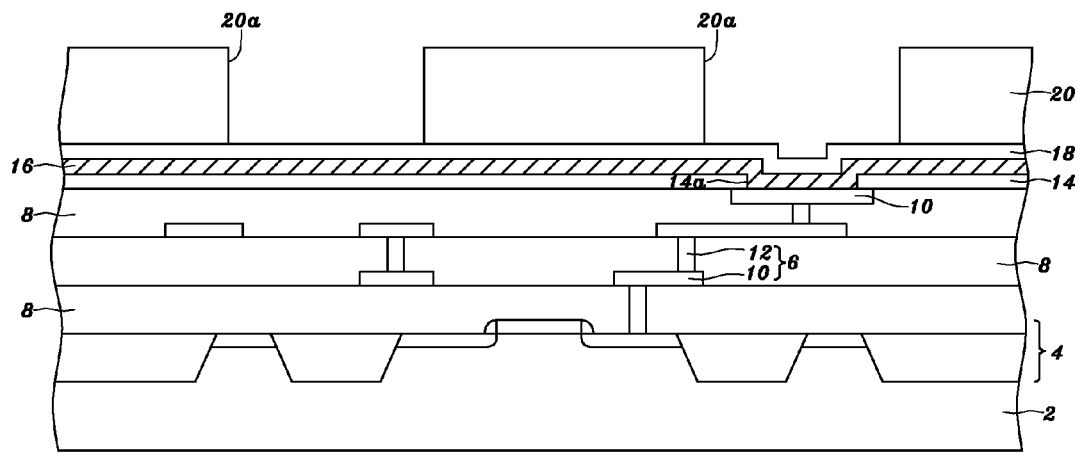
Figure 2G:
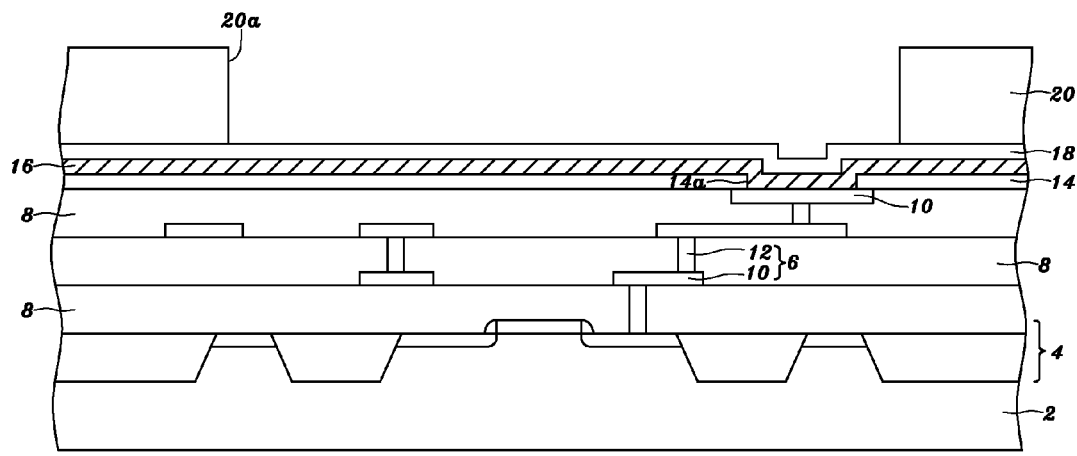

Referring to FIG. 2F and FIG. 2G, a photoresist layer 20 can be formed on the seed layer 18 by a spin coating process or a lamination process. Next, the photoresist layer 20 is patterned with the processes of exposure, development, etc., to form an opening 20a in the photoresist layer 20 exposing the seed layer 18 over the metal layer 10 exposed by the opening 14a and over the silicon-containing dielectric layer 14. FIG. 2G is a cross-sectional side view of FIG. 2F cut along the opening 20a with a trace pattern.

For example, the photoresist layer 20 can be formed by spin-on coating a positive-type photosensitive polymer layer having a thickness of between 5 and 30 µm, and preferably of between 7 and 15 µm, on the seed layer 18, then exposing the photosensitive polymer layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer, and then removing the residual polymeric material or other contaminants on the seed layer 18 with an $O_2$ plasma or a plasma containing fluorine of below 200 PPM and oxygen, such that the photoresist layer 20 can be patterned with an opening 20a in the photoresist layer 20 exposing the seed layer 18.

Figure 2H:
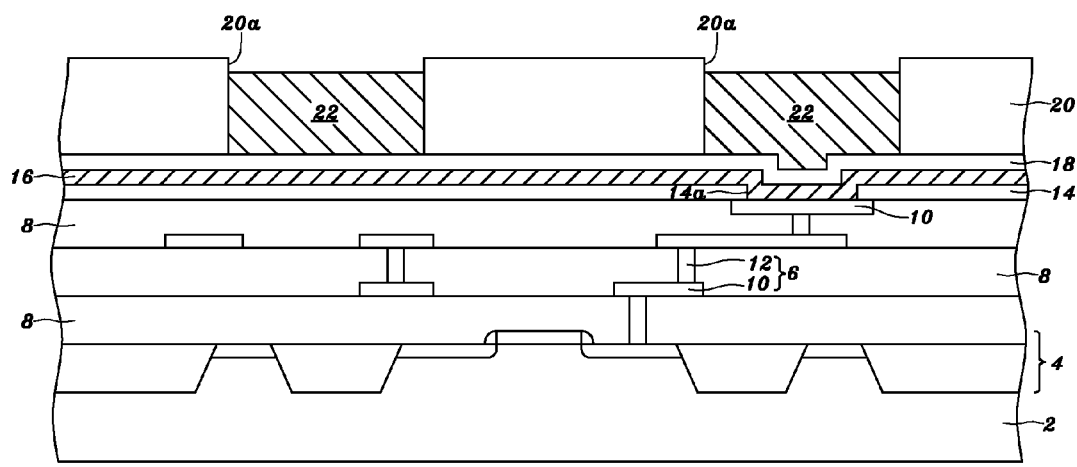

Referring to FIG. 2H, a metal layer 22 having a thickness of between 5 and 25 µm is electroplated on the seed layer 18 exposed by the opening 20a. Alternatively, the metal layer 22 may be formed by an electroless plating method. The material of the metal layer 22 may include copper, nickel, gold, or a composite of the abovementioned materials. For example, the metal layer 22 may be a gold layer. Alternatively, the metal layer 22 may be a copper layer. Alternatively, the metal layer 22 may be a copper layer and a nickel layer on the copper layer. Alternatively, the metal layer 22 may be a copper layer, a nickel layer on the copper layer, and a gold layer on the nickel layer. Below, four methods for forming the metal layer 22 are described as below.

In a first method, the metal layer 22 is formed by electroplating a copper layer with a thickness of between 5 and 25 µm on the seed layer 18, made of copper, exposed by the opening 20a with an electroplating solution containing copper sulfate ($CuSO_4$).

In a second method, the metal layer 22 is formed by electroplating a copper layer with a thickness of between 4 and 25 µm on the seed layer 18, made of copper, exposed by the opening 20a with an electroplating solution containing copper sulfate ($CuSO_4$), and then electroplating a nickel layer with a thickness of between 0.5 and 3 µm on the copper layer with an electroplating solution containing nickel sulfate ($NiSO_4$).

In a third method, the metal layer 22 is formed by electroplating a copper layer with a thickness of between 4 and 25 µm on the seed layer 18, made of copper, exposed by the openings 20a with an electroplating solution containing copper sulfate ($CuSO_4$), next electroplating a nickel layer with a thickness of between 0.5 and 3 µm on the copper layer with an electroplating solution containing nickel sulfate ($NiSO_4$), and then electroplating a gold layer with a thickness of between 0.05 and 0.2 µm on the nickel layer with an electroplating solution containing gold sodium sulfite ($Na_3Au(SO_3)_2$).

In a fourth method, the metal layer 22 is formed by electroplating a gold layer with a thickness of between 5 and 25 µm on the seed layer 18, made of gold, exposed by the openings 20a with an electroplating solution containing gold sodium sulfite ($Na_3Au(SO_3)_2$).

Figure 2I:
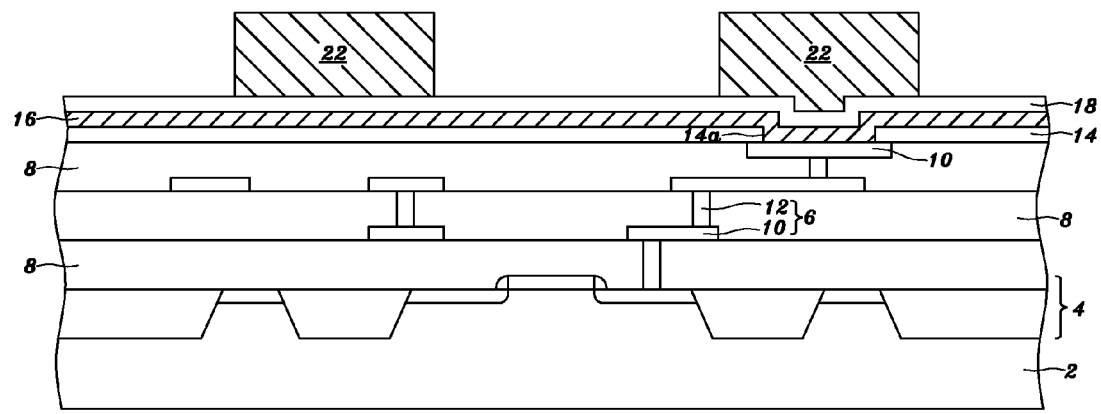

Referring to FIG. 2I, after the metal layer 22 is formed, most of the photoresist layer 20 is removed using an organic solution with amide. However, some residuals from the photoresist layer 20 or contaminants could remain on the metal layer 22 and on the seed layer 18. Thereafter, the residuals or contaminants can be removed from the metal layer 22 and the seed layer 18 with a plasma, such as an $O_2$ plasma or a plasma containing fluorine of below 200 PPM and oxygen. Alternatively, the photoresist layer 20 can be removed using an $O_2$ plasma or using a plasma containing fluorine of below 200 PPM and oxygen, without using an organic solution.

Figure 2J:
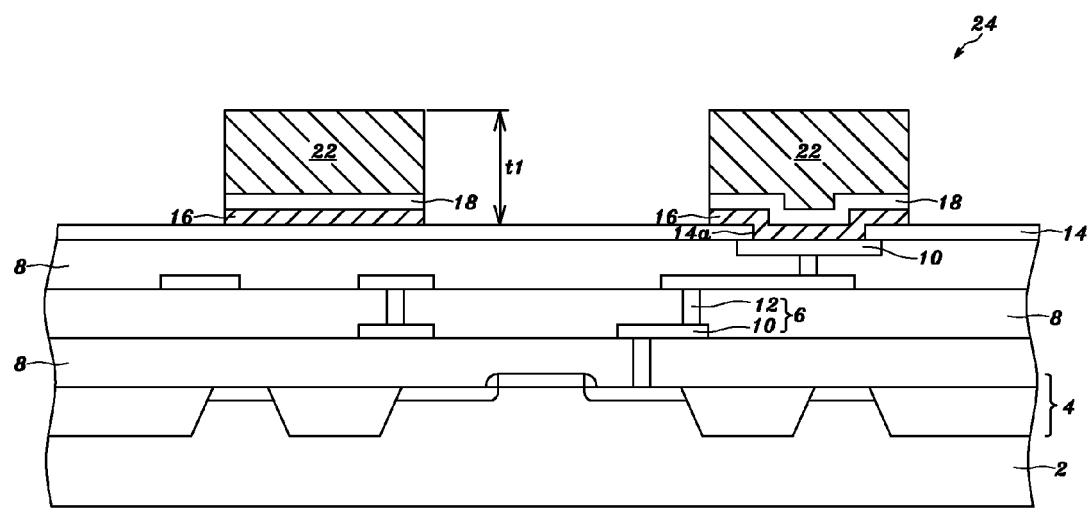

Referring to FIG. 2J, the seed layer 18 and the adhesion/diffusion barrier layer 16 not under the metal layer 22 are subsequently removed with a dry etching method or a wet etching method. Generally, the dry etching method to etch the seed layer 18 and the adhesion/diffusion barrier layer 16 not under the metal layer 22 may include a chemical plasma etching process, a physical vapor etching process, such as an argon sputter process, or a chemical vapor etching process.

As to removing the seed layer 18, it can be etched by wet chemical etching process, physical vapor etching process, or ion milling etching process. When the seed layer 18 is a gold layer, it can be wet etched with an iodine-containing solution, such as a solution containing potassium iodide. When the seed layer 18 is a copper layer, it can be wet etched with a solution containing ammonium hydroxide ($NH_4OH$). As to removing the adhesion/diffusion barrier layer 16, it can be etched by wet chemical etching process, reactive ion etching (RIE) process, etching process, or ion milling etching process. When the adhesion/diffusion barrier layer 16 is a titanium-tungsten layer, it can be wet etched using a solution of $H_2O_2$ at a temperature of between 45 and 60 degrees C. When the adhesion/diffusion barrier layer 16 is a titanium layer, it can be wet etched with HF.

Thereby, in the present invention, at least one metal trace 24, coarse metal trace, can be formed on the silicon-containing dielectric layer 14 and on the metal layer 10 of the circuit structure 6 exposed by the opening 14a. The metal trace 24 having a thickness t1 of between 5 and 27 µm can be formed of the adhesion/diffusion barrier layer 16, the seed layer 18 on the adhesion/diffusion barrier layer 16 and the metal layer 22 on the seed layer 18.

After the adhesion/diffusion barrier layer 16 and the seed layer 18 not under the metal layer 22 are removed, a passivation layer 32 can be formed on the metal trace 24 and on the silicon-containing dielectric layer 14, at least one opening 32a in the passivation layer 32 exposing the metal trace 24. Alternatively, no opening 32a in the passivation layer 32 exposing the metal trace 24 is allowable. Six methods for forming the passivation layer 32 and/or the opening 32a are described as below.

First Method for Forming the Passivation Layer 32 and/or the Opening 32a

Figure 3A:
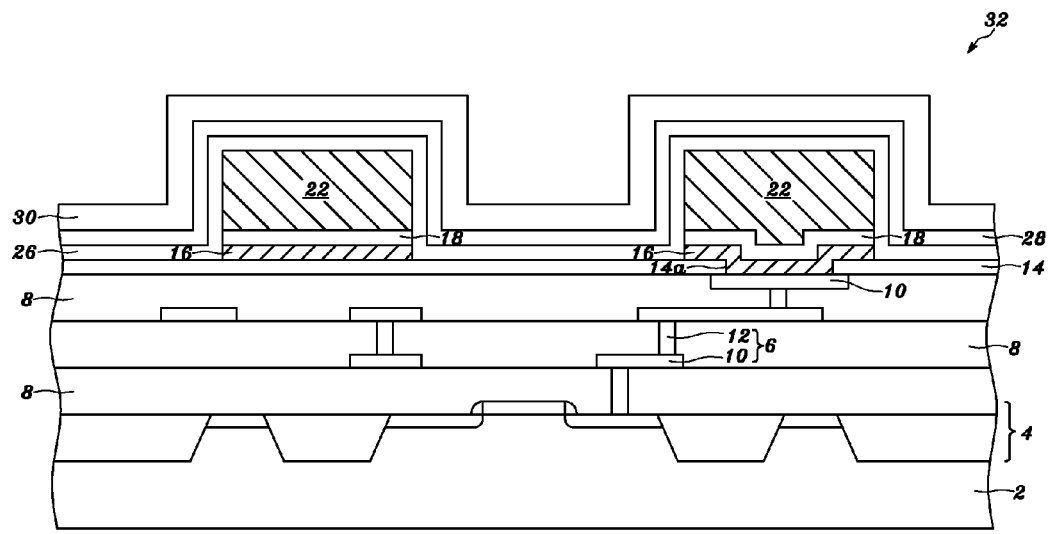
FIGS. 3A through 3F are sectional views schematically showing a process for forming a passivation layer and/or an opening in the passivation layer according to the present invention.

Referring to FIG. 3A, a layer of silicon nitride 26 having a thickness of between 0.1 and 0.5 µm is formed on the metal trace 24 and on the silicon-containing dielectric layer 14, made of a layer of silicon nitride or silicon oxynitride, via a PECVD method, next a layer of silicon oxide 28 having a thickness of between 0.1 and 0.5 µm is formed on the layer 26 of silicon nitride via a PECVD method, and then a layer 30 of silicon nitride having a thickness of between 0.5 and 1.5 µm is formed on the layer 28 of silicon oxide via a PECVD method.

Thereby, the passivation layer 32 can be formed of the layer 26 of silicon nitride, the layer 28 of silicon oxide on the layer 26 of silicon nitride, and the layer 30 of silicon nitride on the layer 28 of silicon oxide. Two methods for forming at least one opening 32a in the passivation layer 32 are described as below.

Figure 3B:
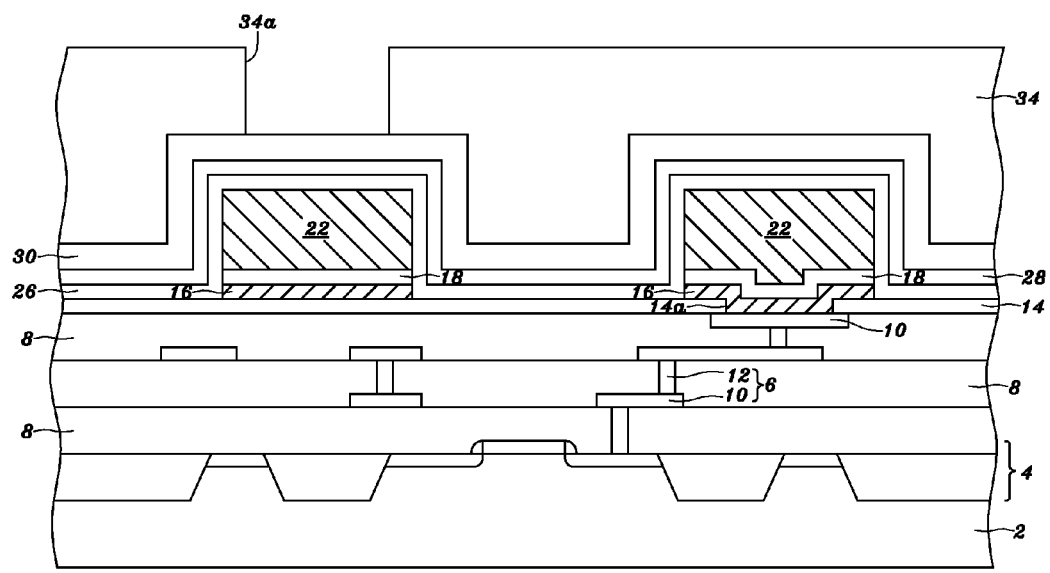
Figure 3C:
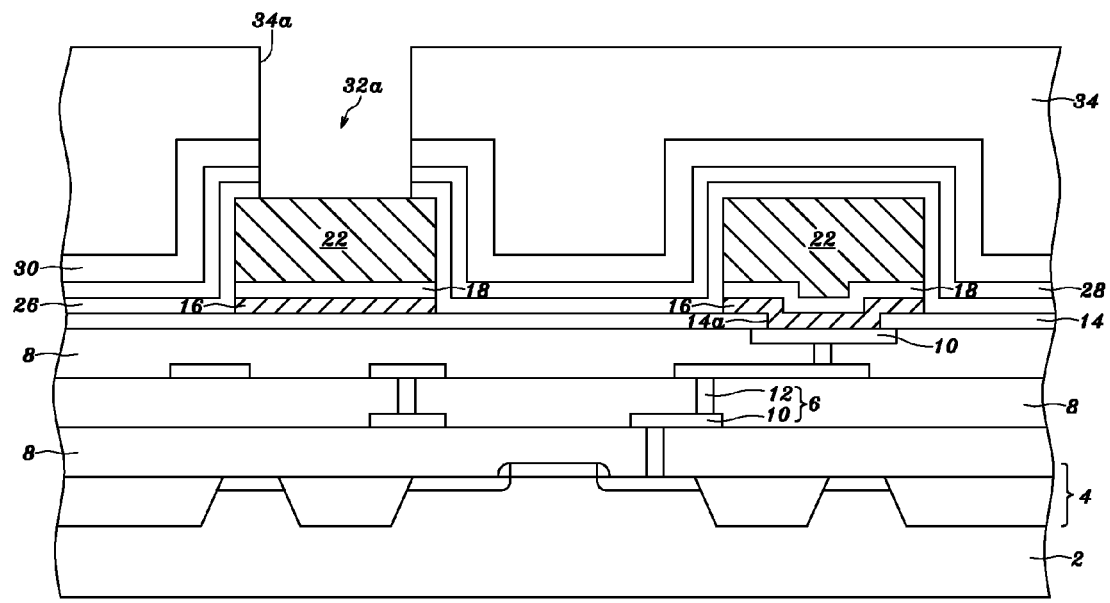
Figure 3D:
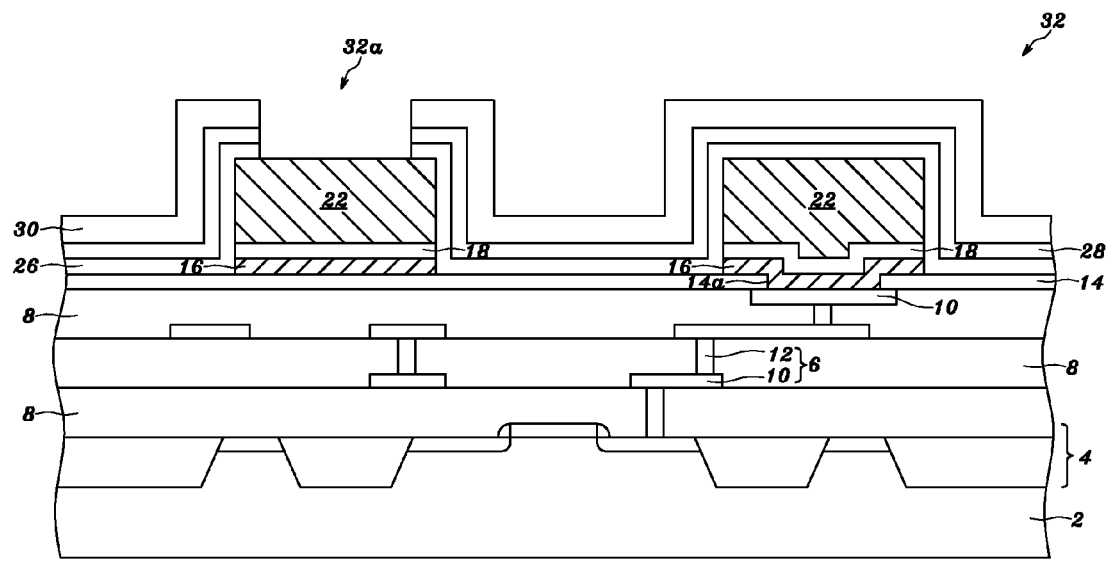

A first method for forming the opening 32a in the passivation layer 32 exposing the metal trace 24 is referred to as FIGS. 3B-3D. Referring to FIG. 3B, a photoresist layer 34 can be formed on the layer 30 of silicon nitride of the passivation layer 32 by a spin coating process or a lamination process. Next, the photoresist layer 34 is patterned with the processes of exposure, development, etc., to form at least one opening 34a in the photoresist layer 34 exposing the layer 30 of silicon nitride of the passivation layer 32. A 1× stepper or 1× contact aligner can be used to expose the photoresist layer 34 during the process of exposure.

Referring to FIG. 3C, the layer 30 of silicon nitride, the layer 28 of silicon oxide and the layer 26 of silicon nitride under the opening 34a are sequentially removed with a dry etching method or a wet etching method, and preferably with an RIE process. Thereby, at least one opening 32a can be formed in the passivation layer 32, exposing the metal trace 24.

Referring to FIG. 3D, most of the photoresist layer 34 can be removed using an organic solution with amide. However, some residuals from the photoresist layer 34 or contaminants could remain on the metal trace 24 and on the layer 30 of silicon nitride. Thereafter, the residuals or contaminants can be removed from the metal trace 24 and from the layer 30 of silicon nitride with a plasma, such as an $O_2$ plasma or a plasma containing fluorine of below 200 PPM and oxygen. Alternatively, the photoresist layer 34 can be removed using an $O_2$ plasma or using a plasma containing fluorine of below 200 PPM and oxygen, without using an organic solution.

Figure 3E:
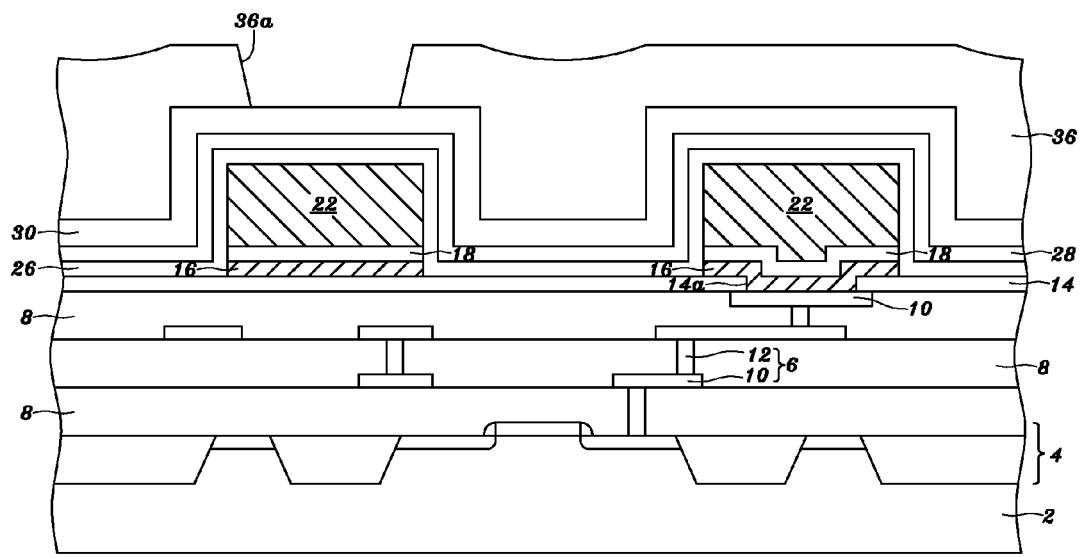
Figure 3F:
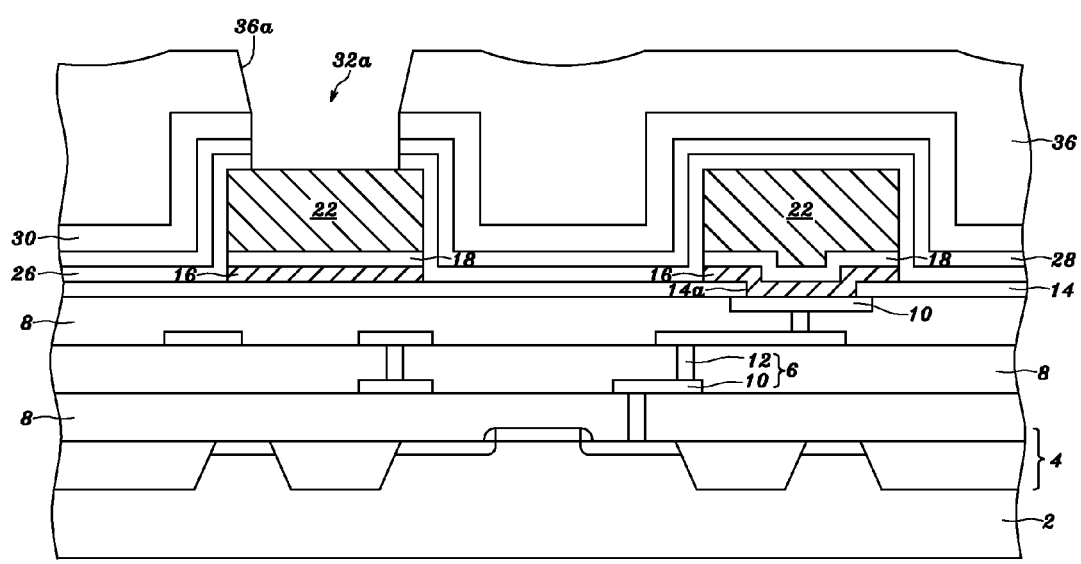

A second method for forming the opening 32a in the passivation layer 32 exposing the metal trace 24 is referred to as FIGS. 3E-3F. Referring to FIG. 3E, after the layer 30 of silicon nitride of the passivation layer 32 is formed, a positive-type photosensitive polymer layer 36 can be formed on the layer 30 of silicon nitride of the passivation layer 32 via spin-on coating process. Next, the photosensitive polymer layer 36 is patterned with the processes of baking, exposure, development, etc., to form at least one opening 36a in the polymer layer 36 exposing the layer 30 of silicon nitride of the passivation layer 32.

For example, the polymer layer 36 can be formed by spin-on coating a positive-type photosensitive polyimide layer having a thickness of between 10 and 60 µm, and preferably of between 6 and 24 µm, on the layer 30 of silicon nitride, then baking the spin-on coated polyimide layer, then exposing the baked polyimide layer using a 1× stepper with at least two of G-line having a wavelength ranging from 434 to 438 nm, H-line having a wavelength ranging from 403 to 407 nm, and I-line having a wavelength ranging from 363 to 367 nm, illuminating the baked polyimide layer, that is, G-line and H-line, G-line and I-line, H-line and I-line, or G-line, H-line and I-line illuminate the baked polyimide layer, then developing the exposed polyimide layer, and then curing or heating the developed polyimide layer at a peak temperature of between 200 and 290° C., between 290 and 330° C. or between 330 and 400° C. for a time of between 30 minutes and 2 hours in a nitrogen ambient or in an oxygen-free ambient, the cured polyimide layer having a thickness of between 5 and 30 µm, and preferably between 3 and 12 µm, such that the polyimide layer can be patterned with an opening in the polyimide layer exposing the layer 30 of silicon nitride. Alternatively, the material of the polymer layer 36 may be benzocyclobutane (BCB), polyurethane, epoxy resin, a parylene-based polymer, a solder-mask material, an elastomer, or a porous dielectric material. For example, the polymer layer 36 may be a benzocyclobutane layer with a thickness of between 5 and 30 µm.

Referring to FIG. 3F, the layer 30 of silicon nitride, the layer 28 of silicon oxide and the layer 26 of silicon nitride under the opening 36a are sequentially removed with a dry etching method or a wet etching method, and preferably with an RIE process. Thereby, at least one opening 32a is formed in the passivation layer 32, exposing the metal trace 24.

Alternatively, the above-mentioned layer 26 of silicon nitride can be replaced by a layer of silicon oxynitride, that is, the layer of silicon oxynitride having a thickness of between 0.1 and 0.5 μm is formed on the metal trace 24 and on the silicon-containing dielectric layer 14, made of a layer of silicon nitride or silicon oxynitride, via a PECVD method, followed by forming the above-mentioned layer 28 of silicon oxide having a thickness of between 0.1 and 0.5 μm on the layer of silicon oxynitride via a PECVD method, followed by forming the above-mentioned layer 30 of silicon nitride having a thickness of between 0.5 and 1.5 μm on the layer 28 of silicon oxide via a PECVD method, followed by the above-mentioned steps as shown in FIGS. 3B-3D or followed by the above-mentioned steps as shown in FIGS. 3E and 3F.

Second Method for Forming the Passivation Layer 32 and/or the Opening 32a

Figure 4A:
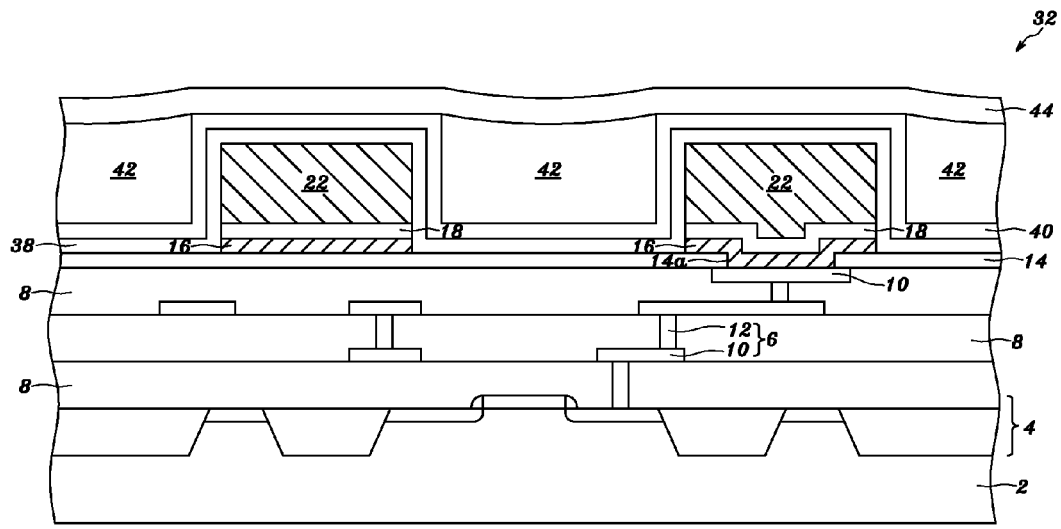
FIGS. 4A through 4F are sectional views schematically showing a process for forming a passivation layer and/or an opening in the passivation layer according to the present invention.

Referring to FIG. 4A, a layer 38 of silicon nitride having a thickness of between 0.1 and 0.5 μm is formed on the metal trace 24 and on the silicon-containing dielectric layer 14, made of a layer of silicon nitride or silicon oxynitride, via a PECVD method, next a layer 40 of silicon oxide having a thickness of between 0.1 and 0.5 μm is formed on the layer 38 of silicon nitride via a PECVD method, next a SOG layer 42 is formed on the layer 40 of silicon oxide, next the SOG layer 42 can be chemically mechanically polished (CMP), mechanically polished or etched back until the layer 40 of silicon oxide over the metal layer 22 is exposed to the ambient, and then a layer 44 of silicon nitride having a thickness of between 0.5 and 1.5 μm is formed on the layer 40 of silicon oxide and on the SOG layer 42 via a PECVD method.

Thereby, the passivation layer 32 can be formed of the layer 38 of silicon nitride, the layer 40 of silicon oxide on the layer 38 of silicon nitride, the SOG layer 42 on the layer 40 of silicon oxide, and the layer 44 of silicon nitride on the layer 40 of silicon oxide and on the SOG layer 42. Two methods for forming at least one opening 32a in the passivation layer 32 are described as below.

Figure 4B:
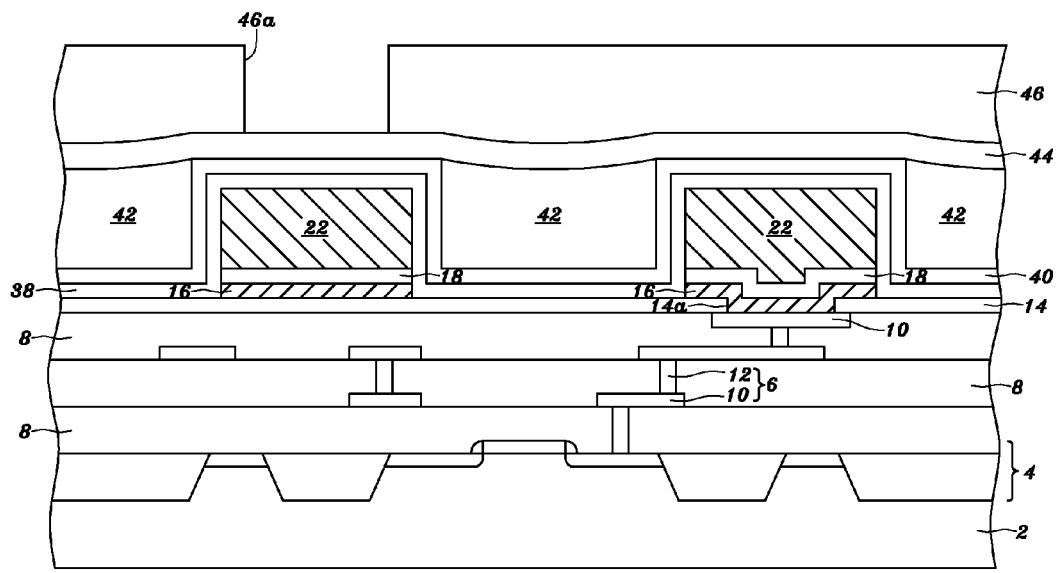
Figure 4C:
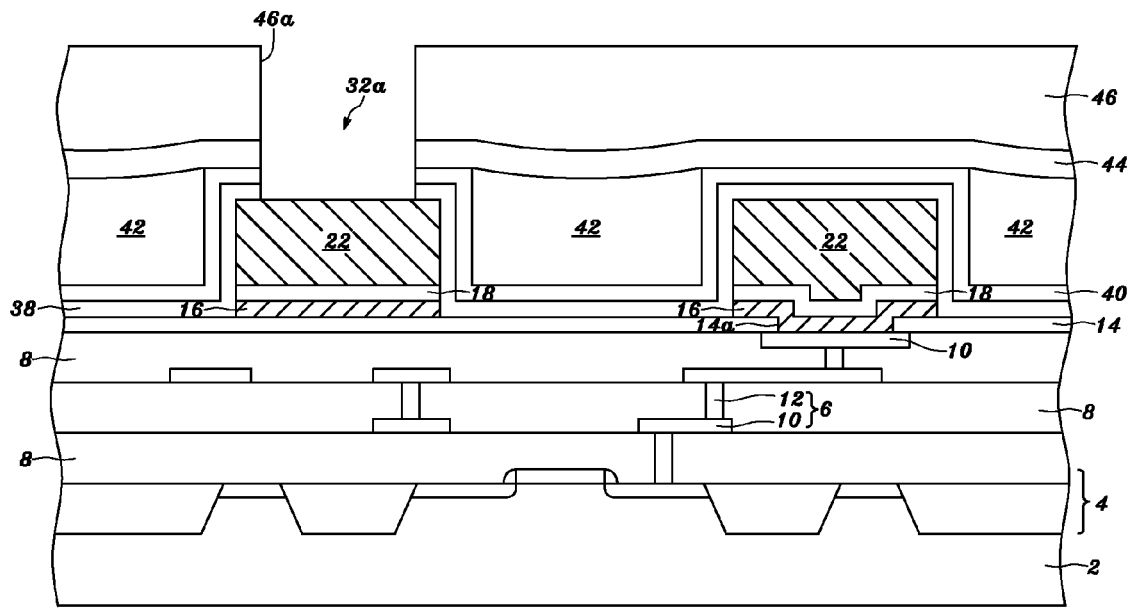
Figure 4D:
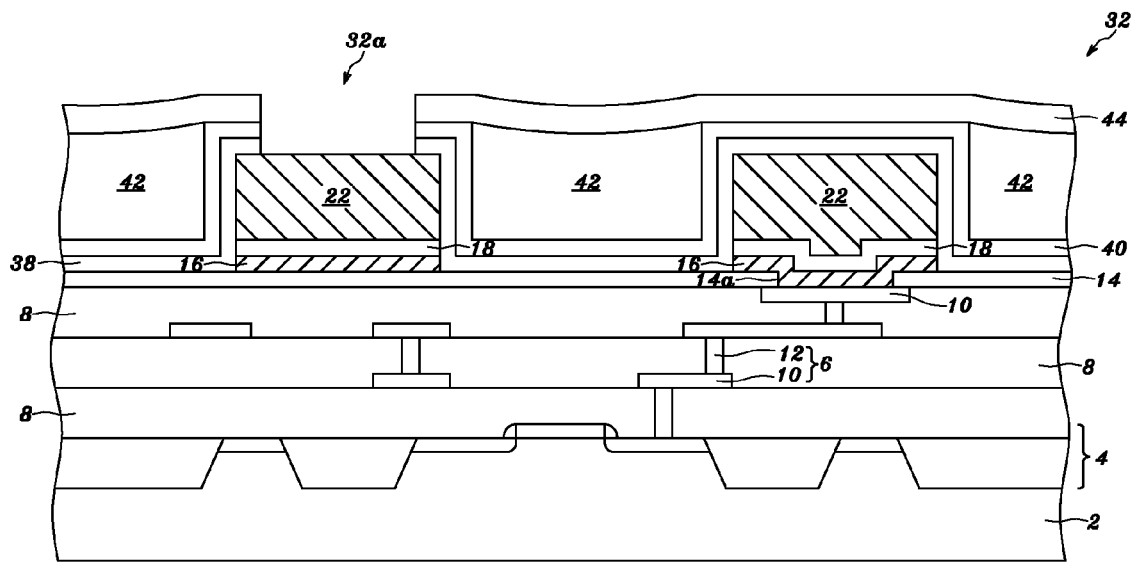

A first method for forming the opening 32a in the passivation layer 32 exposing the metal trace 24 is referred to as FIGS. 4B-4D. Referring to FIG. 4B, a photoresist layer 46 can be formed on the layer 44 of silicon nitride of the passivation layer 32 by a spin coating process or a lamination process. Next, the photoresist layer 46 is patterned with the processes of exposure, development, etc., to form at least one opening 46a in the photoresist layer 46 exposing the layer 44 of silicon nitride of the passivation layer 32. A 1× stepper or 1× contact aligner can be used to expose the photoresist layer 46 during the process of exposure.

Referring to FIG. 4C, the layer 44 of silicon nitride, the layer 40 of silicon oxide and the layer 38 of silicon nitride under the opening 46a are sequentially removed with a dry etching method or a wet etching method, and preferably with an RIE process. Thereby, at least one opening 32a can be formed in the passivation layer 32, exposing the metal trace 24.

Referring to FIG. 4D, most of the photoresist layer 46 can be removed using an organic solution with amide. However, some residuals from the photoresist layer 46 or other contaminants could remain on the metal trace 24 and on the layer 44 of silicon nitride. Thereafter, the residuals or other contaminants can be removed from the metal trace 24 and from the layer 44 of silicon nitride with a plasma, such as an $O_2$ plasma or a plasma containing fluorine of below 200 PPM and oxygen. Alternatively, the photoresist layer 46 can be removed using an $O_2$ plasma or using a plasma containing fluorine of below 200 PPM and oxygen, without using an organic solution.

Figure 4E:
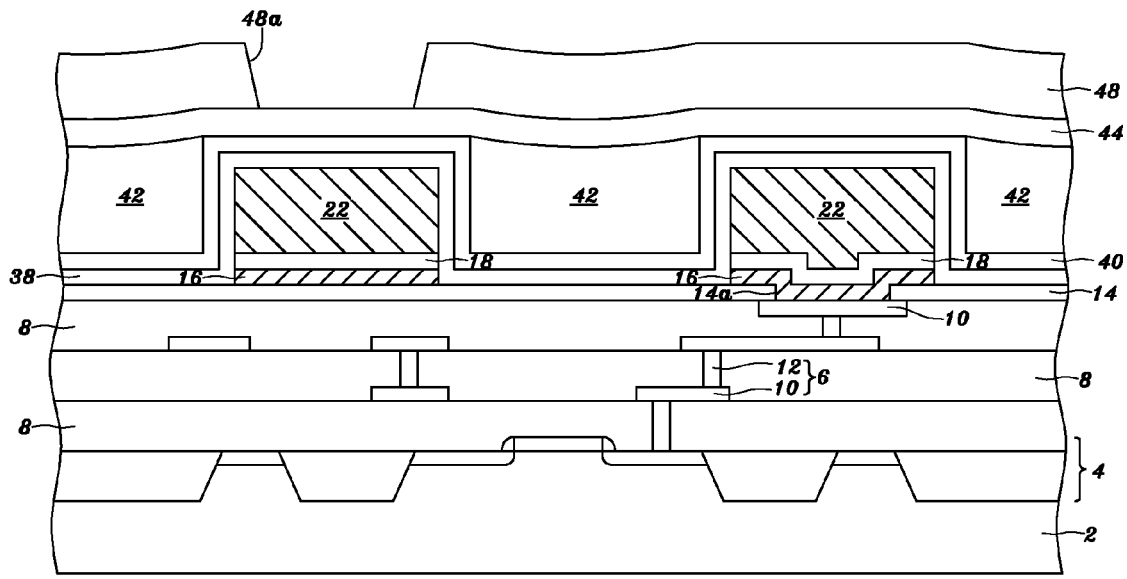
Figure 4F:
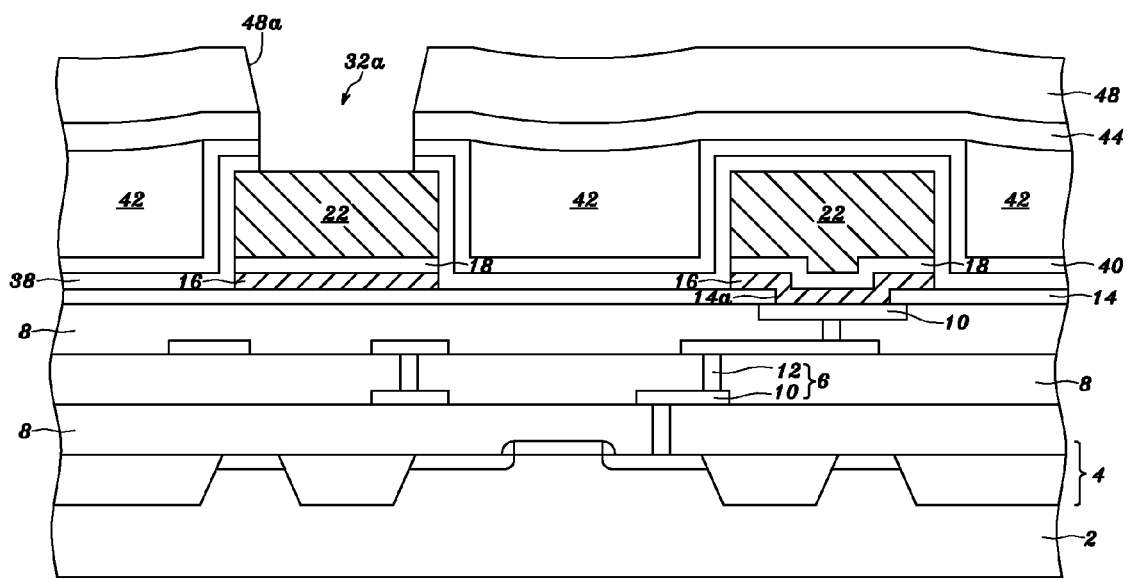

A second method for forming the opening 32a in the passivation layer 32 exposing the metal trace 24 is referred to as FIGS. 4E-4F. Referring to FIG. 4E, after the layer 44 of silicon nitride of the passivation layer 32 is formed, a positive-type photosensitive polymer layer 48 can be formed on the layer 44 of silicon nitride of the passivation layer 32 via a spin coating process. Next, the photosensitive polymer layer 48 is patterned with the processes of baking, exposure, development, etc., to form at least one opening 48a in the polymer layer 48 exposing the layer 44 of silicon nitride of the passivation layer 32.

For example, the polymer layer 48 can be formed by spin-on coating a positive-type photosensitive polyimide layer having a thickness of between 10 and 60 μm, and preferably of between 6 and 24 μm, on the layer 44 of silicon nitride, then baking the spin-on coated polyimide layer, then exposing the baked polyimide layer using a 1× stepper with at least two of G-line having a wavelength ranging from 434 to 438 nm, H-line having a wavelength ranging from 403 to 407 nm, and I-line having a wavelength ranging from 363 to 367 nm, illuminating the baked polyimide layer, that is, G-line and H-line, G-line and I-line, H-line and I-line, or G-line, H-line and I-line illuminate the baked polyimide layer, then developing the exposed polyimide layer, and then curing or heating the developed polyimide layer at a peak temperature of between 200 and 290° C., between 290 and 330° C. or between 330 and 400° C. for a time of between 30 minutes and 2 hours in a nitrogen ambient or in an oxygen-free ambient, the cured polyimide layer having a thickness of between 5 and 30 μm, and preferably between 3 and 12 μm, such that the polyimide layer can be patterned with an opening in the polyimide layer exposing the layer 44 of silicon nitride. Alternatively, the material of the polymer layer 48 may be benzocyclobutane (BCB), polyurethane, epoxy resin, a parylene-based polymer, a solder-mask material, an elastomer, or a porous dielectric material. For example, the polymer layer 48 may be a benzocyclobutane layer with a thickness of between 5 and 30 μm.

Referring to FIG. 4F, the layer 44 of silicon nitride, the layer 40 of silicon oxide and the layer 38 of silicon nitride under the opening 48a are sequentially removed with a dry etching method or a wet etching method, and preferably with an RIE process. Thereby, at least one opening 32a is formed in the passivation layer 32, exposing the metal trace 24.

Alternatively, the above-mentioned layer 38 of silicon nitride can be replaced by a layer of silicon oxynitride, that is, the layer of silicon oxynitride having a thickness of between 0.1 and 0.5 μm is formed on the metal trace 24 and on the silicon-containing dielectric layer 14, made of a layer of silicon nitride or silicon oxynitride, via a PECVD method, followed by forming the above-mentioned layer 40 of silicon oxide having a thickness of between 0.1 and 0.5 μm on the layer of silicon oxynitride via a PECVD method, followed by forming the above-mentioned SOG layer 42 on the layer 40 of silicon oxide, followed by mechanically polishing, chemically mechanically polishing (CMP) or etching back the SOG layer 42 until the layer 40 of silicon oxide over the metal layer 22 is exposed to the ambient, followed by forming the above-mentioned layer 44 of silicon nitride having a thickness of between 0.5 and 1.5 μm on the layer 40 of silicon oxide and on the SOG layer 42 via a PECVD method, followed by the above-mentioned steps as shown in FIGS. 4B-4D or followed by the above-mentioned steps as shown in FIGS. 4E and 4F.

Third Method for Forming the Passivation Layer 32 and/or the Opening 32a

Figure 5:
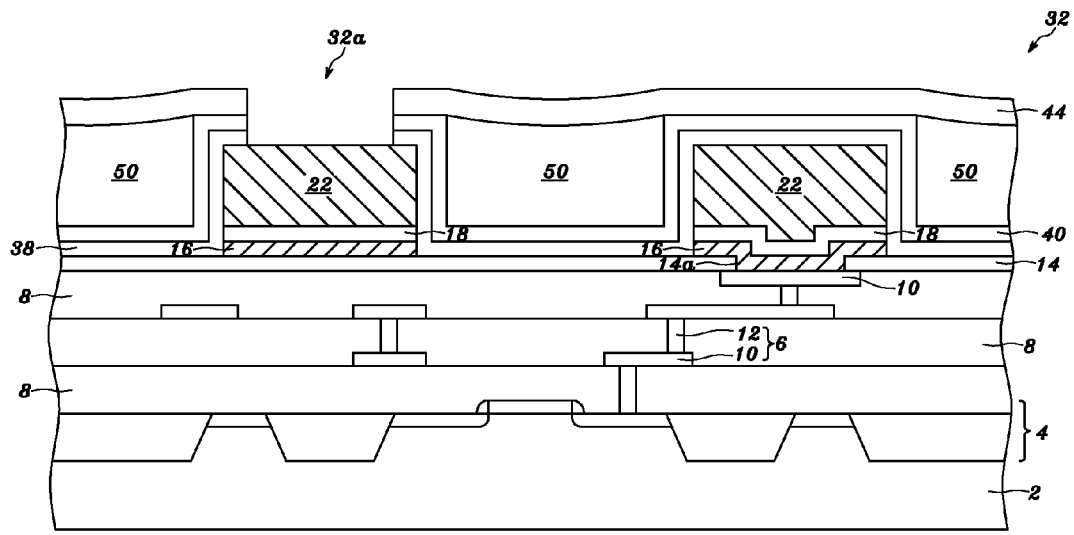
FIG. 5 is a sectional view schematically showing a process for forming a passivation layer and/or an opening in the passivation layer according to the present invention.

Referring to FIG. 5, a layer 38 of silicon nitride having a thickness of between 0.1 and 0.5 µm is formed on the metal trace 24 and on the silicon-containing dielectric layer 14, made of a layer of silicon nitride or silicon oxynitride, via a PECVD method, next a layer 40 of silicon oxide having a thickness of between 0.1 and 0.5 µm is formed on the layer 38 of silicon nitride via a PECVD method, next a polymer layer 50 is formed on the layer 40 of silicon oxide via spin coating process, next the polymer layer 50 is cured at a peak temperature of between 200 and 290° C., between 290 and 330° C. or between 330 and 400° C. for a time of between 30 minutes and 2 hours in nitrogen ambient or in oxygen-free ambient if the polymer layer 50 is polyimide, next the polymer layer 50 can be chemically mechanically polished (CMP), mechanically polished or etched back until the layer 40 of silicon oxide over the metal layer 22 is exposed to the ambient, and then a layer 44 of silicon nitride having a thickness of between 0.5 and 1.5 µm is formed on the layer 40 of silicon oxide and on the polymer layer 50 via a PECVD method. Alternatively, the material of the polymer layer 50 may be benzocyclobutane (BCB), polyurethane, a parylene-based polymer, epoxy resin, a solder-mask material, an elastomer, or a porous dielectric material.

Thereby, the passivation layer 32 can be formed of the layer 38 of silicon nitride, the layer 40 of silicon oxide on the layer 38 of silicon nitride, the polymer layer 50 on the layer 40 of silicon oxide, and the layer 44 of silicon nitride on the layer 40 of silicon oxide and on the polymer layer 50. The method of forming at least one opening 32a in the passivation layer 32 can be referred to the above description concerning FIGS. 4B-4D or FIGS. 4E-4F.

Alternatively, the above-mentioned layer 38 of silicon nitride can be replaced by a layer of silicon oxynitride, that is, the layer of silicon oxynitride having a thickness of between 0.1 and 0.5 µm is formed on the metal trace 24 and on the silicon-containing dielectric layer 14, made of a layer of silicon nitride or silicon oxynitride, via a PECVD method, followed by forming the above-mentioned layer 40 of silicon oxide having a thickness of between 0.1 and 0.5 µm on the layer of silicon oxynitride via a PECVD method, followed by forming the above-mentioned polymer layer 50 on the layer 40 of silicon oxide, followed by mechanically polishing, chemically mechanically polishing (CMP) or etching back the polymer layer 50 until the layer 40 of silicon oxide over the metal layer 22 is exposed to the ambient, followed by forming the above-mentioned layer 44 of silicon nitride having a thickness of between 0.5 and 1.5 µm on the layer 40 of silicon oxide and on the polymer layer 50 via a PECVD method, followed by the above-mentioned steps as shown in FIGS. 4B-4D or followed by the above-mentioned steps as shown in FIGS. 4E and 4F.

Fourth Method for Forming the Passivation Layer 32 and/or the Opening 32a

Figure 6A:
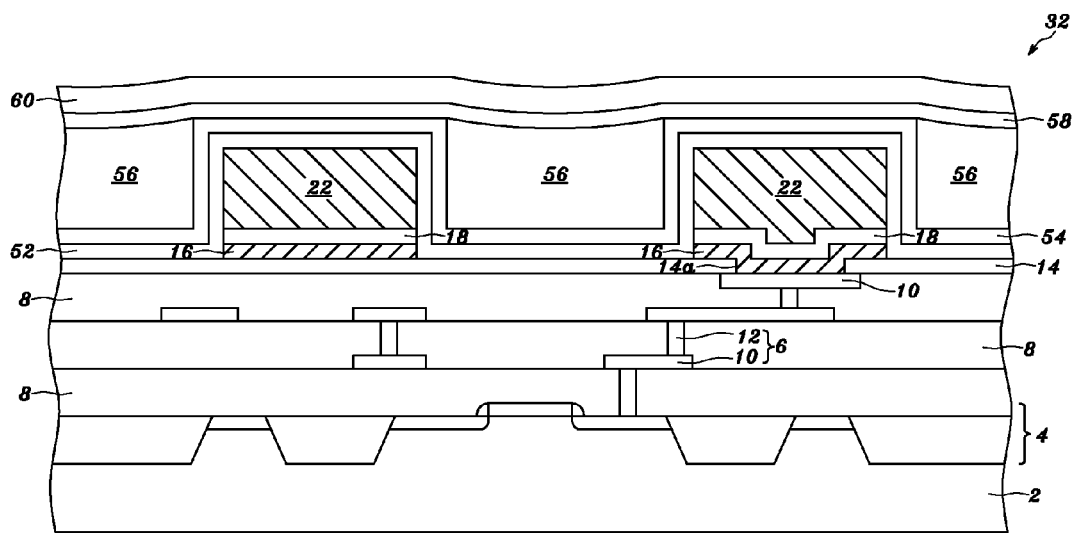
FIGS. 6A through 6F are sectional views schematically showing a process for forming a passivation layer and/or an opening in the passivation layer according to the present invention.

Referring to FIG. 6A, a layer 52 of silicon nitride having a thickness of between 0.1 and 0.5 µm is formed on the metal trace 24 and on the silicon-containing dielectric layer 14, made of a layer of silicon nitride or silicon oxynitride, via a PECVD method, next a layer 54 of silicon oxide having a thickness of between 0.1 and 0.5 µm is formed on the layer 52 of silicon nitride via a PECVD method, next an SOG layer 56 is formed on the layer 54 of silicon oxide, next the SOG layer 56 can be chemically mechanically polished (CMP), mechanically polished or etched back until the layer 54 of silicon oxide over the metal layer 22 is exposed to the ambient, next a layer 58 of silicon oxide having a thickness of between 0.2 and 0.5 µm is formed on the layer 54 of silicon oxide and on the SOG layer 56, and then a layer 60 of silicon nitride having a thickness of between 0.5 and 1.5 µm is formed on the layer 58 of silicon oxide via a PECVD method.

Thereby, the passivation layer 32 can be formed of the layer 52 of silicon nitride, the layer 54 of silicon oxide on the layer 52 of silicon nitride, the SOG layer 56 on the layer 54 of silicon oxide, the layer 58 of silicon oxide on the layer 54 of silicon oxide and on the SOG layer 56, and the layer 60 of silicon nitride on the layer 58 of silicon oxide. Two methods for forming at least one opening 32a in the passivation layer 32 are described as below.

Figure 6B:
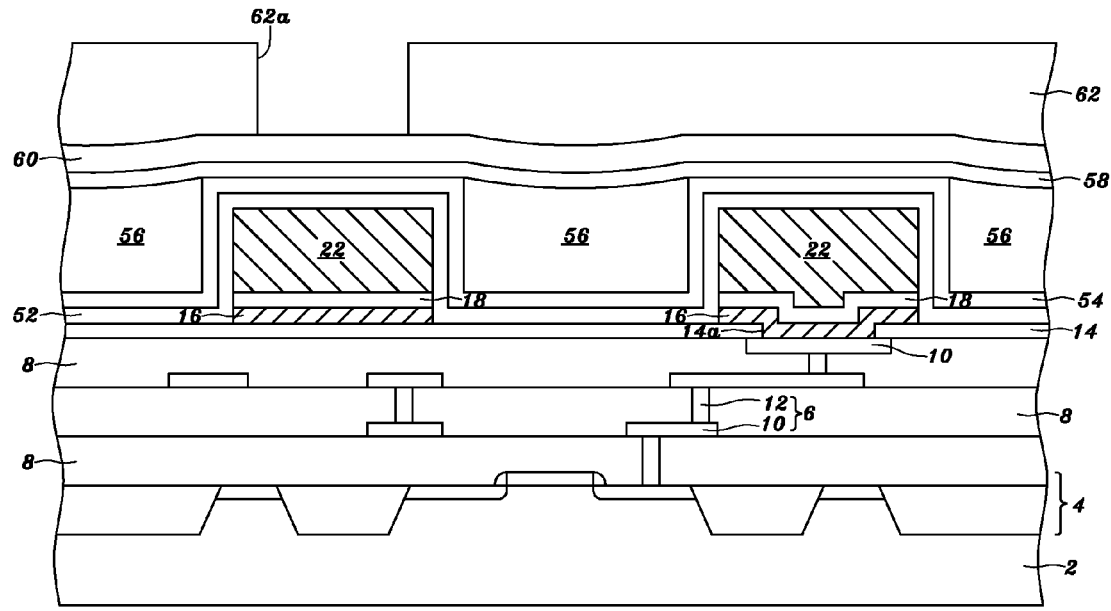
Figure 6C:
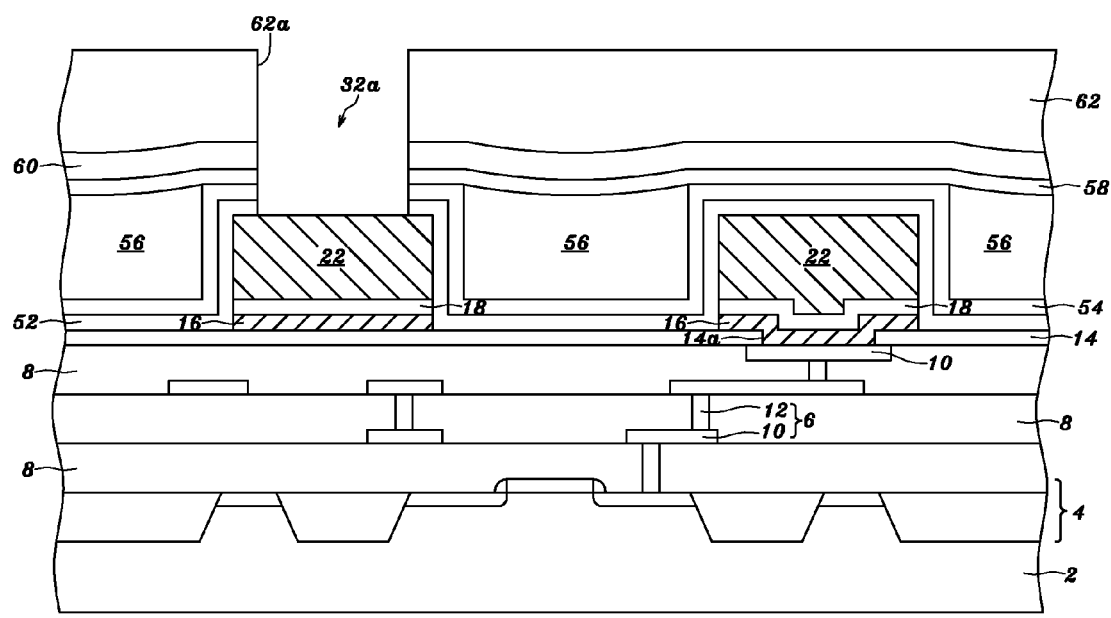
Figure 6D:
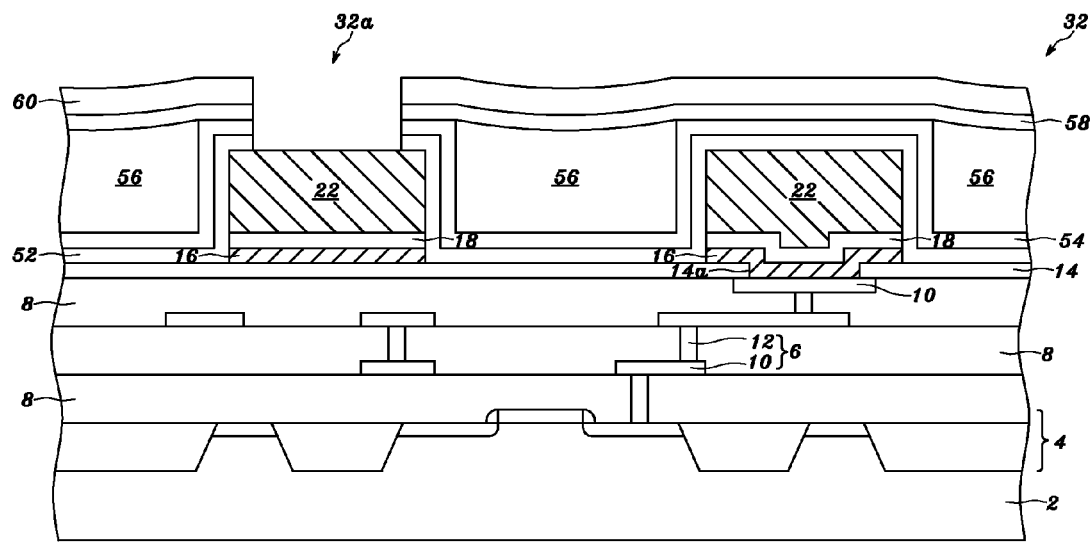

A first method for forming the opening 32a in the passivation layer 32 exposing the metal trace 24 is referred to as FIGS. 6B-6D. Referring to FIG. 6B, a photoresist layer 62 can be formed on the layer 60 of silicon nitride of the passivation layer 32 by a spin coating process or a lamination process. Next, the photoresist layer 62 is patterned with the processes of exposure, development, etc., to form at least one opening 62a in the photoresist layer 62 exposing the layer 60 of silicon nitride of the passivation layer 32. A 1× stepper or 1× contact aligner can be used to expose the photoresist layer 62 during the process of exposure.

Referring to FIG. 6C, the layer 60 of silicon nitride, the layer 58 of silicon oxide, the layer 54 of silicon oxide and the layer 52 of silicon nitride under the opening 62a are sequentially removed with a dry etching method or a wet etching method, and preferably with an RIE process. Thereby, at least one opening 32a can be formed in the passivation layer 62, exposing the metal trace 24.

Referring to FIG. 6D, most of the photoresist layer 62 can be removed using an organic solution with amide. However, some residuals from the photoresist layer 62 or other contaminants could remain on the metal trace 24 and on the layer 60 of silicon nitride. Thereafter, the residuals or other contaminants can be removed from the metal trace 24 and from the layer 60 of silicon nitride with a plasma, such as an $O_2$ plasma or a plasma containing fluorine of below 200 PPM and oxygen. Alternatively, the photoresist layer 62 can be removed using an $O_2$ plasma or using a plasma containing fluorine of below 200 PPM and oxygen, without using an organic solution.

Figure 6E:
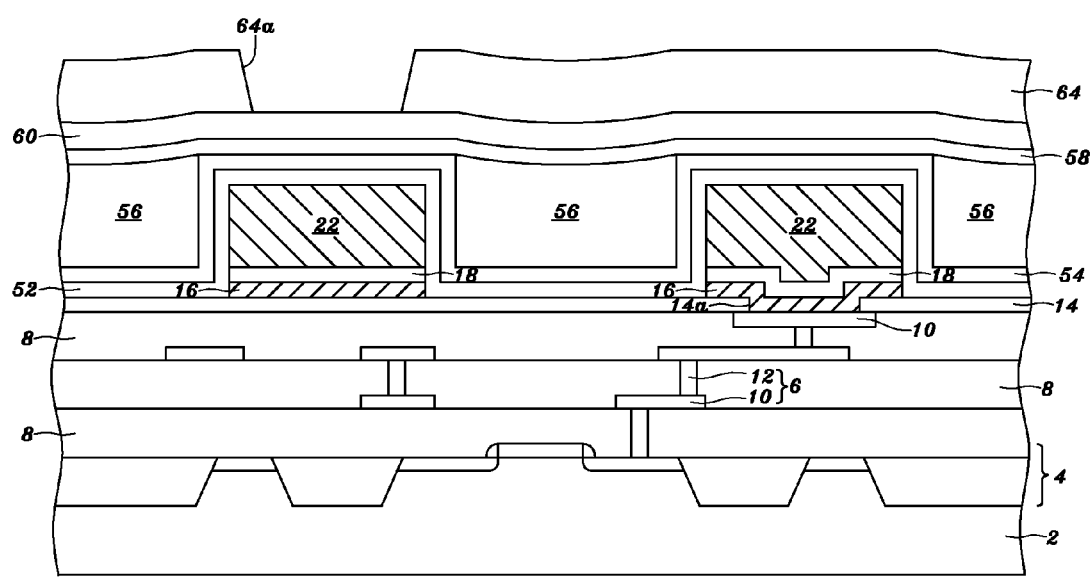
Figure 6F:
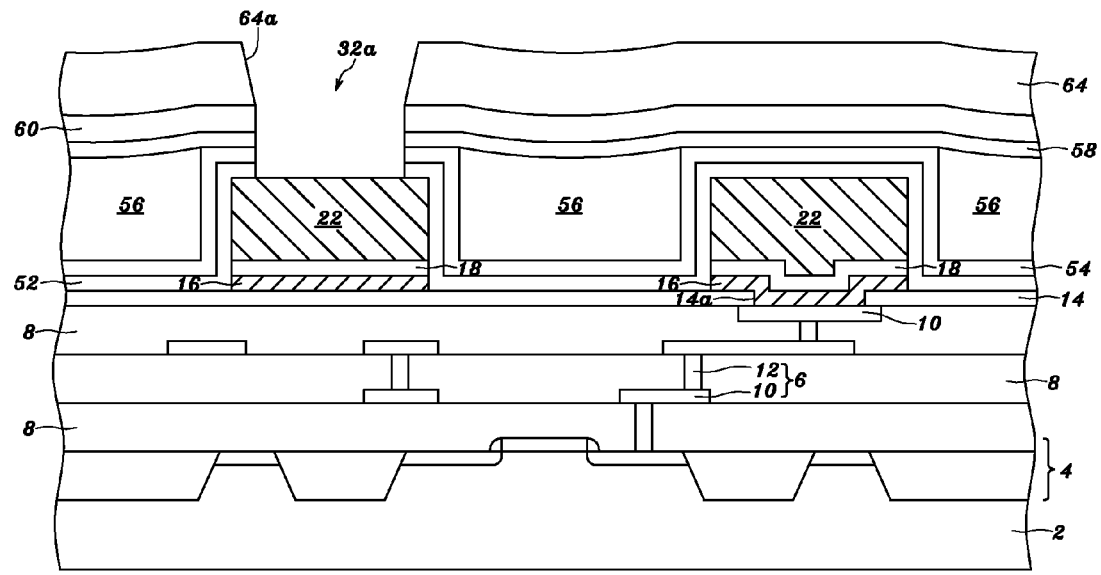

A second method for forming the opening 32a in the passivation layer 32 exposing the metal trace 24 is referred to as FIGS. 6E-6F. Referring to FIG. 6E, after the layer 60 of silicon nitride of the passivation layer 32 is formed, a positive-type photosensitive polymer layer 64 can be formed on the layer 60 of silicon nitride of the passivation layer 32 via a spin coating process. Next, the photosensitive polymer layer 64 is patterned with the processes of baking, exposure, development, etc., to form at least one opening 64a in the polymer layer 64 exposing the layer 60 of silicon nitride of the passivation layer 32.

For example, the polymer layer 64 can be formed by spin-on coating a positive-type photosensitive polyimide layer having a thickness of between 10 and 60 µm, and preferably of between 6 and 24 µm, on the layer 60 of silicon nitride, then baking the spin-on coated polyimide layer, then exposing the baked polyimide layer using a 1× stepper with at least two of G-line having a wavelength ranging from 434 to 438 nm, H-line having a wavelength ranging from 403 to 407 nm, and I-line having a wavelength ranging from 363 to 367 nm, illuminating the baked polyimide layer, that is, G-line and H-line, G-line and I-line, H-line and I-line, or G-line, H-line and I-line illuminate the baked polyimide layer, then developing the exposed polyimide layer, and then curing or heating the developed polyimide layer at a peak temperature of between 200 and 290° C., between 290 and 330° C. or between 330 and 400° C. for a time of between 30 minutes and 2 hours in a nitrogen ambient or in an oxygen-free ambient, the cured polyimide layer having a thickness of between 5 and 30 µm, and preferably between 3 and 12 µm, such that the polyimide layer can be patterned with an opening in the polyimide layer exposing the layer 44 of silicon nitride. Alternatively, the material of the polymer layer 64 may be benzocyclobutane (BCB), polyurethane, epoxy resin, a parylene-based polymer, a solder-mask material, an elastomer, or a porous dielectric material. For example, the polymer layer 64 may be a benzocyclobutane layer with a thickness of between 5 and 30 µm.

Referring to FIG. 6F, the layer 60 of silicon nitride, the layer 58 of silicon oxide, the layer 54 of silicon oxide and the layer 52 of silicon nitride under the opening 64a are sequentially removed with a dry etching method or a wet etching method, and preferably with an RIE process. Thereby, at least one opening 32a is formed in the passivation layer 32, exposing the metal trace 24.

Alternatively, the above-mentioned layer 52 of silicon nitride can be replaced by a layer of silicon oxynitride, that is, the layer of silicon oxynitride having a thickness of between 0.1 and 0.5 µm is formed on the metal trace 24 and on the silicon-containing dielectric layer 14, made of a layer of silicon nitride or silicon oxynitride, via a PECVD method, followed by forming the above-mentioned layer 54 of silicon oxide having a thickness of between 0.1 and 0.5 µm on the layer of silicon oxynitride via a PECVD method, followed by forming the above-mentioned SOG layer 56 on the layer 54 of silicon oxide, followed by mechanically polishing, chemically mechanically polishing (CMP) or etching back the SOG layer 56 until the layer 54 of silicon oxide over the metal layer 22 is exposed to the ambient, followed by forming the above-mentioned layer 58 of silicon oxide having a thickness of between 0.2 and 0.5 µm on the layer 54 of silicon oxide and on the SOG layer 56 via a PECVD method, followed by forming the above-mentioned layer 60 of silicon nitride having a thickness of between 0.5 and 1.5 µm on the layer 58 of silicon oxide via a PECVD method, followed by the above-mentioned steps as shown in FIGS. 6B-6D or followed by the above-mentioned steps as shown in FIGS. 6E and 6F.

Fifth Method for Forming the Passivation Layer 32 and/or the Opening 32a

Figure 7:
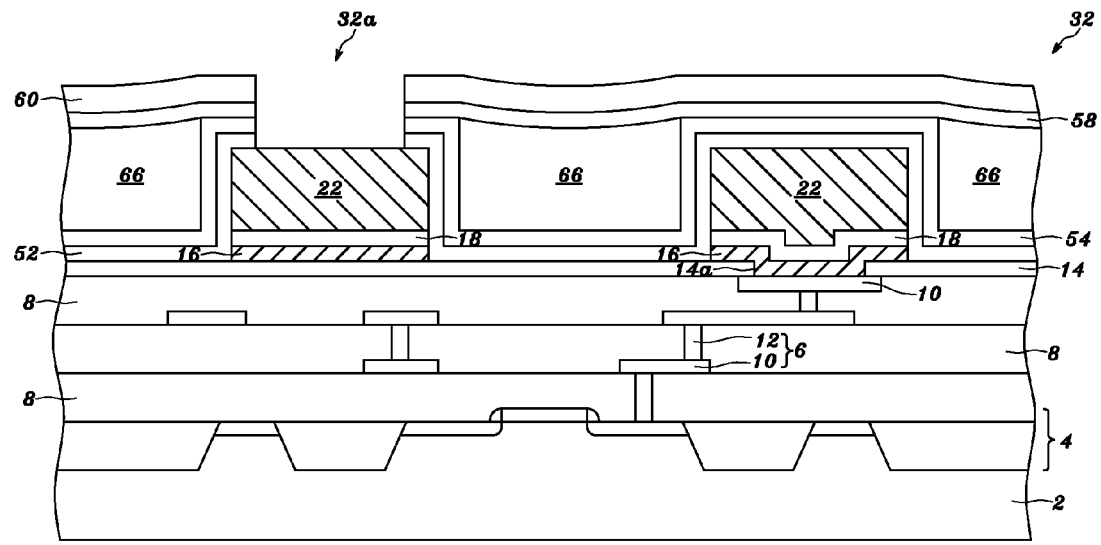
FIG. 7 is a sectional view schematically showing a process for forming a passivation layer and/or an opening in the passivation layer according to the present invention.

Referring to FIG. 7, a layer 52 of silicon nitride having a thickness of between 0.1 and 0.5 µm is formed on the metal trace 24 and on the silicon-containing dielectric layer 14, made of a layer of silicon nitride or silicon oxynitride, via a PECVD method, next a layer 54 of silicon oxide having a thickness of between 0.1 and 0.5 µm is formed on the layer 52 of silicon nitride via a PECVD method, next a polymer layer 66 is formed on the layer 54 of silicon oxide via spin coating process, next the polymer layer 66 is cured at a peak temperature of between 200 and 290° C., between 290 and 330° C. or between 330 and 400° C. for a time of between 30 minutes and 2 hours in nitrogen ambient or in oxygen-free ambient if the polymer layer 66 is polyimide, next the polymer layer 66 can be chemically mechanically polished (CMP), mechanically polished or etched back until the layer 54 of silicon oxide over the metal layer 22 is exposed to the ambient, next a layer 58 of silicon oxide having a thickness of between 0.2 and 0.5 µm is formed on the layer 54 of silicon oxide and on the polymer layer 66, and then a layer 60 of silicon nitride having a thickness of between 0.5 and 1.5 µm is formed on the layer 58 of silicon oxide via a PECVD method. Alternatively, the material of the polymer layer 66 may be benzocyclobu-tane (BCB), polyurethane, epoxy resin, a parylene-based polymer, a solder-mask material, an elastomer, or a porous dielectric material.

Thereby, the passivation layer 32 can be formed of the layer 52 of silicon nitride, the layer 54 of silicon oxide on the layer 52 of silicon nitride, the polymer layer 66 on the layer 54 of silicon oxide, the layer 58 of silicon oxide on the layer 54 of silicon oxide and on the polymer layer 66, and the layer 60 of silicon nitride on the layer 58 of silicon oxide. The method of forming at least one opening 32a in the passivation layer 32 can be referred to the above description concerning FIGS. 6B-6D or FIGS. 6E-6F.

Alternatively, the above-mentioned layer 52 of silicon nitride can be replaced by a layer of silicon oxynitride, that is, the layer of silicon oxynitride having a thickness of between 0.1 and 0.5 µm is formed on the metal trace 24 and on the silicon-containing dielectric layer 14, made of a layer of silicon nitride or silicon oxynitride, via a PECVD method, followed by forming the above-mentioned layer 54 of silicon oxide having a thickness of between 0.1 and 0.5 µm on the layer of silicon oxynitride via a PECVD method, followed by forming the above-mentioned polymer layer 66 on the layer 54 of silicon oxide, followed by mechanically polishing, chemically mechanically polishing (CMP) or etching back the polymer layer 66 until the layer 54 of silicon oxide over the metal layer 22 is exposed to the ambient, followed by forming the above-mentioned layer 58 of silicon oxide having a thickness of between 0.2 and 0.5 µm on the layer 54 of silicon oxide and on the polymer layer 66 via a PECVD method, followed by forming the above-mentioned layer 60 of silicon nitride having a thickness of between 0.5 and 1.5 µm on the layer 58 of silicon oxide via a PECVD method, followed by the above-mentioned steps as shown in FIGS. 6B-6D or followed by the above-mentioned steps as shown in FIGS. 6E and 6F.

Sixth Method for Forming the Passivation Layer 32 and/or the Opening 32a

Figure 8A:
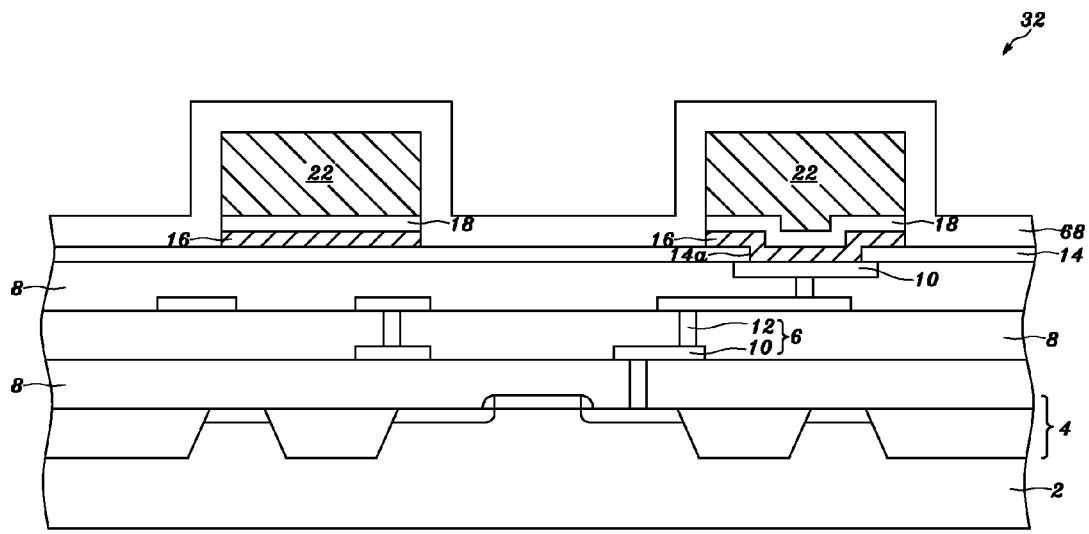
FIGS. 8A through 8F are sectional views schematically showing a process for forming a passivation layer and/or an opening in the passivation layer according to the present invention.

Referring to FIG. 8A, a layer 68 of silicon nitride having a thickness of between 0.5 and 1.5 µm is formed on the metal trace 24 and on the silicon-containing dielectric layer 14, made of a layer of silicon nitride or silicon oxynitride, via a PECVD method.

Thereby, the passivation layer 32 can be formed of the layer 68 of silicon nitride. Two methods for forming at least one opening 32a in the passivation layer 32 are described as below.

Figure 8B:
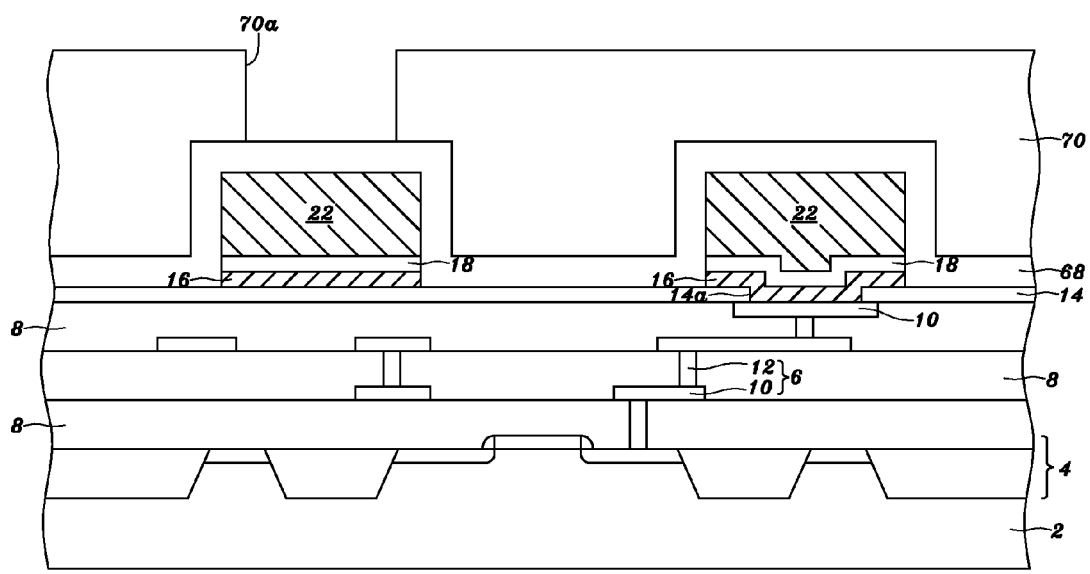
Figure 8C:
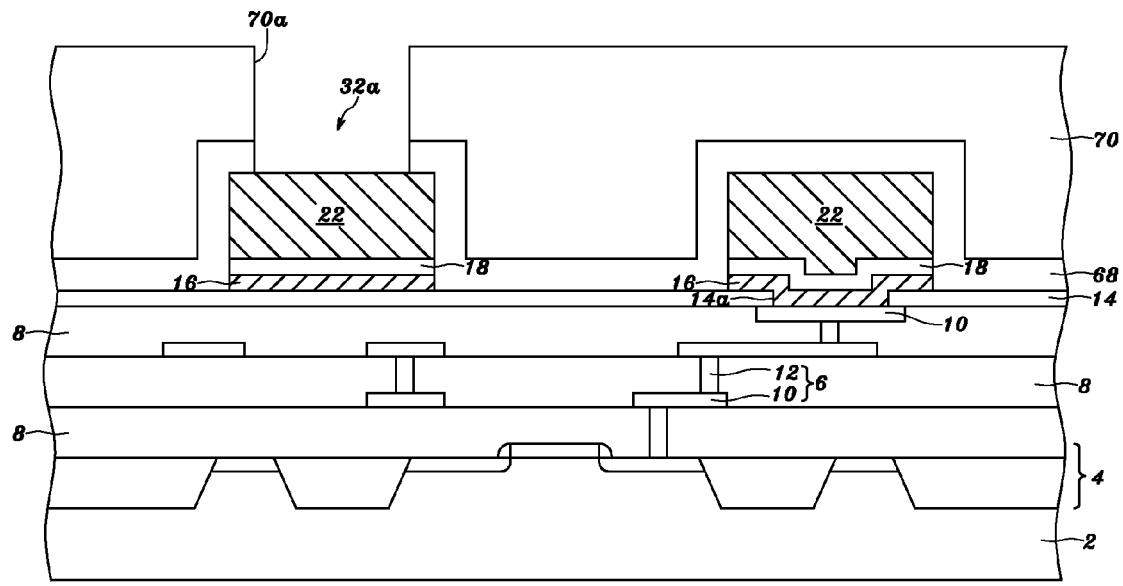
Figure 8D:
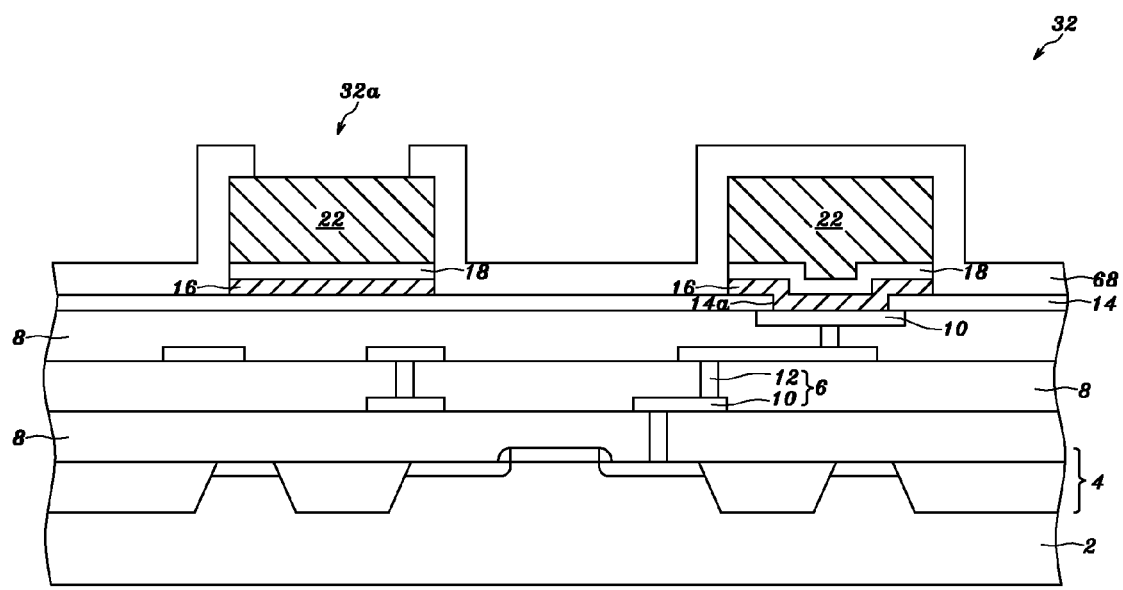

A first method for forming the opening 32a in the passivation layer 32 exposing the metal trace 24 is referred to as FIGS. 8B-8D. Referring to FIG. 8B, a photoresist layer 70 can be formed on the layer 68 of silicon nitride by a spin coating process or a lamination process. Next, the photoresist layer 70 is patterned with the processes of exposure, development, etc., to form at least one opening 70a in the photoresist layer 70 exposing the layer 68 of silicon nitride. A 1× stepper or 1× contact aligner can be used to expose the photoresist layer 70 during the process of exposure.

Referring to FIG. 8C, the layer 68 of silicon nitride under the opening 70a is removed with a dry etching method or a wet etching method, and preferably with an RIE process. Thereby, at least one opening 32a can be formed in the passivation layer 32, exposing the metal trace 24.

Referring to FIG. 8D, most of the photoresist layer 70 can be removed using an organic solution with amide. However, some residuals from the photoresist layer 70 or other contaminants could remain on the metal trace 24 and on the layer 68 of silicon nitride. Thereafter, the residuals and other contaminants can be removed from the metal trace 24 and from the layer 68 of silicon nitride with a plasma, such as an $O_2$ plasma or a plasma containing fluorine of below 200 PPM and oxygen. Alternatively, the photoresist layer 70 can be removed using an $O_2$ plasma or using a plasma containing fluorine of below 200 PPM and oxygen, without using an organic solution.

Figure 8E:
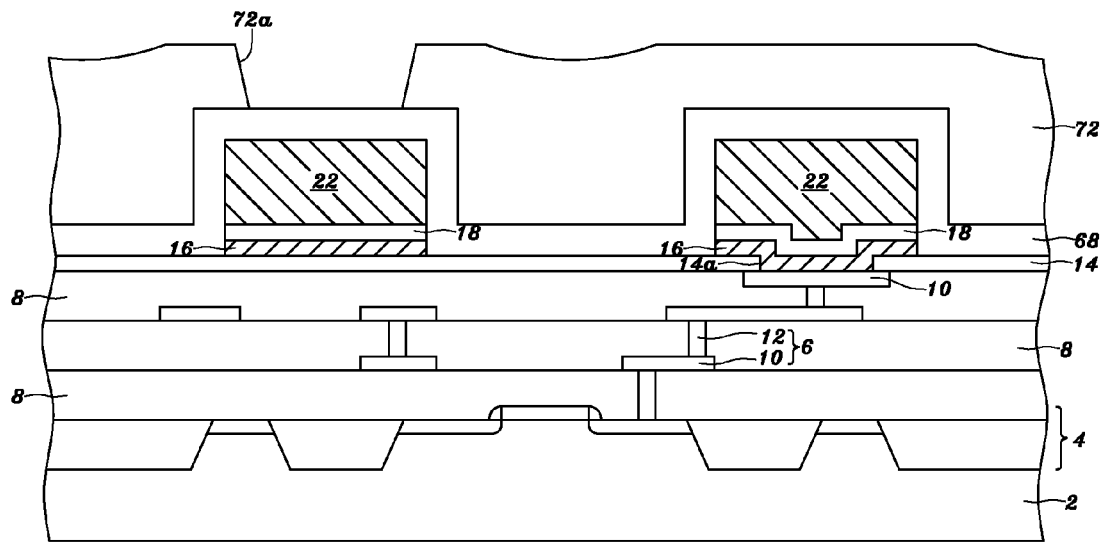
Figure 8F:
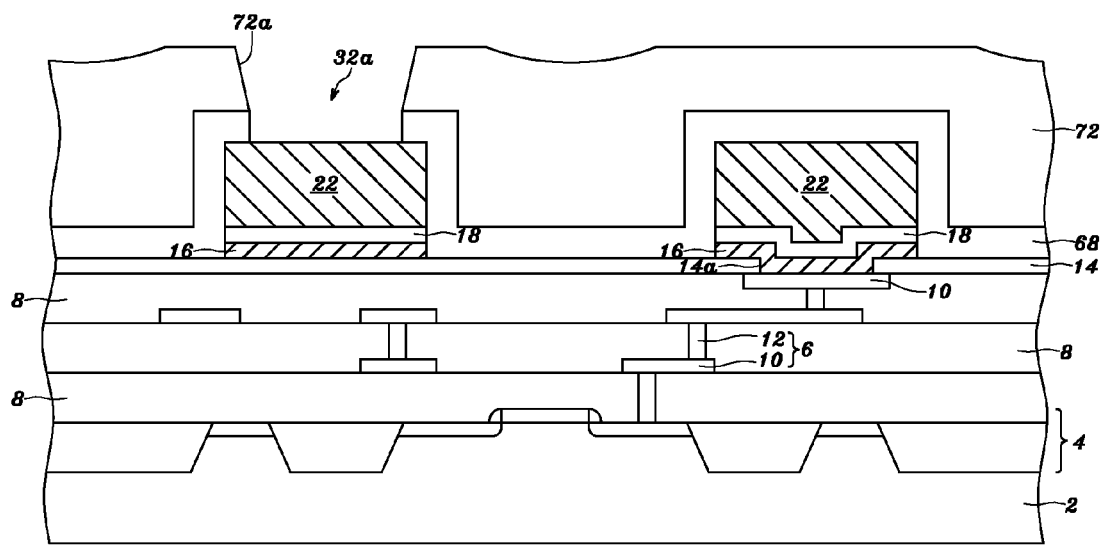

A second method for forming the opening 32a in the passivation layer 32 exposing the metal trace 24 is referred to as FIGS. 8E-8F. Referring to FIG. 8E, after the layer 68 of silicon nitride is formed, a positive-type photosensitive polymer layer 72 can be formed on the layer 68 of silicon nitride via spin coating process. Next, the polymer layer 72 is patterned with the processes of baking, exposure, development, etc., to form at least one opening 72a in the polymer layer 72 exposing the layer 68 of silicon nitride.

For example, the polymer layer 72 can be formed by spin-on coating a positive-type photosensitive polyimide layer having a thickness of between 10 and 60 µm, and preferably of between 6 and 24 µm, on the layer 68 of silicon nitride, then baking the spin-on coated polyimide layer, then exposing the baked polyimide layer using a 1× stepper with at least two of G-line having a wavelength ranging from 434 to 438 nm, H-line having a wavelength ranging from 403 to 407 nm, and I-line having a wavelength ranging from 363 to 367 nm, illuminating the baked polyimide layer, that is, G-line and H-line, G-line and I-line, H-line and I-line, or G-line, H-line and I-line illuminate the baked polyimide layer, then developing the exposed polyimide layer, and then curing or heating the developed polyimide layer at a peak temperature of between 200 and 290° C., between 290 and 330° C. or between 330 and 400° C. for a time of between 30 minutes and 2 hours in a nitrogen ambient or in an oxygen-free ambient, the cured polyimide layer having a thickness of between 5 and 30 µm, and preferably between 3 and 12 µm, such that the polyimide layer can be patterned with an opening in the polyimide layer exposing the layer 44 of silicon nitride. Alternatively, the material of the polymer layer 72 may be benzocyclobutane (BCB), polyurethane, epoxy resin, a parylene-based polymer, a solder-mask material, an elastomer, or a porous dielectric material. For example, the polymer layer 72 may be a benzocyclobutane layer with a thickness of between 5 and 30 µm.

Referring to FIG. 8F, the layer 68 of silicon nitride under the opening 72a is removed with a dry etching method or a wet etching method, and preferably with an RIE process. Thereby, at least one opening 32a is formed in the passivation layer 32, exposing the metal trace 24.

Thereby, the passivation layer 32 can be formed on the metal trace 24 shown in FIG. 2J and on the silicon-containing dielectric layer 14, made of a layer of silicon nitride or silicon oxynitride. The passivation layer 32 can protect the semiconductor devices 4, the circuit structure 6 and the metal trace 24 shown in FIG. 2J from being damaged by moisture and foreign ion contamination. In other words, Mobile ions (such as sodium ion), transition metals (such as gold, silver and copper) and impurities can be prevented from penetrating through the passivation layer 32 to the semiconductor devices 4, such as transistors, polysilicon resistor elements and polysilicon-polysilicon capacitor elements, to the circuit structure 6, and to the metal trace 24.

The opening 32a has a maximum transverse dimension of between 2 and 30 µm or between 30 and 300 µm. The shape of the opening 32a from a top view may be a circle, and the diameter of the circle-shaped opening 32a may be between 2 and 30 µm or between 30 and 300 µm. Alternatively, the shape of the opening 32a from a top view may be a square, and the greatest diagonal length of the square-shaped opening 32a may be between 2 and 30 µm or between 30 and 300 µm. Alternatively, the shape of the opening 32a from a top view may be a polygon, and the polygon-shaped opening 32a may have a greatest diagonal length of between 3 and 30 µm or between 30 and 300 µm. Alternatively, the shape of the opening 32a from a top view may also be a rectangle, and the rectangle-shaped opening 32a may have a width of between 2 and 40 µm.

The metal trace 24 may be an RDL (Re-Distribution Layer), and the position of the metal trace 24 exposed by the opening 32a is different from that of the metal layer 10 exposed by the opening 14a from a top perspective view.

Alternatively, the metal trace 24 may be an interconnecting metal trace, and at least two separate portions of the metal layer 10 exposed by at least two openings 14a can be connected via the metal trace 24. A method for forming the metal trace 24 as an interconnecting metal trace is described as below.

Figure 9A:
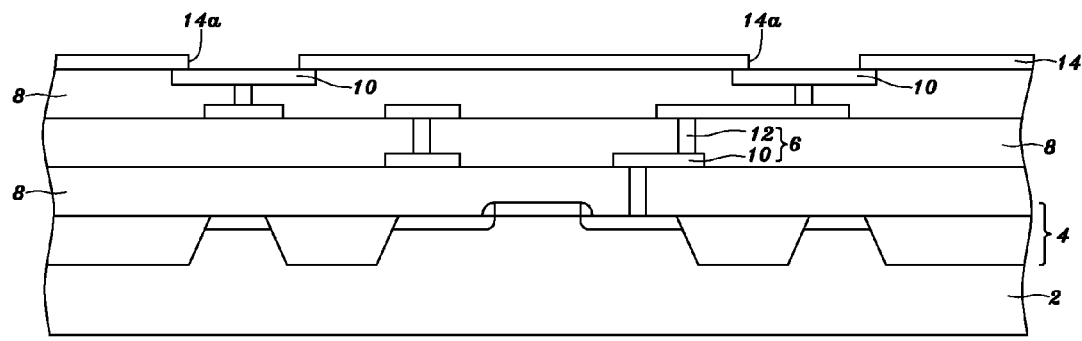
FIGS. 9A through 9G are sectional views showing a process according to one embodiment of the present invention.

Referring to FIG. 9A, the silicon-containing dielectric layer 14, made of a layer of silicon nitride or silicon oxynitride, is formed over the circuit structure 6 and over the dielectric layer 8, at least two openings 14a in the silicon-containing dielectric layer 14 exposing at least two separate portions of the metal layer 10 of the circuit structure 6, respectively. The steps of forming the silicon-containing dielectric layer 14 and the opening 14a can be referred to the above description concerning FIGS. 2A-2C.

Figure 9B:
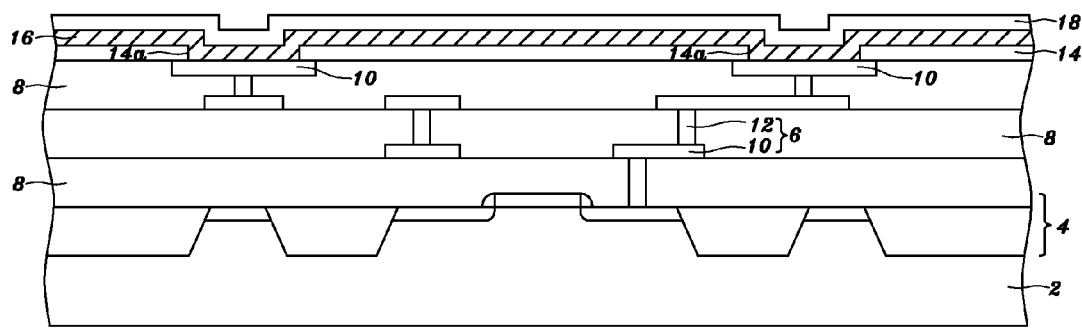

Referring to FIG. 9B, the adhesion/diffusion barrier layer 16 is formed on the silicon-containing dielectric layer 14 and on the two portions of the metal layer 10 exposed the two openings 14a. Next, the seed layer 18 is formed on the adhesion/diffusion barrier layer 16. The steps of forming the adhesion/diffusion barrier layer 16 and the seed layer 18 can be referred to the above description concerning FIGS. 2D-2E.

Figure 9C:
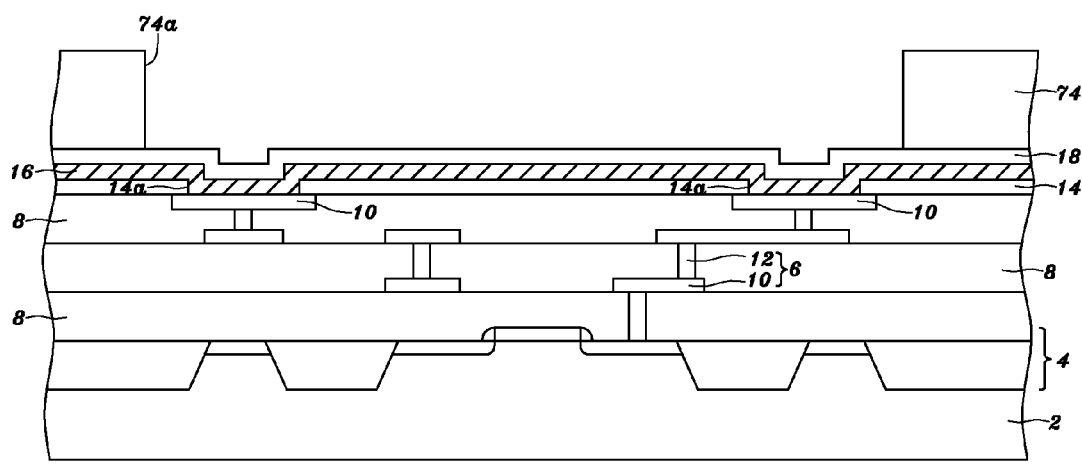

Referring to FIG. 9C, a photoresist layer 74 can be formed on the seed layer 18 by a spin coating process or a lamination process. Next, the photoresist layer 74 is patterned with the processes of exposure, development, etc., to form an opening 74a in the photoresist layer 74 exposing the seed layer 18. A 1× stepper or 1× contact aligner can be used to expose the photoresist layer 74 during the process of exposure. However, some residuals from the photoresist layer 74 or other contaminants could remain on the seed layer 18 exposed by the opening 74a after the process of development. Thereafter, the residuals or other contaminants can be removed with an $O_2$ plasma or a plasma containing fluorine of below 200 PPM and oxygen.

Figure 9D:
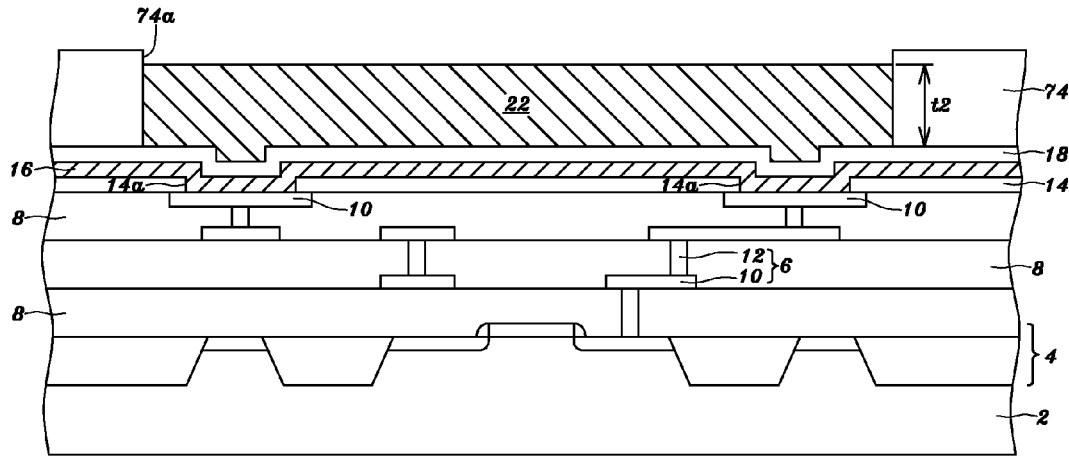

Referring to FIG. 9D, the metal layer 22 having a thickness t2 of between 5 and 25 µm can be formed on the seed layer 18 exposed by the opening 74a. The step of forming the metal layer 22 can be referred to the above description concerning FIG. 2H.

Figure 9E:
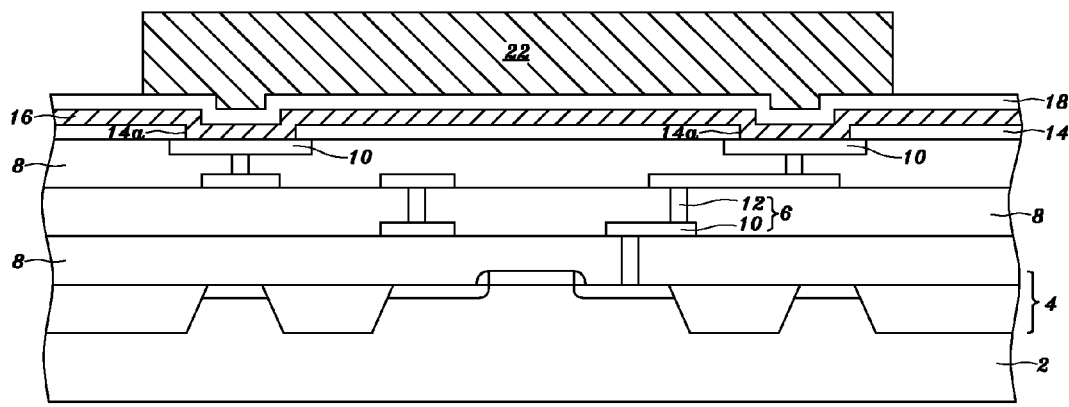

Referring to FIG. 9E, after the metal layer 22 is formed, most of the photoresist layer 74 can be removed using an organic solution with amide. However, some residuals from the photoresist layer 74 or other contaminants could remain on the metal layer 22 and on the seed layer 18. Thereafter, the residuals or other contaminants can be removed from the metal layer 22 and the seed layer 18 with a plasma, such as an $O_2$ plasma or a plasma containing fluorine of below 200 PPM and oxygen. Alternatively, the photoresist layer 74 can be removed using an $O_2$ plasma or using a plasma containing fluorine of below 200 PPM and oxygen, without using an organic solution.

Figure 9F:
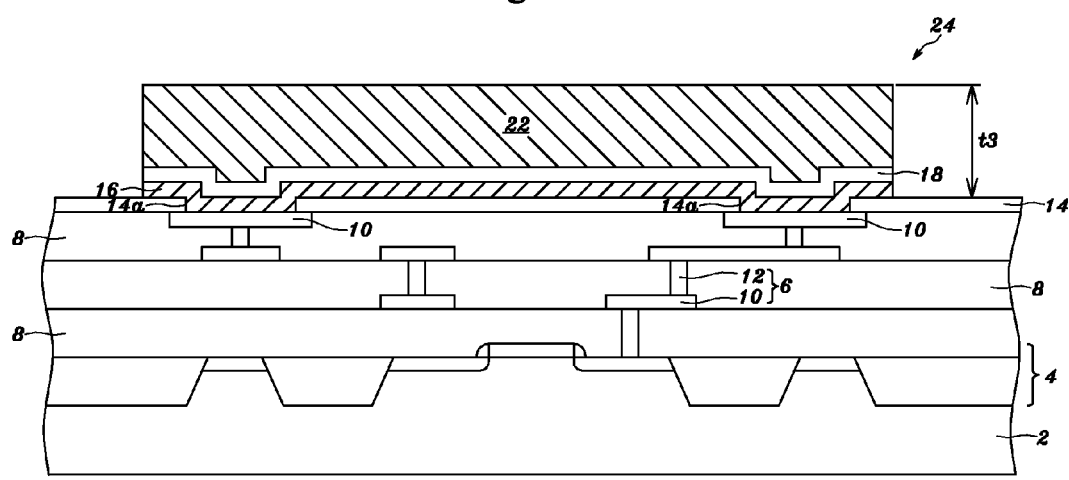

Referring to FIG. 9F, the seed layer 18 and the adhesion/diffusion barrier layer 16 not under the metal layer 22 are subsequently removed with a dry etching method or a wet etching method. The steps of removing the seed layer 18 and the adhesion/diffusion barrier layer 16 not under the metal layer 22 can be referred to the above description concerning FIG. 2J.

Thereby, in the present invention, the metal trace 24 is formed over the circuit structure 6 and over the dielectric layer 8, and the metal trace 24 connects the two or more separate portions of the metal layer 10 exposed by two or more openings 14a. The metal trace 24 having a thickness t3 of between 5 and 27 μm can be formed of the adhesion/diffusion barrier layer 16, the seed layer 18 on the adhesion/diffusion barrier layer 16 and the metal layer 22 on the seed layer 18.

Figure 9G:
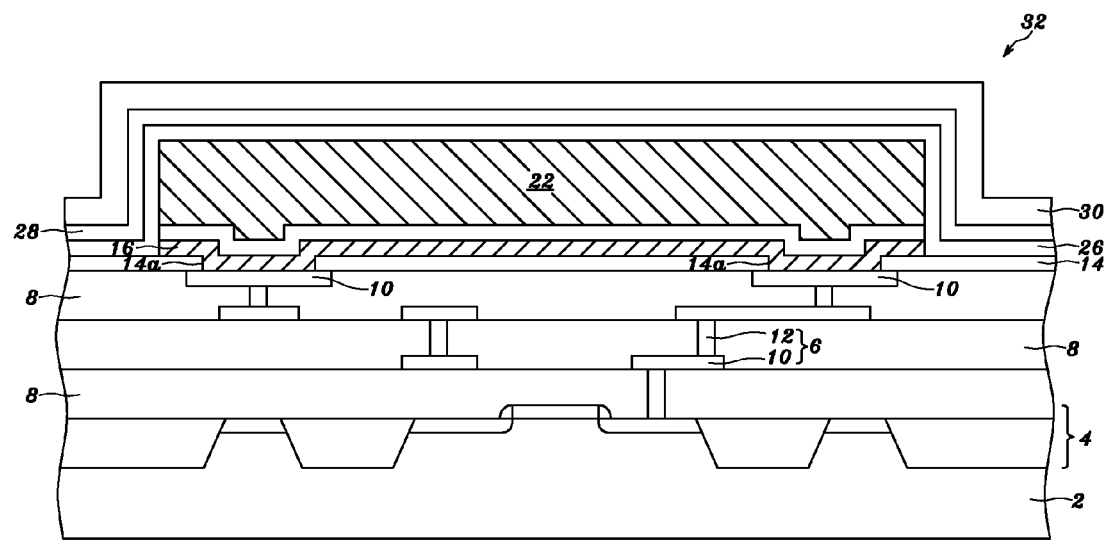

After the metal trace 24 is formed, the passivation layer 32 can be formed on the silicon-containing dielectric layer 14 and on the metal trace 24, at least one opening 32a in the passivation layer 32 exposing the metal trace 24. Alternatively, no opening 32a in the passivation layer 32 exposing the metal trace 24 is allowable. For example, referring to FIG. 9G, the passivation layer 32 is formed on the silicon-containing dielectric layer 14 and on the metal trace 24 via the first method for forming the passivation layer 32 and/or the opening 32a, which can be referred to the above description concerning FIGS. 3A-3F, and no opening 32a in the passivation layer 32 exposing the metal trace 24. The method of forming the passivation layer 32 and/or the opening 32a can be referred to the above description concerning six methods for forming the passivation layer 32 and/or the opening 32a, which can be referred to the above description concerning FIGS. 3A-3F, 4A-4F, 5, 6A-6F, 7 and 8A-8F.

Alternatively, at least opening 32a exposing the metal trace 24, as mentioned above, can be formed in the passivation layer 32. The metal trace 24 exposed by the opening 32a in the passivation layer 32 may be used to be connected with an external circuit. For example, the metal layer 22 of the metal trace 24 exposed by the opening 32a may have a wire (such as a gold wire or a copper wire) bonded thereon by a wire-bonding process, in connection with an external circuit. The external circuit may be a semiconductor chip, a printed circuit board (PCB) comprising a glass fiber as a core, a flexible tape with a polymer layer (such as polyimide) having a thickness of between 30 and 200 μm but without any polymer layer including glass fiber, a ceramic substrate comprising a ceramic material as insulating layers between circuit layers, a glass substrate having circuit layers made of Indium Tin Oxide (ITO), or a discrete passive device, such as inductor, capacitor, resistor or filter. Alternatively, the metal layer 22 of the metal trace 24 exposed by the opening 32a in the passivation layer 32 may have a tin-containing bump or gold bump formed thereover by an electroplating process, in connection with an external circuit.

Alternatively, in the present invention, a pad can be formed on the metal layer 10 of the circuit structure 6 exposed by the opening 14a according to the method of forming the metal trace 24. The passivation layer 32 can be formed on the pad and on the silicon-containing dielectric layer 14, according to the six methods for forming the passivation layer 32 and/or the opening 32a, an opening 32a in the passivation layer 32 exposing the pad.

Figure 10A:
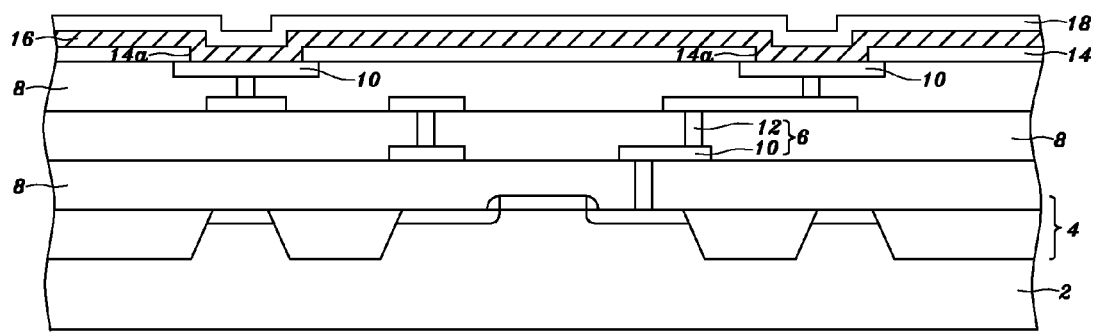
FIGS. 10A through 10F are sectional views showing a process according to one embodiment of the present invention.

Referring to FIG. 10A, the silicon-containing dielectric layer 14, made of a layer of silicon nitride or silicon oxynitride, is formed over the circuit structure 6 and over the dielectric layer 8, an opening 14a in the silicon-containing dielectric layer 14 exposing the metal layer 10 of the circuit structure 6. Next, the adhesion/diffusion barrier layer 16 is formed on the silicon-containing dielectric layer 14 and on the metal layer 10 exposed by the opening 14a. Next, the seed layer 18 is formed on the adhesion/diffusion barrier layer 16. The steps of forming the silicon-containing dielectric layer 14, the opening 14a, the adhesion/diffusion barrier layer 16 and the seed layer 18 can be referred to the above description concerning FIGS. 2A-2E.

Figure 10B:
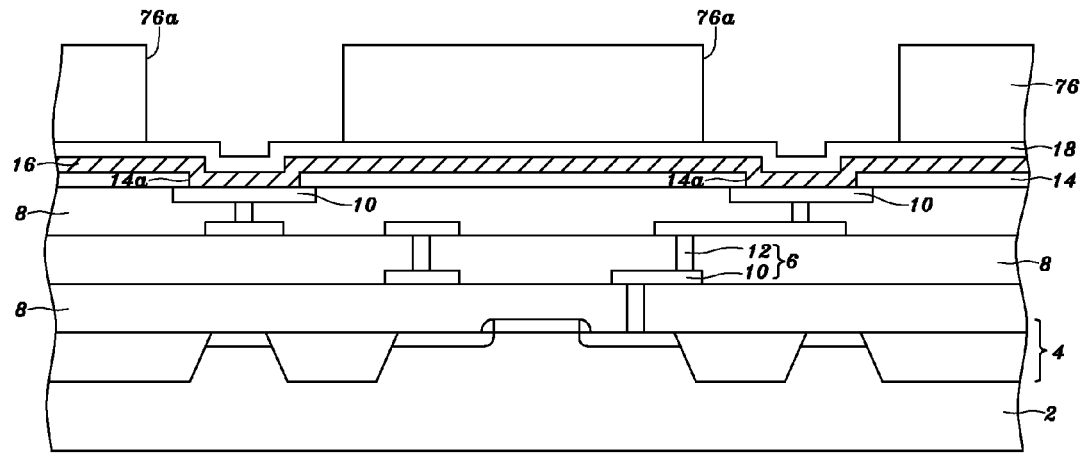

Referring to FIG. 10B, a photoresist layer 76 can be formed on the seed layer 18 by a spin coating process or a lamination process. Next, the photoresist layer 76 is patterned with the processes of exposure, development, etc., to form at least one opening 76a in the photoresist layer 76 exposing the seed layer 18. A 1× stepper or 1× contact aligner can be used to expose the photoresist layer 76 during the process of exposure. However, some residuals from the photoresist layer 76 and other contaminants could remain on the seed layer 18 exposed by the opening 76a after the process of development. Thereafter, the residuals and other contaminants can be removed with an $O_2$ plasma or a plasma containing fluorine of below 200 PPM and oxygen.

Figure 10C:
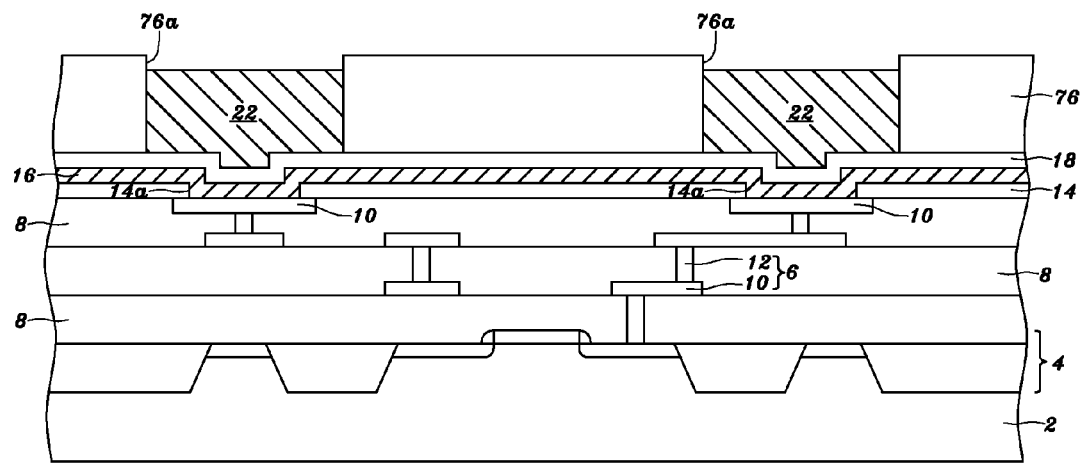

Referring to FIG. 10C, the metal layer 22 having a thickness of between 5 and 25 μm can be formed on the seed layer 18 exposed by the opening 76a. The step of forming the metal layer 22 can be referred to the above description concerning FIG. 2H.

Figure 10D:
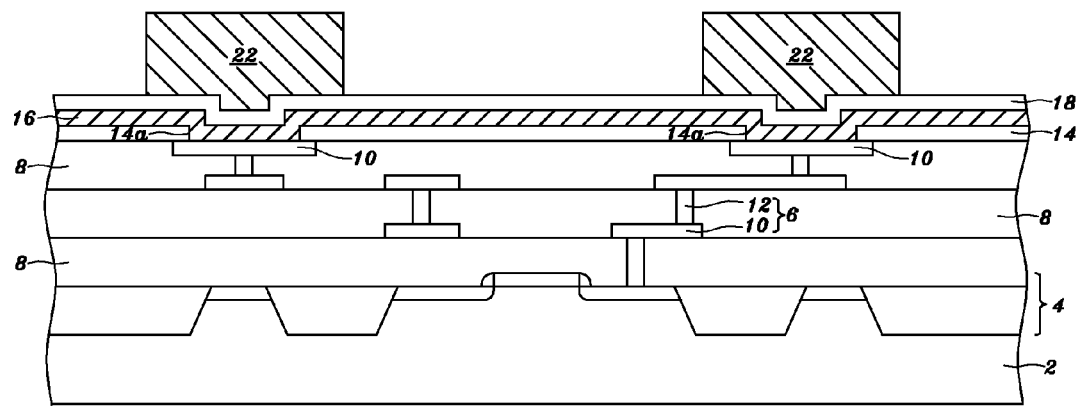

Referring to FIG. 10D, after the metal layer 22 is formed, most of the photoresist layer 76 can be removed using an organic solution with amide. However, some residuals from the photoresist layer 76 could remain on the metal layer 22 and on the seed layer 18. Thereafter, the residuals can be removed from the metal layer 22 and the seed layer 18 with a plasma, such as an $O_2$ plasma or a plasma containing fluorine of below 200 PPM and oxygen. Alternatively, the photoresist layer 76 can be removed using an $O_2$ plasma or using a plasma containing fluorine of below 200 PPM and oxygen, without using an organic solution.

Figure 10E:
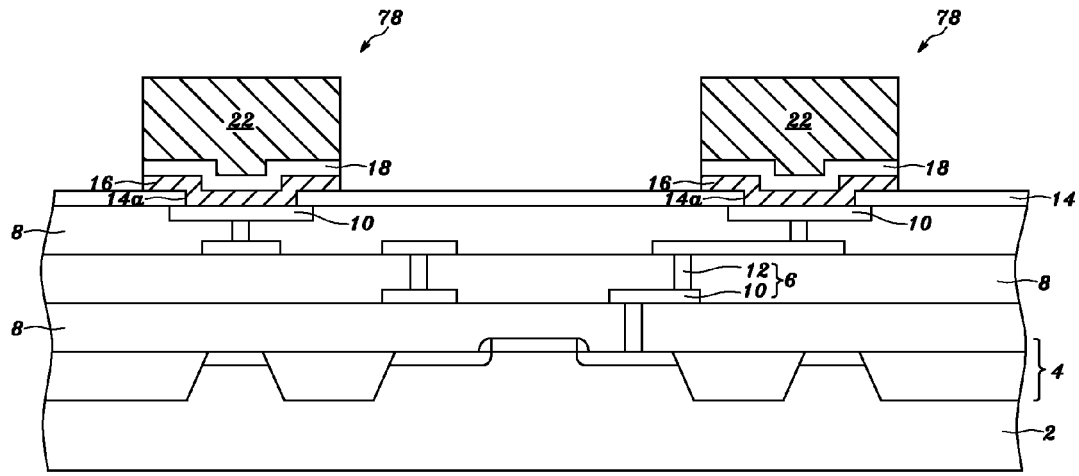

Referring to FIG. 10E, the seed layer 18 and the adhesion/diffusion barrier layer 16 not under the metal layer 22 are subsequently removed with a dry etching method or a wet etching method. The steps of removing the seed layer 18 and the adhesion/diffusion barrier layer 16 not under the metal layer 22 can be referred to the above description concerning FIG. 2J.

Thereby, in the present invention, a pad 78 can be formed on the metal layer 10 of circuit structure 6 exposed by the opening 14a. The pad 78 having a thickness of between 5 and 27 μm can be formed of the adhesion/diffusion barrier layer 16, the seed layer 18 on the adhesion/diffusion barrier layer 16 and the metal layer 22 on the seed layer 18.

Figure 10F:
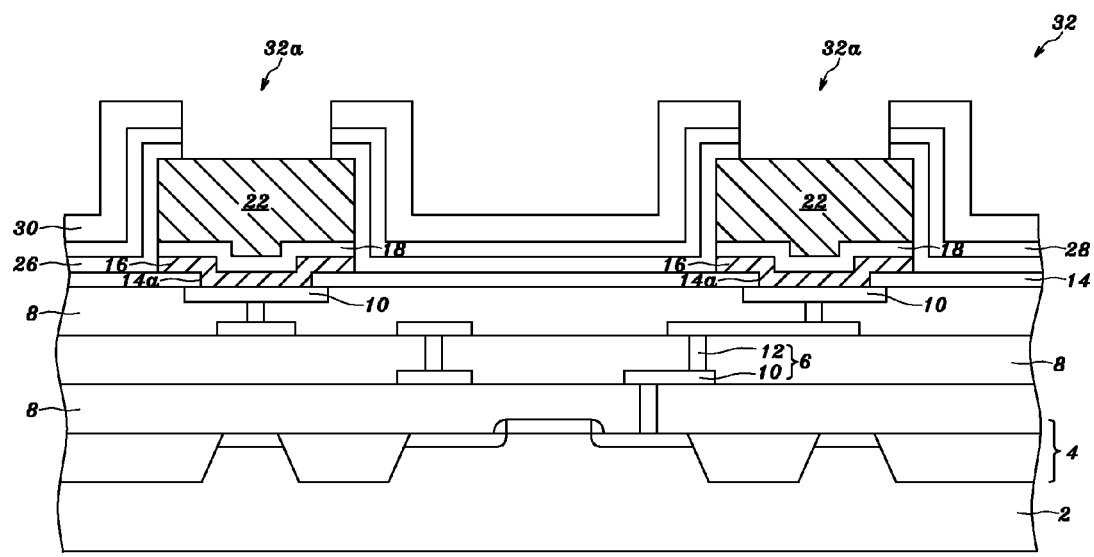

After the pad 78 is formed, the passivation layer 32 can be formed on the silicon-containing dielectric layer 14 and on the pad 78, an opening 32a in the passivation layer 32 exposing the pad 78. The method of forming the passivation layer 32 and the opening 32a can be referred to the above description concerning six methods for forming the passivation layer 32 and/or the opening 32a, which can be referred to the above description concerning FIGS. 3A-3F, 4A-4F, 5, 6A-6F, 7 and 8A-8F. Referring to FIG. 10F, the passivation layer 32 is formed on the silicon-containing dielectric layer 14 and on the pad 78 by the first method for forming the passivation layer 32 and/or the opening 32a, which can be referred to the above description concerning FIGS. 3A-3F, and an opening 32a in the passivation layer 32 exposing the pad 78.

The pad 78 exposed by the opening 32a may be used to be connected with an external circuit. For example, the pad 78 exposed by the opening 32a may have a wire (such as a gold wire or a copper wire) bonded thereon by a wire-bonding process, in connection with an external circuit. Alternatively, the pad 78 exposed by the opening 32a may have a tin-containing layer formed thereover, in connection with an external circuit. Alternatively, the pad 78 exposed by the opening 32*a* may have a metal bump, such as a gold bump, formed thereover, in connection with an external circuit. The external circuit may be a semiconductor chip, a printed circuit board (PCB) comprising a glass fiber as a core, a flexible tape with a polymer layer (such as polyimide) having a thickness of between 30 and 200 μm but without any polymer layer including glass fiber, a ceramic substrate comprising a ceramic material as insulating layers between circuit layers, a glass substrate having circuit layers made of Indium Tin Oxide (ITO), or a discrete passive device, such as inductor, capacitor, resistor or filter.

After the above-mentioned processes of forming the passivation layer 32 and/or the opening 32 have been completed, three processes may be proceeding as described below.

First Process

After the above-mentioned processes of forming the passivation layer 32 and/or the opening 32, a semiconductor wafer is completed. Next, the semiconductor wafer can be diced into a plurality of individual integrated circuit (IC) chips, semiconductor chips. Via a wire-bonding process, one end of a wire (made of gold, copper or aluminum) can be ball bonded with the metal trace 24 exposed by the opening 32*a* of a IC chip. The other end of the wire can be wedge bonded with an aluminum layer provided by a pad of another semiconductor chip, a pad over another semiconductor substrate, or a pad over a silicon substrate. Alternatively, the other end of the wire can be wedge bonded with a gold layer provided by a pad of another semiconductor chip, a pad over another semiconductor substrate, a pad over an organic substrate, a pad over a ceramic substrate, a pad over a silicon substrate, a pad over a glass substrate, or a pad over a flexible film comprising a polymer layer with a thickness of between 30 and 200 μm. Alternatively, the other end of the wire can be wedge bonded with a copper layer provided by a pad of another semiconductor chip, a pad over another semiconductor substrate, a pad over an organic substrate, a pad over a ceramic substrate, a pad over a silicon substrate, a pad over a glass substrate, or a pad over a flexible film comprising a polymer layer with a thickness of between 30 and 200 μm. Alternatively, the other end of the wire can be wedge bonded with an inner lead (made of copper) of a lead frame.

In the present invention, the strength of bonding the wire to the metal trace 24 exposed by the opening 32*a* of a chip may ranges from 100 to 1000 mN, from 200 to 1000 mN, or from 200 to 500 mN. After the wire-bonding process is completed, a polymeric material, such as epoxy or polyimide, can be formed to cover the wire.

Besides, the metal trace 24 may be a RDL (Re-Distribution Layer). From a top perspective view, the position of the metal trace 24 bonded with the wire may be different from that of a portion of the metal layer 10 connected to the metal trace 24 through the opening 14*a*.

Second Process

After the above-mentioned processes of forming the passivation layer 32 and/or the opening 32 have been completed, another metal trace can be formed on the passivation layer 32 and connected to the metal traces 24 exposed by the opening 32*a*. In this embodiment of FIGS. 11A-11F, the passivation layer 32 comes from the above-mentioned first method for forming the passivation layer 32 and/or the opening 32*a*, which can be referred to the above description concerning FIGS. 3A-3F. Alternatively, other kinds of passivation layer 32, referred to the above description concerning FIGS. 4A-4F, 5, 6A-6F, 7 and 8A-8F, can be formed over the metal traces 24 and the silicon-containing layer 24.

Figure 11A:
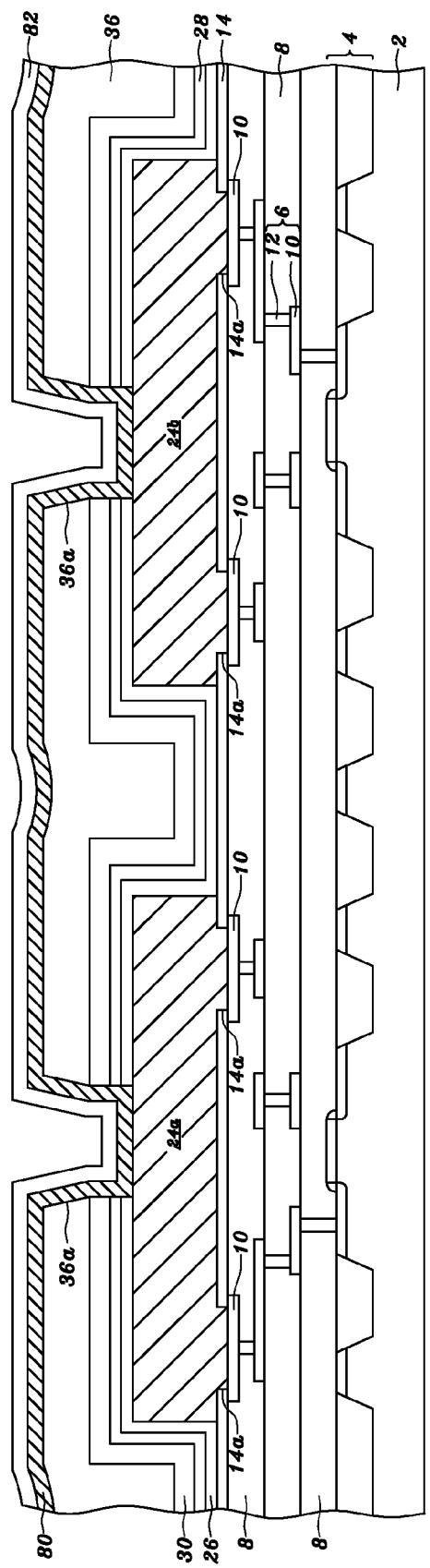
FIGS. 11A through 11F are sectional views showing a process according to one embodiment of the present invention.

Referring to FIG. 11A, an adhesion/barrier layer 80 having a thickness of between 2,000 and 5,000 angstroms, and preferably between 2,500 and 3,500 angstroms, is formed on the polymer layer 36 and on at least two interconnecting metal traces 24*a* and 24*b* exposed by at least two openings 36*a*, respectively. The material of the adhesion/barrier layer 80 may include titanium, tungsten, cobalt, nickel, titanium nitride, a titanium-tungsten alloy, a nickel-vanadium alloy, aluminum, chromium, copper, gold, protactinium, platinum, palladium, ruthenium, rhodium, silver, or a composite of the abovementioned materials. The adhesion/barrier layer 80 may be formed by a sputtering method or a vapor deposition method.

For example, the adhesion/barrier layer 80 can be formed by sputtering a titanium layer with a thickness of between 2,000 and 5,000 angstroms, and preferably between 2,500 and 3,500 angstroms, on the polymer layer 36 and on the copper layer of two interconnecting metal traces 24*a* and 24*b* exposed by two openings 36*a*, respectively. Alternatively, the adhesion/barrier layer 80 can be formed by sputtering a titanium layer with a thickness of between 2,000 and 5,000 angstroms, and preferably between 2,500 and 3,500 angstroms, on the polymer layer 36 and on the nickel layer of two interconnecting metal traces 24*a* and 24*b* exposed by two openings 36*a*, respectively. Alternatively, the adhesion/barrier layer 80 can be formed by sputtering a titanium layer with a thickness of between 2,000 and 5,000 angstroms, and preferably between 2,500 and 3,500 angstroms, on the polymer layer 36 and on the gold layer of two interconnecting metal traces 24*a* and 24*b* exposed by two openings 36*a*, respectively. Alternatively, the adhesion/barrier layer 80 can be formed by sputtering a titanium-tungsten-alloy layer with a thickness of between 2,000 and 5,000 angstroms, and preferably between 2,500 and 3,500 angstroms, on the polymer layer 36 and on the copper layer of two interconnecting metal traces 24*a* and 24*b* exposed by two openings 36*a*, respectively. Alternatively, the adhesion/barrier layer 80 can be formed by sputtering a titanium-tungsten-alloy layer with a thickness of between 2,000 and 5,000 angstroms, and preferably between 2,500 and 3,500 angstroms, on the polymer layer 36 and on the nickel layer of two interconnecting metal traces 24*a* and 24*b* exposed by two openings 36*a*, respectively. Alternatively, the adhesion/barrier layer 80 can be formed by sputtering a titanium-tungsten-alloy layer with a thickness of between 2,000 and 5,000 angstroms, and preferably between 2,500 and 3,500 angstroms, on the polymer layer 36 and on the gold layer of two interconnecting metal traces 24*a* and 24*b* exposed by two openings 36*a*, respectively.

Next, a seed layer 82 having a thickness of 500 and 2,000 angstroms, and preferably between 750 and 1,500 angstroms, is formed on the adhesion/barrier layer 80. The seed layer 82 may be formed by a sputtering method, a vapor deposition method, an electroless plating method or a PVD (Physical Vapor Deposition) method. The seed layer 82 is beneficial to electroplating a metal layer thereon. Thus, the material of the seed layer 82 varies with the material of the electroplated metal layer formed on the seed layer 82. When a gold layer is to be electroplated on the seed layer 82, gold (Au) is a preferable material to the seed layer 82. When a copper layer is to be electroplated on the seed layer 82, copper (Cu) is a preferable material to the seed layer 82. When a palladium layer is to be electroplated on the seed layer 82, palladium (Pd) is a preferable material to the seed layer 82. When a platinum layer is to be electroplated on the seed layer 82, platinum (Pt) is a preferable material to the seed layer 82. When a rhodium layer is to be electroplated on the seed layer 82, rhodium (Rh)

is a preferable material to the seed layer 82. When a ruthenium layer is to be electroplated on the seed layer 82, ruthenium (Ru) is a preferable material to the seed layer 82. When a rhenium layer is to be electroplated on the seed layer 82, rhenium (Re) is a preferable material to the seed layer 82. When a nickel layer is to be electroplated on the seed layer 82, nickel (Ni) is a preferable material to the seed layer 82.

For example, when the adhesion/barrier layer 80 is formed by sputtering a titanium layer with a thickness of between 2,000 and 5,000 angstroms, and preferably between 2,500 and 3,500 angstroms, the seed layer 82 can be formed by sputtering a gold layer with a thickness of between 500 and 2,000 angstroms, and preferably between 750 and 1,500 angstroms, on the titanium layer. When the adhesion/barrier layer 80 is formed by sputtering a layer of titanium-tungsten alloy with a thickness of between 2,000 and 5,000 angstroms, and preferably between 2,500 and 3,500 angstroms, the seed layer 82 can be formed by sputtering a gold layer with a thickness of between 500 and 2,000 angstroms, and preferably between 750 and 1,500 angstroms, on the layer of titanium-tungsten alloy. When the adhesion/barrier layer 80 is formed by sputtering a titanium layer with a thickness of between 2,000 and 5,000 angstroms, and preferably between 2,500 and 3,500 angstroms, the seed layer 82 can be formed by sputtering a copper layer with a thickness of between 500 and 2,000 angstroms, and preferably between 750 and 1,500 angstroms, on the titanium layer. When the adhesion/barrier layer 80 is formed by sputtering a layer of titanium-tungsten alloy with a thickness of between 2,000 and 5,000 angstroms, and preferably between 2,500 and 3,500 angstroms, the seed layer 82 can be formed by sputtering a copper layer with a thickness of between 500 and 2,000 angstroms, and preferably between 750 and 1,500 angstroms, on the layer of titanium-tungsten alloy.

Figure 11B:
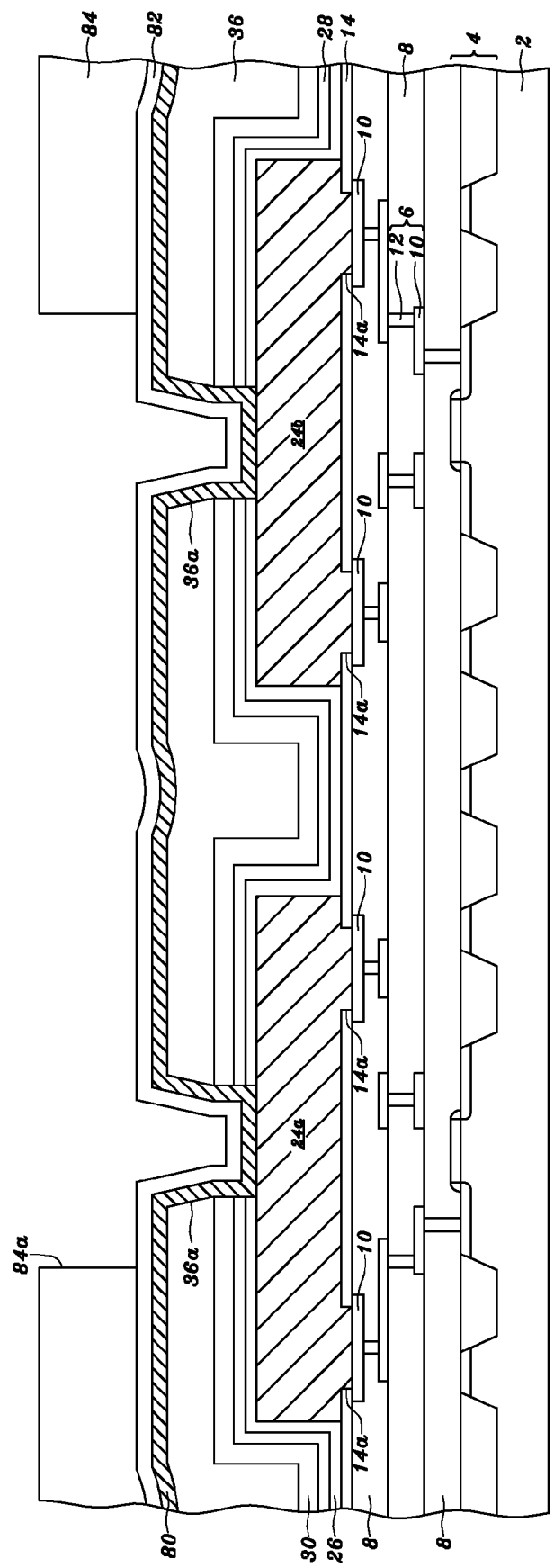

Referring to FIG. 11B, a photoresist layer 84 is formed on the seed layer 82. Next, the photoresist layer 84 is patterned with the processes of exposure, development, etc., to form an opening 84a in the photoresist layer 84 exposing the seed layer 82 over the polymer layer 36 and over the interconnecting metal traces 24a and 24b.

The photoresist layer 84 can be formed by spin-on coating a positive-type photosensitive polymer layer having a thickness of between 5 and 30 µm, and preferably of between 7 and 15 µm, on the seed layer 82, then exposing the photosensitive polymer layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H-line and Mine, or G-line, H-line and I-line illuminate the photosensitive polymer layer, then developing the exposed polymer layer, and then removing the residual polymeric material or other contaminants on the seed layer 82 with an $O_2$ plasma or a plasma containing fluorine of below 200 PPM and oxygen, such that the photoresist layer 84 can be patterned with an opening 84a in the photoresist layer 84 exposing the seed layer 82.

Figure 11C:
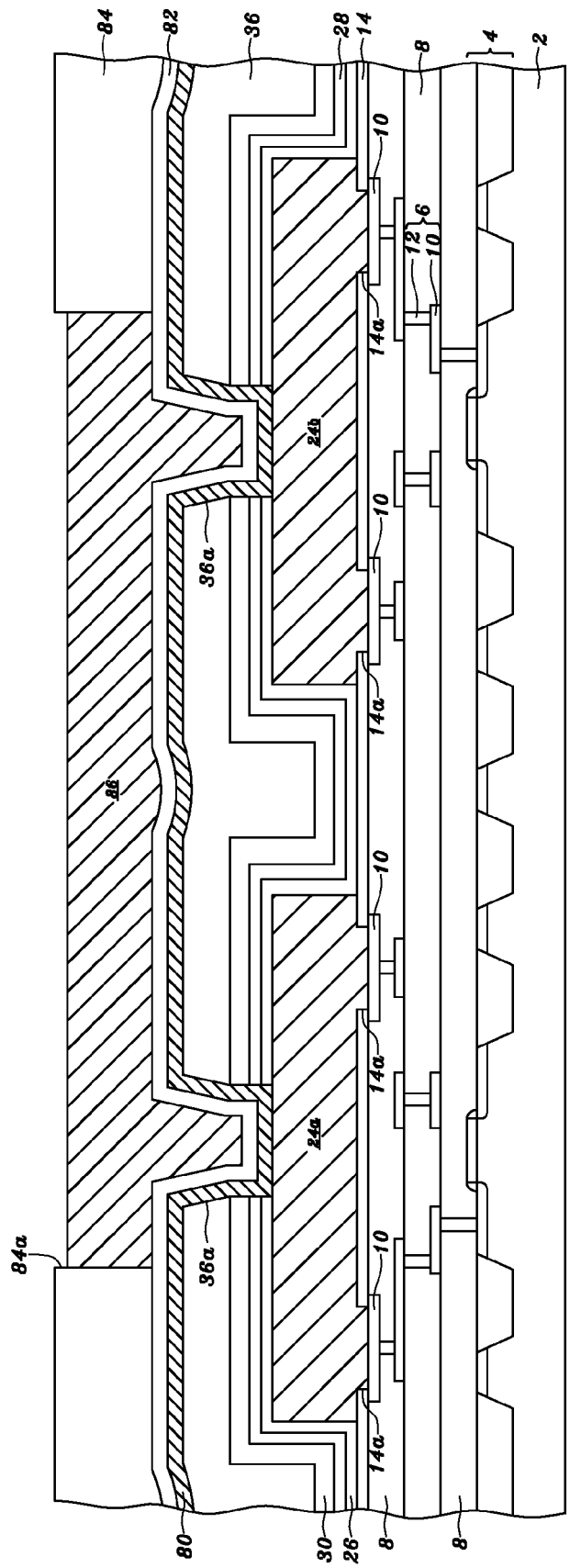

Referring to FIG. 11C, a metal layer 86 having a thickness of between 1 and 200 µm or between 1 and 50 µm is electroplated on the seed layer 82 exposed by the opening 84a. The thickness of the metal layer 86 is preferred to be between 2 and 30 µm. The metal layer 86 may be a single layer made of gold, copper, silver, palladium, platinum, rhodium, ruthenium, rhenium, or nickel. The metal layer 86 may also be a composite layer made of the abovementioned metals. Alternatively, the metal layer 86 may be formed by an electroless plating method.

For example, the metal layer 86 may be formed by electroplating a gold layer with a thickness of between 2 and 35 µm on the seed layer 82 made of gold. Alternatively, the metal layer 86 may be formed by electroplating a copper layer with a thickness of between 2 and 35 µm on the seed layer 82 made of copper. Alternatively, the metal layer 86 may be formed by electroplating a copper layer with a thickness of between 2 and 35 µm on the seed layer 82 made of copper, next electroplating a nickel layer with a thickness of between 0.1 and 10 µm, and preferably between 0.1 and 5 µm, on the copper layer, and then electroplating a gold layer with a thickness of between 0.01 and 10 µm, and preferably between 0.1 and 2 µm, on the nickel layer.

Figure 11D:
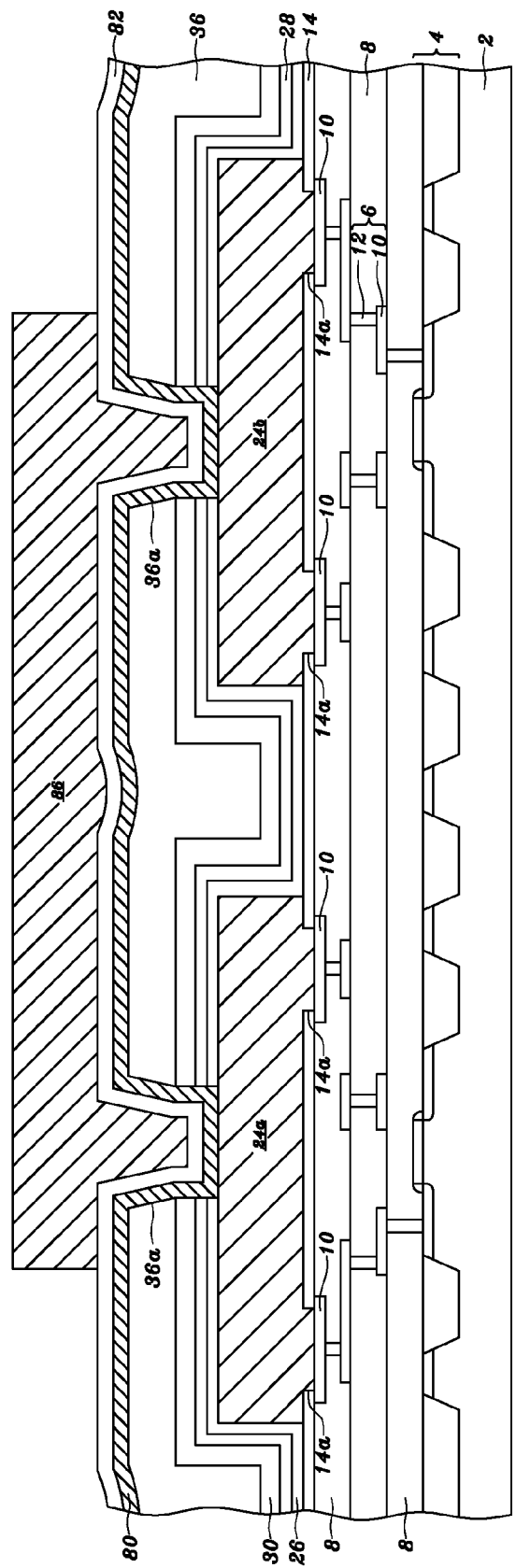

Referring to FIG. 11D, after the metal layer 86 is formed, most of the photoresist layer 84 can be removed using an organic solution with amide. However, some residuals from the photoresist layer 84 and other contaminants could remain on the metal layer 86 and on the seed layer 82. Thereafter, the residuals and other contaminants can be removed from the metal layer 86 and the seed layer 82 with a plasma, such as an $O_2$ plasma or a plasma containing fluorine of below 200 PPM and oxygen.

Figure 11E:
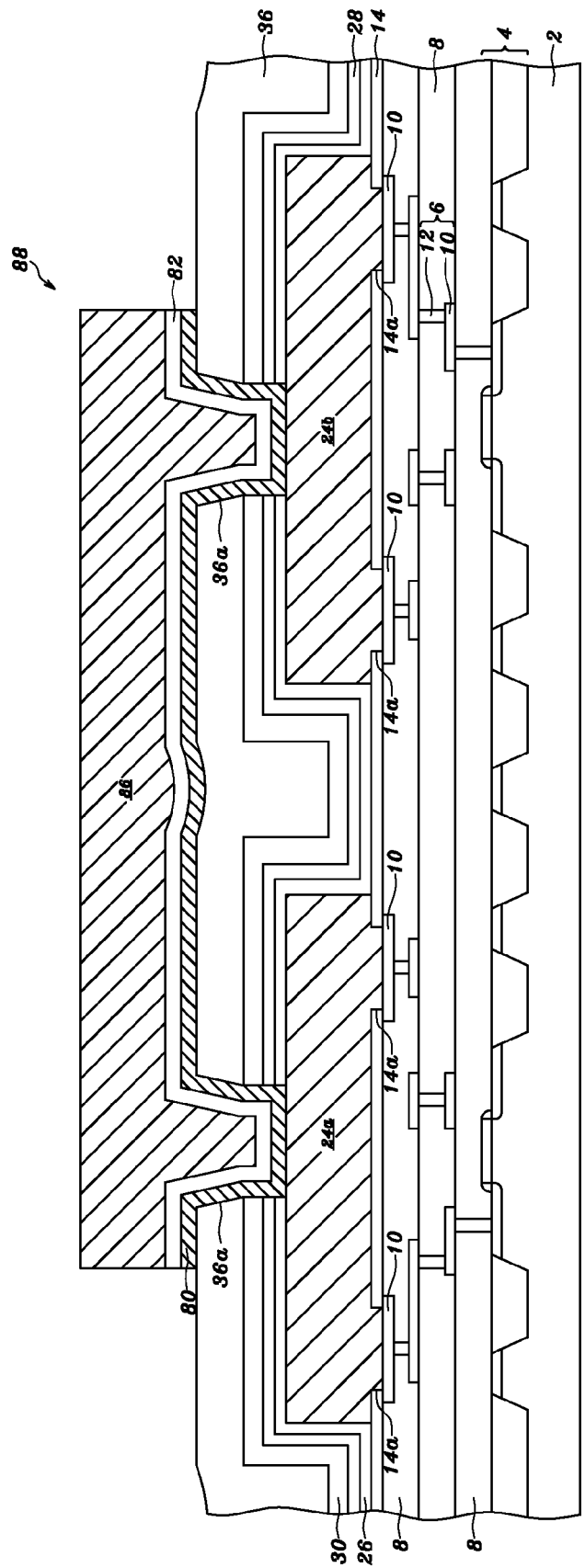

Referring to FIG. 11E, the seed layer 82 and the adhesion/barrier layer 80 not under the metal layer 86 are subsequently removed. For example, the seed layer 82 and the adhesion/barrier layer 80 not under the metal layer 86 are removed with a dry etching method or a wet etching method. As to the wet etching method, when the adhesion/barrier layer 80 is a titanium-tungsten-alloy layer, it can be etched with a solution containing hydrogen peroxide; when the adhesion/barrier layer 80 is a titanium layer, it can be etched with a solution containing hydrogen fluoride; when the seed layer 82 is a gold layer, it can be etched with an iodine-containing solution, such as a solution containing potassium iodide. As to the dry etching methods, when the adhesion/barrier layer 80 is a titanium layer or a titanium-tungsten-alloy layer, it can be etched with a chlorine-containing plasma etching process; when the seed layer 82 is a gold layer, it can be removed with an argon sputter process. Generally, the dry etching method to etch the seed layer 82 and the adhesion/barrier layer 80 not under the metal layer 86 may include a chemical plasma etching process, a physical vapor etching process, such as an argon sputter process, or a chemical vapor etching process.

Thereby, in the present invention, a metal trace 88 can be formed on the polymer layer 36 and on the interconnecting metal traces 24a and 24b exposed by the openings 36a, connecting the interconnecting metal traces 24a and 24b. The metal trace 88 can be formed of the adhesion/barrier layer 80, the seed layer 82 on the adhesion/barrier layer 80 and the electroplated metal layer 86 on the seed layer 82.

Figure 11F:
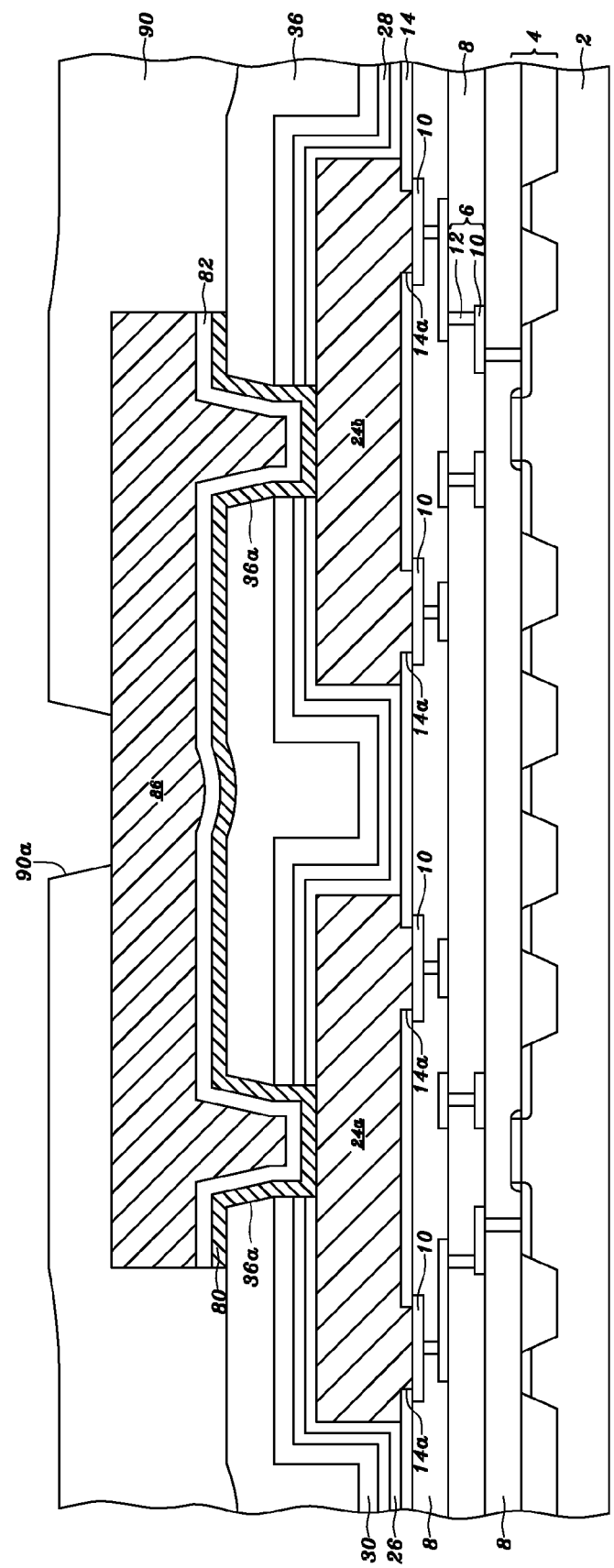

Referring to FIG. 11F, after the seed layer 82 and the adhesion/barrier layer 80 not under the metal layer 86 have been removed, a polymer layer 90 can be optionally formed on the metal layer 86 and on the polymer layer 36, at least one opening 90a in the polymer layer 90 exposing the metal layer 86 of the metal trace 88. The material of the polymer layer 90 may include polyimide, benzocyclobutane, polyurethane, epoxy resin, a parylene-based polymer, a solder-mask material, an elastomer, or a porous dielectric material. The polymer layer 90 has a thickness of between 2 and 30 µm. In a preferred case, the polymer layer 90 has a thickness of between 3 and 12 µm.

The polymer layer 90 can be formed by a spin-on coating process, a process for thermally pressing a dry film on the metal layer 86 of the metal trace 88 and on the polymer layer 36, or a screen-printing process. Below, the process of forming a patterned polymer layer 90 is exemplified with the case of spin-on coating a polyimide layer on the metal layer 86 of the metal trace 88 and on the polymer layer 36, and then patterning the polyimide layer. Alternatively, the polymer layer 90 can be formed by spin-on coating a layer of benzocyclobutane, polyurethane, epoxy resin, a parylene-based polymer, a solder-mask material, an elastomer or a porous dielectric material on the metal layer 86 of the metal trace 88 and on the polymer layer 36, and then patterning the layer.

In a first method, the polymer layer 90 can be formed by spin-on coating a positive-type photosensitive polyimide layer having a thickness of between 4 and 60 μm, and preferably of between 6 and 24 μm, on the metal layer 86 of the metal trace 88 and on the polymer layer 36, then baking the spin-on coated polyimide layer, then exposing the baked polyimide layer using a 1× stepper with at least two of G-line having a wavelength ranging from 434 to 438 nm, H-line having a wavelength ranging from 403 to 407 nm, and I-line having a wavelength ranging from 363 to 367 nm, illuminating the baked polyimide layer, that is, G-line and H-line, G-line and I-line, H-line and I-line, or G-line, H-line and Mine illuminate the baked polyimide layer, then developing the exposed polyimide layer, then curing or heating the developed polyimide layer at a peak temperature of between 200 and 290° C., between 290 and 330° C. or between 330 and 400° C. for a time of between 30 minutes and 2 hours in a nitrogen ambient or in an oxygen-free ambient, the cured polyimide layer having a thickness of between 2 and 30 μm, and preferably between 3 and 12 μm, and then removing the residual polymeric material or other contaminants on the upper surface of the metal layer 86 of the metal trace 88 with an $O_2$ plasma or a plasma containing fluorine of below 200 PPM and oxygen, such that the polyimide layer can be patterned with an opening in the polyimide layer exposing the metal layer 86 of the metal trace 88.

In a second method, the polymer layer 90 can be formed by spin-on coating a first positive-type polyimide layer with photosensitivity having a thickness of between 4 and 60 μm, and preferably of between 6 and 24 μm, on the metal layer 86 of the metal trace 88 and on the polymer layer 36, then baking the spin-on coated first polyimide layer, then exposing the baked first polyimide layer using a 1× stepper with at least two of G-line having a wavelength ranging from 434 to 438 nm, H-line having a wavelength ranging from 403 to 407 nm, and I-line having a wavelength ranging from 363 to 367 nm, illuminating the baked first polyimide layer, that is, G-line and H-line, G-line and I-line, H-line and I-line, or G-line, H-line and I-line illuminate the baked first polyimide layer, then developing the exposed first polyimide layer, then curing or heating the developed first polyimide layer at a peak temperature of between 200 and 290° C., between 290 and 330° C. or between 330 and 400° C. for a time of between 30 minutes and 2 hours in a nitrogen ambient or in an oxygen-free ambient, the cured first polyimide layer having a thickness of between 2 and 30 μm, and preferably between 3 and 12 μm, then optionally removing the residual polymeric material or other contaminants on the upper surface of the metal layer 86 of the metal trace 88 with an $O_2$ plasma or a plasma containing fluorine of below 200 PPM and oxygen, such that the first polyimide layer can be patterned with an first opening in the first polyimide layer exposing the metal layer 86 of the metal trace 88, then spin-on coating a second positive-type polyimide layer with photosensitivity having a thickness of between 4 and 60 μm, and preferably of between 6 and 24 μm, on the first polyimide layer and on the metal layer 86 of the metal trace 88, then baking the spin-on coated second polyimide layer, then exposing the baked second polyimide layer using a 1× stepper with at least two of G-line having a wavelength ranging from 434 to 438 nm, H-line having a wavelength ranging from 403 to 407 nm, and I-line having a wavelength ranging from 363 to 367 nm, illuminating the baked second polyimide layer, that is, G-line and H-line, G-line and Mine, H-line and Mine, or G-line, H-line and Mine illuminate the baked second polyimide layer, then developing the exposed second polyimide layer, then curing or heating the developed second polyimide layer at a peak temperature of between 200 and 290° C., between 290 and 330° C. or between 330 and 400° C. for a time of between 30 minutes and 2 hours in a nitrogen ambient or in an oxygen-free ambient, the cured second polyimide layer having a thickness of between 2 and 30 μm, and preferably between 3 and 12 μm, then removing the residual polymeric material or other contaminants on the upper surface of the metal layer 86 of the metal trace 88 with an $O_2$ plasma or a plasma containing fluorine of below 200 PPM and oxygen, such that the second polyimide layer can be patterned with an second opening in the second polyimide layer exposing the metal layer 86 of the metal trace 88. Alternatively, to lead the polymer layer 90 with a relatively great thickness, forming the polymer layer 90 may further comprise forming one or more other polyimide layers on the second polyimide layer, following the steps of forming the first or second polyimide layer. The step of removing the residual polymeric material or other contaminants on the upper surface of the metal layer 86 of the metal trace 88 with an $O_2$ plasma or a plasma containing fluorine of below 200 PPM and oxygen can be only performed after the topmost polyimide layer of the polymer layer 90 has been cured.

After the above-mentioned processes have been completed, a semiconductor wafer is completed. Next, the semiconductor wafer can be diced into a plurality of individual integrated circuit (IC) chips, semiconductor chips. Via a wire-bonding process, one end of a wire (made of gold, copper or aluminum) can be ball bonded with the metal layer 86 of the metal trace 88 exposed by the opening 90*a* of a IC chip. The other end of the wire can be wedge bonded with an aluminum layer provided by a pad of another semiconductor chip, a pad over another semiconductor substrate, or a pad over a silicon substrate. Alternatively, the other end of the wire can be wedge bonded with a gold layer provided by a pad of another semiconductor chip, a pad over another semiconductor substrate, a pad over an organic substrate, a pad over a ceramic substrate, a pad over a silicon substrate, a pad over a glass substrate, or a pad over a flexible film comprising a polymer layer with a thickness of between 30 and 200 μm. Alternatively, the other end of the wire can be wedge bonded with a copper layer provided by a pad of another semiconductor chip, a pad over another semiconductor substrate, a pad over an organic substrate, a pad over a ceramic substrate, a pad over a silicon substrate, a pad over a glass substrate, or a pad over a flexible film comprising a polymer layer with a thickness of between 30 and 200 μm. Alternatively, the other end of the wire can be wedge bonded with an inner lead (made of copper) of a lead frame.

Alternatively, a tin-containing metal layer or bump may be formed over the metal layer 86 of the metal trace 88 exposed by opening 90*a*. So far, the process for forming a semiconductor wafer is completed. Next, the semiconductor wafer can be diced into a plurality of individual integrated circuit (IC) chips, semiconductor chips. The tin-containing metal layer or bump may be used to be connected with an external circuit. The external circuit may be a semiconductor chip, a printed circuit board (PCB) comprising a glass fiber as a core, a flexible tape comprising a polymer layer (such as polyimide) having a thickness of between 30 and 200 μm and not comprising any polymer layer with glass fiber, a ceramic substrate comprising a ceramic material as insulating layers between circuit layers, a glass substrate having circuit layers made of Indium Tin Oxide (ITO), or a discrete passive device, such as inductor, capacitor, resistor or filter. The tin-containing metal layer or bump may be formed by an electroplating method, an electroless plating method or a screen printing process. The tin-containing metal layer or bump is, for example, a tin-lead alloy, a tin-silver alloy, a tin-silver-copper alloy, a lead-free alloy. Using a tin-lead solder for illustration, the weight ratio of tin to lead can be adjusted accordingly. A typical weight ratio of lead to tin is 90/10, 95/5, 97/3 or 37/63, etc.

Alternatively, a metal bump, such as a gold bump, may be formed over the metal layer 86 of the metal trace 88 exposed by opening 90a. So far, the process for forming a semiconductor wafer is completed. Next, the semiconductor wafer can be diced into a plurality of individual integrated circuit (IC) chips, semiconductor chips. The metal bump may be used to be connected with an external circuit. The external circuit may be a semiconductor chip, a printed circuit board (PCB) comprising a glass fiber as a core, a flexible tape comprising a polymer layer (such as polyimide) having a thickness of between 30 and 200 μm and not comprising any polymer layer with glass fiber, a ceramic substrate comprising a ceramic material as insulating layers between circuit layers, a glass substrate having circuit layers made of Indium Tin Oxide (ITO), or a discrete passive device, such as inductor, capacitor, resistor or filter. The metal bump may be formed by an electroplating method or an electroless plating method.

Third Process

Figure 12A:
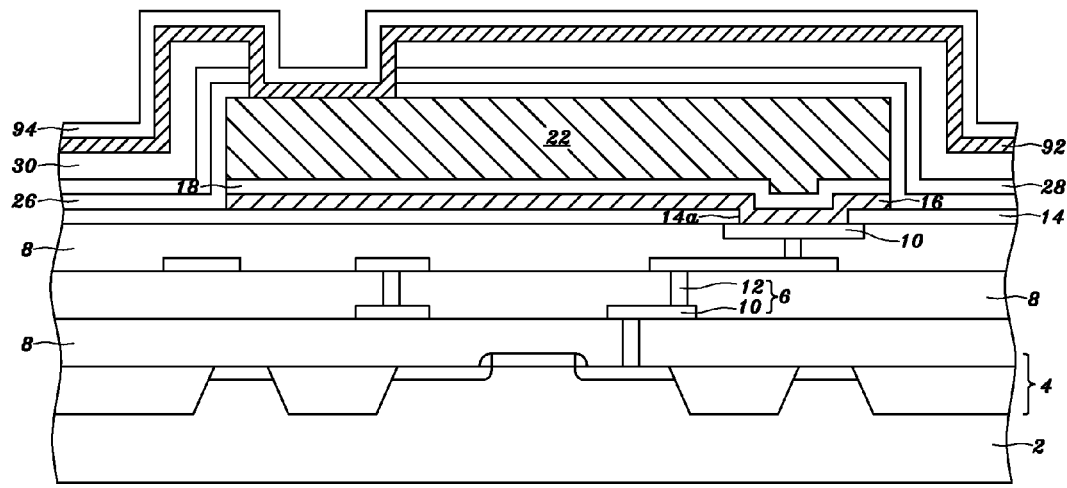
FIGS. 12A through 12E are sectional views showing a process according to one embodiment of the present invention.

Referring to FIG. 12A, after the above-mentioned processes of forming the passivation layer 32 and/or the opening 32 have been completed, an adhesion/barrier layer 92 having a thickness of between 0.01 and 3 μm, and preferably of between 0.01 and 1 μm, can be formed on the passivation layer 32 and on the metal layer 22 of the metal trace 24 exposed by the opening 32a. The material of the adhesion/barrier layer 92 may include titanium, tungsten, cobalt, nickel, titanium nitride, a titanium-tungsten alloy, a nickel-vanadium alloy, copper, protactinium, platinum, palladium, ruthenium, chromium, aluminum, gold, rhodium, silver, or a composite of the abovementioned materials. The adhesion/barrier layer 92 may be formed by a sputtering method or a vapor deposition method.

For example, the adhesion/barrier layer 92 can be formed by sputtering a titanium layer with a thickness of between 0.01 and 3 μm, and preferably of between 0.01 and 1 μm, on the passivation layer 32 and on the copper layer of metal trace 24 exposed by the opening 32a. Alternatively, the adhesion/barrier layer 92 can be formed by sputtering a titanium layer with a thickness of between 0.01 and 3 μm, and preferably of between 0.01 and 1 μm, on the passivation layer 32 and on the nickel layer of metal trace 24 exposed by the opening 32a. Alternatively, the adhesion/barrier layer 92 can be formed by sputtering a titanium layer with a thickness of between 0.01 and 3 μm, and preferably of between 0.01 and 1 μm, on the passivation layer 32 and on the gold layer of metal trace 24 exposed by the opening 32a. Alternatively, the adhesion/barrier layer 92 can be formed by sputtering a titanium-tungsten-alloy layer with a thickness of between 0.01 and 3 μm, and preferably of between 0.01 and 1 μm, on the passivation layer 32 and on the copper layer of metal trace 24 exposed by the opening 32a. Alternatively, the adhesion/barrier layer 92 can be formed by sputtering a titanium-tungsten-alloy layer with a thickness of between 0.01 and 3 μm, and preferably of between 0.01 and 1 μm, on the passivation layer 32 and on the nickel layer of metal trace 24 exposed by the opening 32a. Alternatively, the adhesion/barrier layer 92 can be formed by sputtering a titanium-tungsten-alloy layer with a thickness of between 0.01 and 3 μm, and preferably of between 0.01 and 1 μm, on the passivation layer 32 and on the gold layer of metal trace 24 exposed by the opening 32a.

Next, a seed layer 94 having a thickness of 0.005 and 2 μm, and preferably between 0.1 and 0.7 μm, is formed on the adhesion/barrier layer 92. The seed layer 94 may be formed by a sputtering method, a vapor deposition method, an electroless plating method or a PVD (Physical Vapor Deposition) method. The seed layer 94 is beneficial to electroplating a metal layer thereon. Thus, the material of the seed layer 94 varies with the material of the electroplated metal layer formed on the seed layer 94. When a gold layer is to be electroplated on the seed layer 94, gold (Au) is a preferable material to the seed layer 94. When a copper layer is to be electroplated on the seed layer 94, copper (Cu) is a preferable material to the seed layer 94.

For example, when the adhesion/barrier layer 92 is formed by sputtering a titanium-containing layer with a thickness of between 0.01 and 3 μm, and preferably of between 0.01 and 1 μm, the seed layer 94 can be formed by sputtering a copper layer with a thickness of 0.005 and 2 μm, and preferably between 0.1 and 0.7 μm, on the titanium-containing layer. When the adhesion/barrier layer 92 is formed by sputtering a titanium layer with a thickness of between 0.01 and 3 μm, and preferably of between 0.01 and 1 μm, the seed layer 94 can be formed by sputtering a copper layer with a thickness of 0.005 and 2 μm, and preferably between 0.1 and 0.7 μm, on the titanium layer. When the adhesion/barrier layer 92 is formed by sputtering a titanium-tungsten-alloy layer with a thickness of between 0.01 and 3 μm, and preferably of between 0.01 and 1 μm, the seed layer 94 can be formed by sputtering a copper layer with a thickness of 0.005 and 2 μm, and preferably between 0.1 and 0.7 μm, on the titanium-tungsten-alloy layer.

Figure 12B:
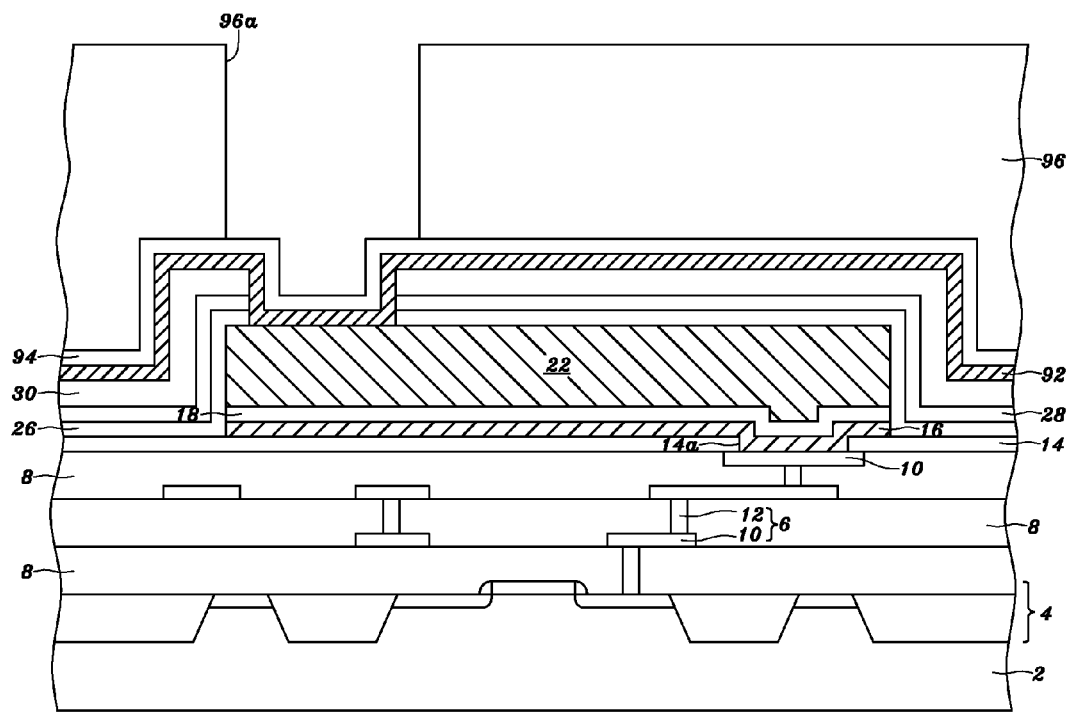

Referring to FIG. 12B, a photoresist layer 96 is formed on the seed layer 94. Next, the photoresist layer 84 is patterned with the processes of exposure, development, etc., to form at least one opening 96a in the photoresist layer 96 exposing the seed layer 94 over the metal trace 24. A 1× stepper or 1× contact aligner may be used to expose the photoresist layer 96 during the process of exposure.

Figure 12C:
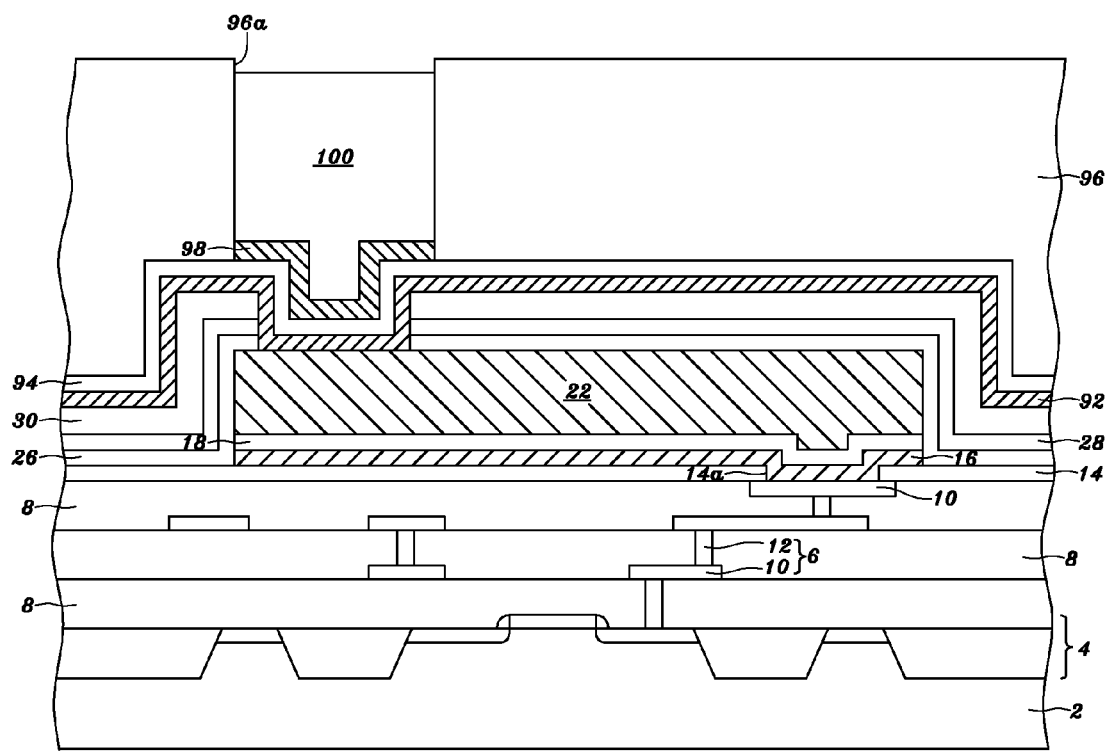

Referring to FIG. 12C, a diffusion barrier layer 98 can be formed on the seed layer 94 exposed by the opening 96a. The diffusion barrier layer 98 is formed by, for example, first electroplating a copper layer with a thickness of between 0.5 and 10 μm on the seed layer 94, made of copper, exposed by the opening 96a in the photoresist layer 96, and next electroplating a nickel layer with a thickness of between 0.1 and 5 μm on the electroplated copper layer in the opening 96a in the photoresist layer 32. The diffusion barrier layer 98 is a copper-nickel composite layer.

Next, a tin-containing metal layer or bump 100 is electroplated on the nickel layer of the diffusion barrier layer 98 in the opening 96a. The thickness of the tin-containing metal layer or bump 100 is between 1 and 500 μm, and preferably between 3 and 250 μm, for example. The tin-containing metal layer or bump 100 is, for example, a tin-lead alloy, a tin-silver alloy, a tin-silver-copper alloy, a lead-free alloy. Using a tin-lead solder for illustration, the weight ratio of tin to lead can be adjusted accordingly. A typical weight ratio of lead to tin is 90/10, 95/5, 97/3 or 37/63, etc.

Based on the described above, the diffusion barrier layer 98 is under the tin-containing metal layer 100, and the diffusion barrier layer 98 may include a nickel layer having a thickness of between 0.1 and 5 μm under the tin-containing metal layer 100 and a copper layer having a thickness of between 0.5 and 10 μm under the nickel layer. The nickel layer and the copper layer of the diffusion barrier layer 98 are both over the metal trace 24 exposed by the opening 32a.

Alternatively, a solder wettable layer (not shown) may be formed on the diffusion barrier layer 98 to increase the bonding ability between the subsequently formed the tin-containing metal layer or bump 100 and the diffusion barrier layer 98. The solder wettable layer is, for example, gold, copper, tin, a tin-lead alloy, a tin-silver alloy, a tin-silver-copper alloy, or a lead-free alloy etc. For example, a gold layer, acting as the solder wettable layer, having a thickness of between 0.01 and 1 microns can be electroplated on the nickel layer of the diffusion barrier layer 98 in the opening 96a, and then the tin-containing layer 100 is electroplated on the gold layer in the opening 96a.

Figure 12D:
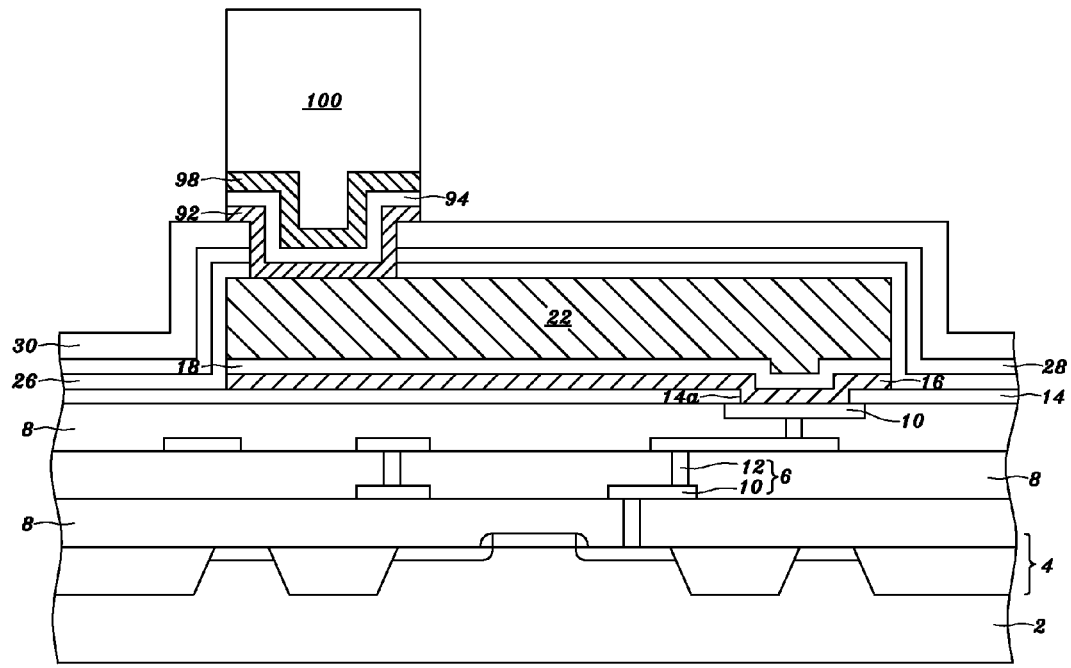

Referring to FIG. 12D, after the tin-containing metal layer or bump 100 is formed, the photoresist layer 96 can be removed using an organic solution with amide. Next, the seed layer 94 and the adhesion/barrier layer 92 not under the tin-containing metal layer or bump 100 are subsequently removed. For example, the seed layer 94 and the adhesion/barrier layer 92 not under the tin-containing metal layer or bump 100 are removed with a dry etching method or a wet etching method. As to the wet etching methods, when the adhesion/barrier layer 92 is a titanium-tungsten-alloy layer, it can be etched with a solution containing hydrogen peroxide; when the adhesion/barrier layer 92 is a titanium layer, it can be etched with a solution containing hydrogen fluoride. As to the dry etching methods, when the adhesion/barrier layer 92 is a titanium layer or a titanium-tungsten-alloy layer, it can be etched with a chlorine-containing plasma etching process. Generally, the dry etching method to etch the seed layer 94 and the adhesion/barrier layer 92 not under the tin-containing metal layer or bump 100 may include a chemical plasma etching process, a physical vapor etching process, such as an argon sputter process, or a chemical vapor etching process.

Figure 12E:
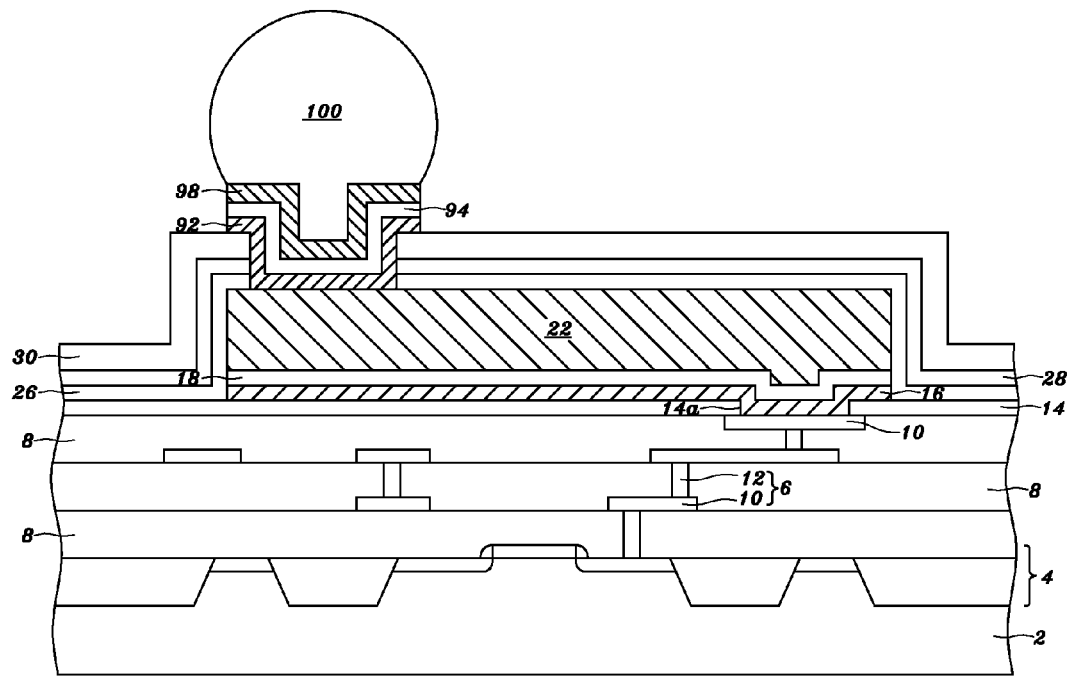

Referring to FIG. 12E, a reflow process is performed to lead the tin-containing metal layer or bump 100 to be formed like a global shape. Alternatively, a reflow method may be first performed to lead the tin-containing metal layer or bump 100 to be formed like a global shape, followed by removing the adhesion/barrier layer 92 and the seed layer 94 not under the tin-containing metal layer or bump 100. Alternatively, the reflow process may be performed until the tin-containing metal layer or bump 100 is connected to an external circuit. After the above-mentioned processes have been completed, a semiconductor wafer is completed. Next, the semiconductor wafer can be diced into a plurality of individual integrated circuit (IC) chips, semiconductor chips. The tin-containing metal layer or bump 36 of each IC chip may be joined with an external circuit, such as semiconductor chip, printed circuit board (PCB) comprising a glass fiber as a core, flexible tape comprising a polymer layer (such as polyimide) having a thickness of between 30 and 200 μm and not comprising any polymer layer with glass fiber, ceramic substrate comprising a ceramic material as insulating layers between circuit layers, glass substrate having circuit layers made of Indium Tin Oxide (ITO), or discrete passive device, such as inductor, capacitor, resistor or filter.

Those described above are the embodiments to exemplify the present invention to enable the person skilled in the art to understand, make and use the present invention. However, it is not intended to limit the scope of the present invention. Any equivalent modification and variation according to the spirit of the present invention is to be also included within the scope of the claims stated below.

What is claimed is:
1. An IC chip comprising:
a semiconductor substrate;
a transistor having a portion in said semiconductor substrate;
a first dielectric layer over said semiconductor substrate;
a first patterned metal layer over said first dielectric layer;
a second dielectric layer over said first patterned metal layer and said first dielectric layer;
a second patterned metal layer over said second dielectric layer;
a third dielectric layer over said second dielectric layer and said second patterned metal layer, wherein a first opening through said third dielectric layer is over a first contact point of said second patterned metal layer, and said first contact point is at a bottom of said first opening, wherein a second opening through said third dielectric layer is over a second contact point of said second patterned metal layer, and said second contact point is at a bottom of said second opening, wherein a third opening through said third dielectric layer is over a third contact point of said second patterned metal layer, and said third contact point is at a bottom of said third opening, and wherein a fourth opening through said third dielectric layer is over a fourth contact point of said second patterned metal layer, and said fourth contact point is at a bottom of said fourth opening;
a third patterned metal layer comprising a first interconnect on said third dielectric layer and said first and second contact points and a second interconnect on said third dielectric layer and said third and fourth contact points, wherein said first contact point is connected to said second contact point through said first interconnect, and wherein said third contact point is connected to said fourth contact point through said second interconnect, wherein said third patterned metal layer comprises a first copper layer;
a nitride layer on a top surface and a sidewall of said first interconnect, on a top surface and a sidewall of said second interconnect and on said third dielectric layer;
a first polymer layer over said nitride layer, wherein a fifth opening through said first polymer layer and said nitride layer is over a fifth contact point of said first interconnect, and said fifth contact point is at a bottom of said fifth opening, and wherein a sixth opening through said first polymer layer and said nitride layer is over a sixth contact point of said second interconnect, and said sixth contact point is at a bottom of said sixth opening, wherein said fifth contact point is connected to said first contact point through said first opening, wherein said fifth contact point is connected to said second contact point through said second opening, wherein said sixth contact point is connected to said third contact point through said third opening, and wherein said sixth contact point is connected to said fourth contact point through said fourth opening; and
a fourth patterned metal layer on said first polymer layer and said fifth and sixth contact points, wherein said fifth contact point is connected to said sixth contact point through said fourth patterned metal layer, wherein said fourth patterned metal layer comprises a second copper layer.

2. The IC chip of claim 1 further comprising a second polymer layer said fourth patterned metal layer and said first polymer layer.

3. The IC chip of claim 1, wherein said third dielectric layer comprises a layer of silicon nitride.

4. The IC chip of claim 1, wherein said third dielectric layer comprises a layer of silicon oxynitride.

5. The IC chip of claim 1, wherein said first copper layer has a thickness between 5 and 25 micrometers.

6. The IC chip of claim 1, wherein said second copper layer has a thickness between 2 and 35 micrometers.

7. The IC chip of claim 1, wherein said third patterned metal layer further comprises a titanium-containing layer under said first copper layer.

8. The IC chip of claim 1, wherein said fourth patterned metal layer further comprises a titanium-containing layer under said second copper layer.

9. The IC chip of claim 1, wherein said fourth patterned metal layer further comprises a nickel-containing layer on said second copper layer.

10. The IC chip of claim 1, wherein said fourth patterned metal layer further comprises a nickel-containing layer on said second copper layer and a gold-containing layer over said nickel-containing layer.

11. An IC chip comprising:
a semiconductor substrate;
a transistor having a portion in said semiconductor substrate;
a first dielectric layer over said semiconductor substrate;
a first patterned metal layer over said first dielectric layer;
a second dielectric layer over said first patterned metal layer and said first dielectric layer;
a second patterned metal layer over said second dielectric layer;
a third dielectric layer over said second dielectric layer and said second patterned metal layer, wherein a first opening through said third dielectric layer is over a first contact point of said second patterned metal layer, and said first contact point is at a bottom of said first opening, wherein a second opening through said third dielectric layer is over a second contact point of said second patterned metal layer, and said second contact point is at a bottom of said second opening, wherein a third opening through said third dielectric layer is over a third contact point of said second patterned metal layer, and said third contact point is at a bottom of said third opening, and wherein a fourth opening through said third dielectric layer is over a fourth contact point of said second patterned metal layer, and said fourth contact point is at a bottom of said fourth opening;
a third patterned metal layer comprising a first interconnect on said third dielectric layer and said first and second contact points and a second interconnect on said third dielectric layer and said third and fourth contact points, wherein said first contact point is connected to said second contact point through said first interconnect, and wherein said third contact point is connected to said fourth contact point through said second interconnect, wherein said third patterned metal layer comprises a first seed layer and a first electroplated copper layer on said first seed layer;
a nitride layer on a top surface and a sidewall of said first interconnect, on a top surface and a sidewall of said second interconnect and on said third dielectric layer;
a first polymer layer over said nitride layer, wherein a fifth opening through said first polymer layer and said nitride layer is over a fifth contact point of said first interconnect, and said fifth contact point is at a bottom of said fifth opening, and wherein a sixth opening through said first polymer layer and said nitride layer is over a sixth contact point of said second interconnect, and said sixth contact point is at a bottom of said sixth opening, wherein said fifth contact point is connected to said first contact point through said first opening, wherein said fifth contact point is connected to said second contact point through said second opening, wherein said sixth contact point is connected to said third contact point through said third opening, and wherein said sixth contact point is connected to said fourth contact point through said fourth opening;
a fourth patterned metal layer on said first polymer layer and said fifth and sixth contact points, wherein said fifth contact point is connected to said sixth contact point through said fourth patterned metal layer, wherein said fourth patterned metal layer comprises a second seed layer and a second electroplated copper layer on said second seed layer; and
a second polymer layer on a top surface and a sidewall of said fourth patterned metal layer and on said first polymer layer, wherein a seventh opening in said second polymer layer is over a seventh contact point of said fourth patterned metal layer, and said seventh contact point is at a bottom of said seventh opening, wherein said seventh contact point is connected to said fifth contact point through said fifth opening, and wherein said seventh contact point is connected to said sixth contact point through said sixth opening.

12. The IC chip of claim 11 further comprising a metal bump over said seventh contact point.

13. The IC chip of claim 11, wherein said third dielectric layer comprises a layer of silicon nitride.

14. The IC chip of claim 11, wherein said third dielectric layer comprises a layer of silicon oxynitride.

15. The IC chip of claim 11, wherein said first electroplated copper layer has a thickness between 5 and 25 micrometers.

16. The IC chip of claim 11, wherein said second electroplated copper layer has a thickness between 2 and 35 micrometers.

17. The IC chip of claim 11, wherein said first seed layer comprises a copper-containing layer.

18. The IC chip of claim 11, wherein said second seed layer comprises a copper-containing layer.

19. The IC chip of claim 11, wherein said fourth patterned metal layer further comprises a nickel-containing layer on said second electroplated copper layer.

20. The IC chip of claim 11, wherein said fourth patterned metal layer further comprises a nickel-containing layer on said second electroplated copper layer and a gold-containing layer over said nickel-containing layer.

21. An IC chip comprising:
a semiconductor substrate;
a transistor having a portion in said semiconductor substrate;
a first dielectric layer over said semiconductor substrate;
a first patterned metal layer over said first dielectric layer;
a second patterned metal layer over said first dielectric layer and said first patterned metal layer;
a second dielectric layer between said first and second patterned metal layers;
a separating layer over said second dielectric layer and said second patterned metal layer, wherein said separating layer comprises a first nitride layer, wherein a first opening in said separating layer is over a first contact point of said second patterned metal layer, and said first contact point is at a bottom of said first opening;

a first metal interconnect on a top surface of said first nitride layer;

a second metal interconnect on said top surface of said first nitride layer and said first contact point, wherein said second metal interconnect is connected to said first contact point through said first opening, wherein said second metal interconnect comprises an adhesion metal layer on said top surface of said first nitride layer, a seed layer on said adhesion metal layer, and an electroplated copper layer on said seed layer;

a second nitride layer on a top surface and a sidewall of said first metal interconnect, on a top surface and a sidewall of said second metal interconnect and on said first nitride layer; and a polymer layer over said second nitride layer, wherein said polymer layer comprises a portion between said first and second metal interconnects, wherein a second opening in said polymer layer and said second nitride layer is over a second contact point of said first metal interconnect, and said second contact point is at a bottom of said second opening.

22. The IC chip of claim 21, wherein said first nitride layer comprises silicon nitride.

23. The IC chip of claim 21, wherein said second nitride layer comprises silicon nitride.

24. The IC chip of claim 21, wherein said first nitride layer comprises oxygen.

25. The IC chip of claim 21, wherein said second nitride layer comprises oxygen.

26. The IC chip of claim 21, wherein said electroplated copper layer has a thickness between 5 and 25 micrometers.

27. The IC chip of claim 21, wherein said first nitride layer has a thickness between 0.1 and 0.5 micrometers.

28. The IC chip of claim 21, wherein said second nitride layer has a thickness between 0.1 and 0.5 micrometers.

29. The IC chip of claim 21, wherein said second patterned metal layer comprises a copper layer.

* * * * *